United States Patent
Pacala et al.

(10) Patent No.: US 11,209,544 B2
(45) Date of Patent: *Dec. 28, 2021

(54) ACCURATE PHOTO DETECTOR MEASUREMENTS FOR LIDAR

(71) Applicant: Ouster, Inc., San Francisco, CA (US)

(72) Inventors: Angus Pacala, San Francisco, CA (US); Mark Frichtl, San Francisco, CA (US)

(73) Assignee: Ouster, Inc., San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/347,174

(22) Filed: Jun. 14, 2021

(65) Prior Publication Data

US 2021/0333394 A1    Oct. 28, 2021

Related U.S. Application Data

(63) Continuation of application No. 16/119,544, filed on Aug. 31, 2018, now Pat. No. 11,105,925, which is a
(Continued)

(51) Int. Cl.
*G01S 17/00* (2020.01)
*G01S 17/10* (2020.01)
(Continued)

(52) U.S. Cl.
CPC .......... *G01S 17/10* (2013.01); *G01S 7/4816* (2013.01); *G01S 7/4863* (2013.01);
(Continued)

(58) Field of Classification Search
USPC ....................................................... 356/5.01
See application file for complete search history.

(56) References Cited

U.S. PATENT DOCUMENTS 3,566,402 A * 2/1971 Taylor .................. G01S 13/225
342/162
3,786,428 A  1/1974 Takahashi
(Continued)

FOREIGN PATENT DOCUMENTS

CN  205826866  12/2016
GB  1291240  10/1972
(Continued)

OTHER PUBLICATIONS

U.S. Appl. No. 15/909,628 , "Corrected Notice of Allowability", dated Nov. 27, 2020, 2 pages.
(Continued)

*Primary Examiner* — James R Hulka
(74) *Attorney, Agent, or Firm* — Kilpatrick Townsend & Stockton LLP

(57) ABSTRACT

A light ranging system can include a laser device and an imaging device having photosensors. The laser device illuminates a scene with laser pulse radiation that reflects off of objects in the scene. The reflections can vary greatly depending on the reflecting surface shape and reflectivity. The signal measured by photosensors can be filtered with a number of matched filter designed according to profiles of different reflected signals. A best matched filter can be identified, and hence information about the reflecting surface and accurate ranging information can be obtained. The laser pulse radiation can be emitted in coded pulses by allowing weights to different detection intervals. Other enhancements include staggering laser pulses and changing an operational status of photodetectors of a pixel sensor, as well as efficient signal processing using a sensor chip that includes processing circuits and photosensors.

30 Claims, 36 Drawing Sheets

Related U.S. Application Data continuation-in-part of application No. 16/006,331, filed on Jun. 12, 2018, now Pat. No. 10,317,529, which is a continuation of application No. 15/909,628, filed on Mar. 1, 2018, now Pat. No. 10,884,126.

(60) Provisional application No. 62/596,002, filed on Dec. 7, 2017, provisional application No. 62/465,310, filed on Mar. 1, 2017.

(51) Int. Cl.

| | |
|---|---|
| H01L 27/146 | (2006.01) |
| H01L 31/107 | (2006.01) |
| G01S 7/497 | (2006.01) |
| G01S 7/4865 | (2020.01) |
| G01S 7/4863 | (2020.01) |
| G01S 7/481 | (2006.01) |
| G01S 17/89 | (2020.01) |
| G01S 17/42 | (2006.01) |

(52) U.S. Cl.
CPC ............ *G01S 7/4865* (2013.01); *G01S 7/497* (2013.01); *G01S 17/42* (2013.01); *G01S 17/89* (2013.01); *H01L 27/14643* (2013.01); *H01L 31/107* (2013.01)

(56) References Cited

U.S. PATENT DOCUMENTS

| | | | |
|---|---|---|---|
| 7,020,353 | B1 | 3/2006 | McCaffrey et al. |
| 7,187,452 | B2 | 3/2007 | Jupp et al. |
| 7,456,970 | B1 | 11/2008 | Lopez et al. |
| 7,830,442 | B2 | 11/2010 | Griffis et al. |
| 7,917,320 | B2 | 3/2011 | Levesque et al. |
| 7,969,558 | B2 | 6/2011 | Hall |
| 8,115,925 | B1 | 2/2012 | Mathur et al. |
| 8,232,514 | B2 | 7/2012 | Grund |
| 8,363,511 | B2 | 1/2013 | Frank et al. |
| 8,374,405 | B2 | 2/2013 | Lee et al. |
| 8,724,096 | B2 | 5/2014 | Gosch et al. |
| 8,836,922 | B1 | 9/2014 | Pennecot et al. |
| 8,963,069 | B2 | 2/2015 | Drader et al. |
| 9,081,096 | B2 | 7/2015 | Li |
| 9,389,315 | B2 | 7/2016 | Bruder et al. |
| 10,036,801 | B2 | 7/2018 | Retterath et al. |
| 10,048,374 | B2 | 8/2018 | Hall et al. |
| 10,183,541 | B2 | 1/2019 | Van Den Bossche et al. |
| 10,203,399 | B2 | 2/2019 | Retterath et al. |
| 10,317,529 | B2 | 6/2019 | Shu et al. |
| 10,390,716 | B2 * | 8/2019 | Shimuta .............. A61B 5/02438 |
| 10,473,770 | B1 * | 11/2019 | Zhu ........................ G01S 17/931 |
| 10,514,444 | B2 * | 12/2019 | Donovan .............. G01S 7/4815 |
| 10,641,876 | B2 * | 5/2020 | Field ........................ G01S 17/10 |
| 10,739,445 | B2 * | 8/2020 | Hollmann ............. G01S 7/4863 |
| 10,746,543 | B2 * | 8/2020 | Jung ........................ G01C 3/08 |
| 10,764,518 | B2 * | 9/2020 | Van Dyck .............. G01S 17/18 |
| 10,768,281 | B2 * | 9/2020 | Subasingha ........... G01S 7/4865 |
| 10,830,879 | B2 * | 11/2020 | Niclass ................... G01S 17/89 |
| 10,830,880 | B2 * | 11/2020 | Subasingha ............ G01S 17/10 |
| 10,830,881 | B2 * | 11/2020 | Subasingha ............ G01S 17/10 |
| 10,871,779 | B2 * | 12/2020 | Templeton ........... G05D 1/0231 |
| 10,884,126 | B2 | 1/2021 | Shu et al. |
| 10,928,486 | B2 * | 2/2021 | Donovan .............. G01S 17/894 |
| 10,955,234 | B2 * | 3/2021 | Roth ........................ G01S 17/89 |
| 10,955,552 | B2 * | 3/2021 | Fine ...................... G01S 17/894 |
| 10,989,814 | B2 * | 4/2021 | Mellot .................. G01S 7/4873 |
| 11,016,178 | B2 * | 5/2021 | Donovan .............. G01S 17/931 |
| 11,041,944 | B2 * | 6/2021 | Zhu ........................ G01S 7/4866 |
| 11,105,925 | B2 * | 8/2021 | Pacala ............... H01L 27/14643 |
| 11,150,331 | B2 * | 10/2021 | Druml .................. G01S 7/4817 |
| 2004/0119838 | A1 | 6/2004 | Griffis et al. |
| 2004/0130702 | A1 | 7/2004 | Jupp et al. |
| 2009/0099813 | A1 | 4/2009 | Dimsdale et al. |
| 2010/0020306 | A1 | 1/2010 | Hall |
| 2010/0027602 | A1 | 2/2010 | Abshire et al. |
| 2010/0042362 | A1 | 2/2010 | Levesque et al. |
| 2010/0114416 | A1 | 5/2010 | Au et al. |
| 2010/0182874 | A1 | 7/2010 | Frank et al. |
| 2011/0052004 | A1 | 3/2011 | Lee et al. |
| 2011/0153268 | A1 | 6/2011 | Jordan et al. |
| 2012/0026497 | A1 | 2/2012 | Mathur et al. |
| 2012/0091324 | A1 | 4/2012 | Grund |
| 2012/0154786 | A1 | 6/2012 | Gosch et al. |
| 2013/0153754 | A1 | 6/2013 | Drader et al. |
| 2014/0063483 | A1 | 3/2014 | Li |
| 2014/0211194 | A1 | 7/2014 | Pacala et al. |
| 2015/0041625 | A1 | 2/2015 | Dutton et al. |
| 2015/0131080 | A1 | 5/2015 | Retterath et al. |
| 2016/0041258 | A1 | 2/2016 | Cashler et al. |
| 2016/0259038 | A1 | 9/2016 | Retterath et al. |
| 2017/0052065 | A1 | 2/2017 | Sharma et al. |
| 2017/0269209 | A1 | 9/2017 | Hall et al. |
| 2018/0081041 | A1 | 3/2018 | Niclass et al. |
| 2018/0259645 | A1 | 9/2018 | Shu et al. |
| 2018/0284277 | A1 | 10/2018 | LaChapelle et al. |
| 2018/0292534 | A1 | 10/2018 | Field |
| 2018/0299552 | A1 | 10/2018 | Shu et al. |
| 2018/0299554 | A1 | 10/2018 | Van Dyck et al. |
| 2018/0299585 | A1 * | 10/2018 | Wei .......................... G02B 1/10 |
| 2018/0373260 | A1 | 12/2018 | Lipson et al. |
| 2019/0018119 | A1 | 1/2019 | Laifenfeld et al. |
| 2019/0041502 | A1 | 2/2019 | Onal et al. |
| 2019/0056497 | A1 * | 2/2019 | Pacala ..................... G01S 7/497 |
| 2019/0257950 | A1 | 8/2019 | Patanwala et al. |

FOREIGN PATENT DOCUMENTS

| | | |
|---|---|---|
| TW | 201432218 | 8/2014 |
| WO | 2016063028 | 4/2016 |
| WO | 2016126250 | 8/2016 |
| WO | 2018057081 | 3/2018 |

OTHER PUBLICATIONS

U.S. Appl. No. 15/909,628, "Corrected Notice of Allowability", dated Oct. 14, 2020, 2 pages.
U.S. Appl. No. 15/909,628, Notice of Allowance, dated Jun. 17, 2020, 9 pages.
U.S. Appl. No. 16/006,331, "Corrected Notice of Allowability", dated Apr. 5, 2019, 2 pages.
U.S. Appl. No. 16/006,331, Non-Final Office Action, dated Oct. 16, 2018, 13 pages.
U.S. Appl. No. 16/006,331, Notice of Allowance, dated Feb. 25, 2019, 10 pages.
U.S. Appl. No. 16/119,544, Notice of Allowance, dated Apr. 20, 2021, 7 pages.
Application No. CN201880026495.1, Office Action, dated Jun. 1, 2020, 11 pages.
Application No. CN201880026495.1, Office Action, dated Feb. 5, 2021, 6 pages.
Application No. EP18761308.8, Extended European Search Report, dated Dec. 17, 2020, 15 pages.
EP18761308.8, "Partial Supplementary European Search Report", dated Oct. 26, 2020, 13 pages.
Mir et al., "Developing LIDAR Pulse Code Detection System Using PRF", 2013 American Control Conference 16, Jun. 17-19, 2013, pp. 307-312.
Application No. PCT/US2018/020525, International Preliminary Report on Patentability, dated Sep. 12, 2019, 16 pages.
Application No. PCT/US2018/020525, International Search Report and Written Opinion, dated Jul. 3, 2018, 20 pages.
PCT/US2018/020525, "Invitation to Pay Add'l Fees and Partial Search Report", dated May 4, 2018, 2 pages.
Application No. CN201880026495.1, Notice of Decision to Grant, dated Sep. 23, 2021, 2 pages.
Application No. TW107106885, Office Action, dated Sep. 24, 2021, 4 pages.

* cited by examiner

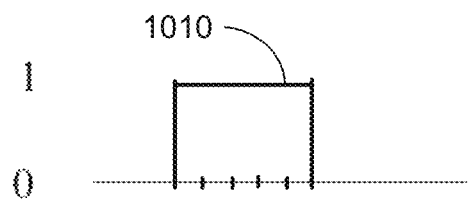
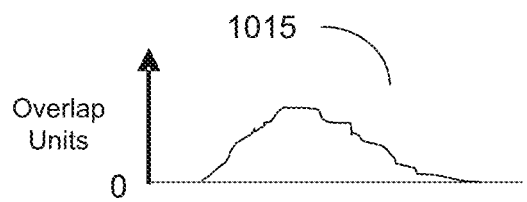
FIG. 10A
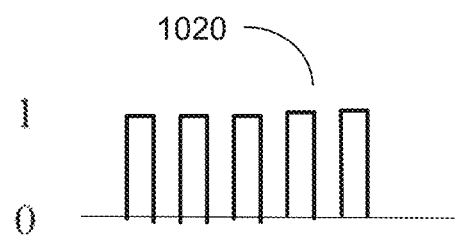
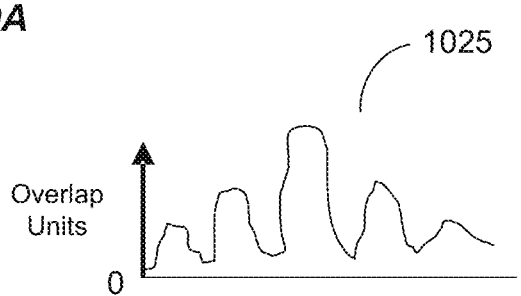
FIG. 10B
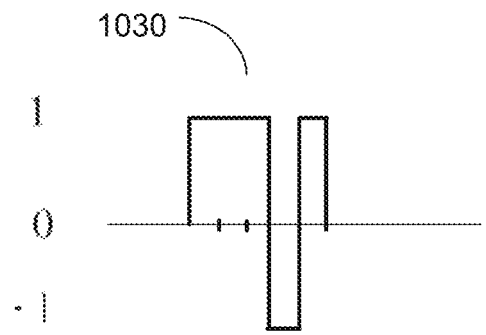
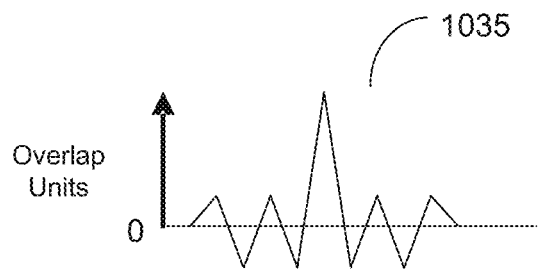
FIG. 10C

ACCURATE PHOTO DETECTOR MEASUREMENTS FOR LIDAR

CROSS-REFERENCES TO RELATED APPLICATIONS

The present application is a continuation of U.S. patent application Ser. No. 16/119,544 filed Aug. 31, 2018, which is a continuation-in-part of U.S. patent application Ser. No. 16/006,331 filed Jun. 12, 2018, which is a continuation of U.S. patent application Ser. No. 15/909,628, filed Mar. 1, 2018, which claims priority from and is a non-provisional application of U.S. Provisional Application No. 62/465,310, filed Mar. 1, 2017 and U.S. Provisional Application No. 62/596,002, filed Dec. 7, 2017, the entire contents of which are herein incorporated by reference for all purposes.

BACKGROUND

Light Detection And Ranging (LIDAR) systems are used for object detection and ranging, e.g., for vehicles such as cars, trucks, boats, etc. LIDAR systems also have uses in mobile applications (e.g., for face recognition), home entertainment (e.g., to capture gesture capture for video game input), and augmented reality. A LIDAR system measures the distance to an object by irradiating a landscape with pulses from a laser, and then measuring the time for photons to travel to an object and return after reflection, as measured by a receiver of the LIDAR system. A detected signal is analyzed to detect the presence of reflected signal pulses among background light. A distance to an object can be determined based on a time-of-flight from transmission of a pulse to reception of a corresponding reflected pulse.

It can be difficult to provide robust distance accuracy down to a few cm in all conditions, particularly at an economical cost for the LIDAR system. Promising new, detector technologies, like single photon avalanche diodes (SPADs), are attractive but have significant drawbacks when used to measure time of flight and other signal characteristics, particularly over a broad range of ambient conditions and target distances due to their limited dynamic range.

LIDAR systems would benefit from more accurate methods of detecting reflected laser pulses and measuring their time-of-flight under varying real world conditions. SPAD-based LIDAR systems require new methods to overcome their inherent drawbacks before being a feasible option for economical, long range, accurate 3D imaging. It is also desirable for two or more LIDAR devices to work in close proximity without interfering with each other. It is further desirable for LIDAR systems to operate in an energy efficient manner, without sacrificing accuracy.

SUMMARY

Various embodiments can address the above problems with LIDAR systems. For example, a set of matched filters in the lidar receiver may be tuned such that each filter is matched to one of a set of anticipated signal profiles (pulse shapes) such that for each signal profile analyzed, the best fitting filter may be identified. Each of the anticipated signal profiles may nominally from the same template signal profile but differ due to the distortion imposed by a digitization process, external environmental factors, or both. In an active illumination sensor like a lidar, the template signal can correspond to the temporal shape of the outgoing illumination from the sensor (generally a pulse or sequence of pulses). Applying the proper matching filter to the return signal may improve the probability of correctly detecting the reflected signal, the accuracy of locating the reflected signal in time, or determining other properties of the reflected signal, which may in turn give information about the target from which the signal reflected.

Accordingly, some embodiments can correct for SPAD-induced distortion and provide a better understanding of signal and target properties simultaneously. Single-photon avalanche diodes (SPADs) can impose a varying level of distortion upon optical signals depending on the signal power and temporal distribution in an effect referred to as "pileup." In a pileup scenario, many SPADs all acting as a single pixel may be triggered at the leading edge of a powerful reflected signal pulse, thereby decreasing numbers of SPADs available to trigger on the trailing edge of the reflected signal since an increasing percentage of SPADs within the pixel are stuck in the dead time state after their initial triggering. In a weaker signal scenario, a more uniform number of SPADs triggers over the duration of the reflected signal pulse and the reflected pulse shape is more accurately digitized. By running multiple matched filter profiles, each tuned to a different degree of signal pileup, the filter profile that best matches to the received signal can achieve a more consistent signal detection and estimate a more accurate received time for the reflected pulse. The more accurate time estimate can directly improve the accuracy of the distance (ranging) measurement. Further accuracy can be obtained by using a second bank of interpolation filters that have a profile that best matches the received signal.

As another example, the transmitted pulses can be coded such that an accumulated signal (e.g., a histogram of triggered photodetectors) has a pattern with desirable properties (e.g., autocorrelation properties). The accumulated signal can correspond to multiple pulse trains, each of one or more pulses, where each pulse train can correspond to a different time interval (e.g., a pulse train is transmitted and detected before a next pulse train is transmitted). The coding can be accomplished by assigning different weights (e.g., positive and negative) to pulse trains sent during different time intervals. Such weightings can result in the accumulated signal being a Barker code or more complex quadrature code. Such coded pulses can reduce interference from neighboring light ranging systems, as each can use different codes. And, certain codes can provide high accuracy for detecting a time position of a received pulse, e.g., using a matched filter that provides a positive peak with negative side lobes.

As another example, different pulse trains can be offset from each other. For instance, a pulse train can be offset (e.g. less than the time resolution of an accumulated signal) relative to a previous pulse train (e.g., for staggering), thereby providing an increased time resolution. When the accumulated signal is a histogram composed digitized signals across the different pulse trains, the offsets can stagger pulses such that they are recorded into different time bins of the histogram. This staggering allows differentiating between a pulse detected at a beginning of a time bin and a pulse detected at an end of a time bin, resulting in the increased time resolution.

As another example, the operation of a set of photodetectors (e.g., SPADs) of a photosensor can be changed in response to a determined strength level of previously-detected photons. The determined strength level can be used as an estimate for certain future measurements (e.g., close in time or similar angular position of a spinning LIDAR system). In various implementations, the change in operational status can improve power usage (e.g., by turning off or reducing power of photodetectors that are not expected to provide a useful signal) or improve a dynamic range of the photodetectors (e.g., by changing an attenuation level such that the photodetectors provide a useful signal). For example, different photodetectors can have different sensitivity levels for detecting photons, e.g., some photodetectors might detect photons more often than other photodetectors. If a strong signal is received (e.g., from a background light source), then highly sensitive photodetectors (e.g., those providing a strong signal level, such as absolute responsivity or higher responsivity relative to other nearby photodetectors) can be turned off; such photodetectors will always trigger, and thus their signals would not correspond to any detected pulses reflected from an object. Similarly, photodetectors that have weak sensitivity can be turned off when a signal is weak, e.g., as such photodetectors will not trigger for weak signals. In this manner, energy can be saved by reducing the operation of photodetectors that will not providing meaningful signals for a particular time and/or position, and the detector can expand its distortion free dynamic range.

As another example, a single integrated circuit can include photosensors, as well as signal processing components. For example, timing circuitry of the integrated circuit can determine times for when photons are detected and histogram circuitry can accumulate numbers of detected photons over multiple detection time intervals of a measurement.

These and other embodiments of the invention are described in detail below. For example, other embodiments are directed to systems, devices, and computer readable media associated with methods described herein.

A better understanding of the nature and advantages of embodiments of the present invention may be gained with reference to the following detailed description and the accompanying drawings.

BRIEF DESCRIPTION OF THE DRAWINGS

FIGS. 10A-10C show the types of matched filter responses (filtered outputs) produced by different coded-pulse types according to embodiments of the present invention.

TERMS

Figure 1B:
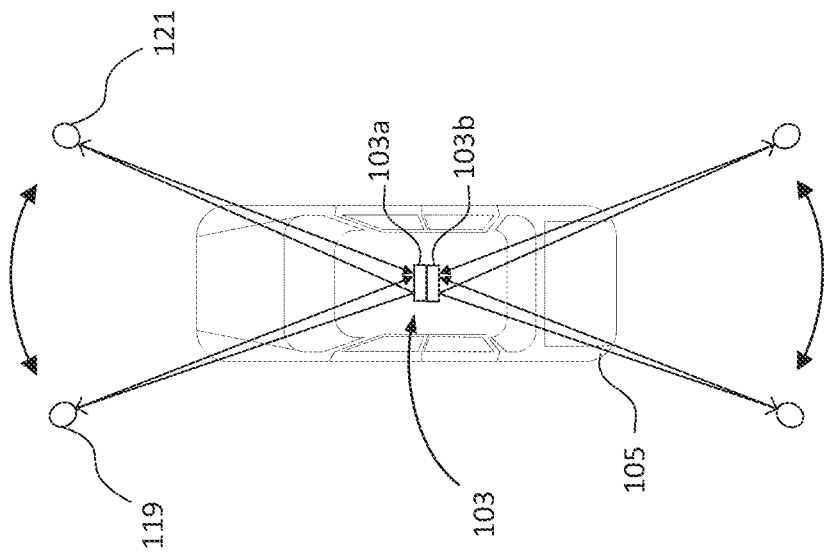
FIGS. 1A and 1B show automotive light ranging devices, also referred to herein as LIDAR systems, according to some embodiments.

The term "ranging," particularly when used in the context of methods and devices for measuring an environment or assisting with vehicle operations, may refer to determining a distance or a distance vector from one location or position to another location or position. "Light ranging" may refer to a type of ranging method that makes use of electromagnetic waves to perform ranging methods or functions. Accordingly, a "light ranging device" may refer to a device for performing light ranging methods or functions. "Lidar" or "LIDAR" may refer to a type of light ranging method that measures a distance to a target by illuminating the target with a pulsed laser light, and thereafter measure the reflected pulses with a sensor. Accordingly, a "lidar device" or "lidar system" may refer to a type of light ranging device for performing lidar methods or functions. A "light ranging system" may refer to a system comprising at least one light ranging device, e.g., a lidar device. The system may further comprise one or more other devices or components in various arrangements.

A "pulse train" may refer to one or more pulses that are transmitted together. The emission and detection of a pulse train may be referred to as a "shot." A shot can occur over a "detection time interval" (or "detection interval").

A "measurement" may include N multiple pulse trains that are emitted and detected over N shots, each lasting a detection time interval. An entire measurement can be over a measurement time interval (or just "measurement interval"), which may equal the N detection interval of a measurement or be longer, e.g., when pauses occur between detection intervals.

A "photosensor" can convert light into an electrical signal. A photosensor may include a plurality of "photodetector," e.g., single-photon avalanche diodes (SPADs). A photosensor can correspond to a particular pixel of resolution in a ranging measurement.

A "histogram" may refer to any data structure representing a series of values over time, as discretized over time bins. A histogram can have a value assigned to each time bin. For example, a histogram can store a counter of a number of photodetectors that fired during a particular time bin in each of one or more detection intervals. As another example, a histogram can correspond to the digitization of an analog signal at different times. A photodetector can be in "active operation" when it is producing signals and the signals are used in generating a histogram. A histogram can be include signal (e.g., pulses) and noise. Thus, a histogram can be considered a combination of signal and noise as a photon time series or photon flux. A raw/digitized histogram (or accumulated photon time series) can contain the signal and the noise as digitized in memory without filtering. A "filtered histogram" may refer to the output after the raw histogram is passed through a filter.

An emitted signal/pulse may refer to the "nominal", "ideal," or "template" pulse or pulse train that is not distorted. A reflected signal/pulse may refer to the reflected laser pulse from an object and may be distorted. A digitized signal/pulse (or raw signal) may refer to the digitized result from the detection of one or more pulse trains of a detection interval as stored in memory, and thus may be equivalent to a portion of a histogram. A detected signal/pulse may refer to the location in memory that the signal was detected. A detected pulse train may refer to the actual pulse train found by a matched filter. An anticipated signal profile may refer to a shape of a digitized signal resulting from a particular emitted signal that has a particular distortion in the reflected signal.

DETAILED DESCRIPTION

The present disclosure relates generally to the field of object detection and ranging, and more particularly to the use of time-of-flight optical receiver systems for applications such as real-time three-dimensional mapping and object detection, tracking and/or classification. Various improvements can be realized with various embodiments of the present invention. Such improvements can be increased accuracy, reduced noise, and increased energy efficiency.

To increase accuracy, some embodiments can account for nonlinear distortion into measured data as a result of fundamental operating characteristics (e.g., dead time and after pulsing). For example, embodiments can account for different rates of photons being detected in consecutive time bins. For example, after detecting a photon, single-photon avalanche diodes (SPADs) have a period of dead time (e.g., 1-100 ns) after which the SPAD cannot detect a new photon. Thus, a strong pulse can cause many SPADs of a photosensor to fire at once, but then the number of fired SPADs can decrease during the dead time, resulting in a different profile in the digitized signal than for a normal pulse. Such changes in the rate of photon detection can cause errors in determining the precise time a reflected pulse is received. For example, it can be difficult to determine a reception time of a pulse of light, as the signal can be distorted from a roughly square pulse, thereby making it difficult to determine a distance from an object. Such different rates of photon detection can occur in other types of photodetectors as well. To address such different profiles, embodiments can use filters with different profiles, and select a best matching filter (e.g., for determining the precise received time of the reflected pulse, and not just the peak of the digitized signal).

To reduce noise (e.g., from background light or from interference due to nearby LIDAR devices), embodiments can transmit different coded pulse patterns (pulse trains) over different detection time intervals. The different coded pulse patterns can be assigned different weights, thereby providing an easily identifiable pattern of the accumulated signal that can have desirable properties. For example, a first transmitted pulse train can have a pulse pattern of {1,1,0,0,1} over five time units (time bins). A second transmitted pulse train can have a pulse pattern of {0,0,1,1,0}. The first pulse train can be weighted with +1 and the second pulse train can be weighted with −1, thereby providing an accumulated signal with a pattern of {1,1,−1,−1,1} for a given measurement. Further complicated weighting schemes can be used, e.g., non-integer weights and weightings in different dimensions. Additionally, different pulse patterns can be achieved by adding a delay, e.g., {1, 1, 0,0} can become the different pulse pattern of {0,1, 1, 0}.

To further increase accuracy, especially when signal pulses only occupy a single histogram bin(e.g., to a higher resolution than that of a time bin), a measurement process can stagger successive pulse trains (e.g., by a same offset for each successive pulse trains), thereby ensuring that the accumulated histogram of digitized pulses of different pulse trains spans more than one time bin. In this manner, it can be determined whether the first pulse was received in the beginning, middle, or end of a time bin. For example, the measurement resolution (e.g., width of a time bin) can be 1 ns, and ten consecutive pulse trains can each be delayed by 100 picoseconds relative to a previous pulse train. Thus, if two consecutive time bins had about a same detected value (e.g., 5 pulses detected in first time bin and 5 pulses detected in second time bin), then the first pulse would have a leading edge arriving in the middle of the first time bin.

To increase energy efficiency and reduce pileup induced distortion, the operation of a set of photodetectors can be changed based on a strength level of previously-detected photons. It can be estimated that the determined strength level would occur again for certain future measurements (e.g., close in time or similar angular position of a spinning LIDAR system). As examples, the change in operational status can improve power usage (e.g., by turning off or reducing power of photodetectors that are not expected to provide a useful signal) or improve a dynamic range of the photodetectors (e.g., by changing an attenuation level such that the photodetectors provide a useful signal). For example, different photodetectors (e.g., SPADs) of a photosensor can be operated differently in different lighting environments. For example, in directions having significant background light or pointing normal to a highly reflective surface that would reflect a strong signal, sensitive photodetectors can have their power level reduced (e.g., turned off), as otherwise they will rapidly fire, thereby providing little ranging information or consuming large amounts of power. Changes in operational status of photodetectors having low sensitivity can be made in other environments. For example, in directions having a weak signal such weak photodetectors may likely never fire, and thus an attenuation level of such weak photodetectors can be reduced, thereby enabling the photodetectors to detect photons in a low light flux environment.

Further benefits (e.g., cost and size) can be realized by having photosensors (e.g., each a collection of SPADs) and signal processing components on a same integrated circuit. For example, a timing circuitry of the integrated circuit can determine times for when photons are detected and a histogram circuitry can accumulate values of detected pulses over multiple detection time intervals of a measurement. The use of SPADs or similar photodetectors can provide the ability to combine all of such circuitry on a single integrated circuit.

Sections below introduce an illustrative automotive LIDAR system, followed descriptions of example techniques to detect signals by a light ranging system, and then different embodiments are described in more details.

I. Illustrative Automotive Lidar System

Figure 1A:
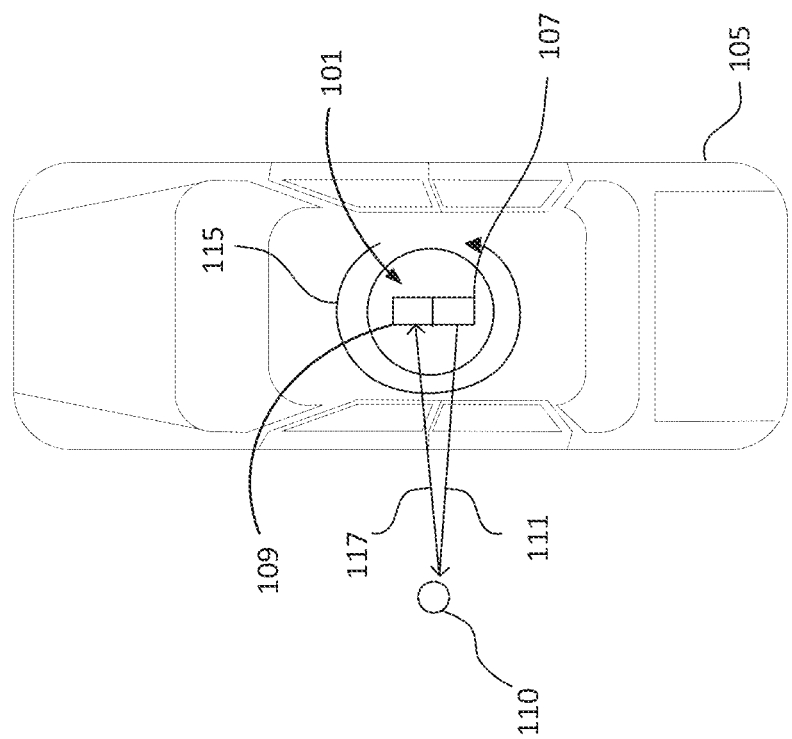

FIGS. 1A-1B show automotive light ranging devices, also referred to herein as LIDAR systems, according to some embodiments. The automotive application for the LIDAR systems is chosen here merely for the sake of illustration and the sensors described herein may be employed in other types of vehicles, e.g., boats, aircraft, trains, etc., as well as in a variety of other applications where 3D depth images are useful, such as medical imaging, mobile phones, augmented reality, geodesy, geomatics, archaeology, geography, geology, geomorphology, seismology, forestry, atmospheric physics, laser guidance, airborne laser swath mapping (ALSM), and laser altimetry. According to some embodiments, a LIDAR system, e.g., scanning LIDAR system 101 and/or solid state LIDAR system 103, can be mounted on the roof of a vehicle 105 as shown in FIGS. 1A and 1B.

The scanning LIDAR system 101 shown in FIG. 1A can employ a scanning architecture, where the orientation of the LIDAR light source 107 and/or detector circuitry 109 can be scanned around one or more fields of view 110 within an external field or scene that is external to the vehicle 105. In the case of the scanning architecture, the emitted light 111 can be scanned over the surrounding environment as shown. For example, the output beam(s) of one or more light sources (such as infrared or near-infrared pulsed IR lasers, not shown) located in the LIDAR system 101, can be scanned, e.g., rotated, to illuminate a scene around the vehicle. In some embodiments, the scanning, represented by rotation arrow 115, can be implemented by mechanical means, e.g., by mounting the light emitters to a rotating column or platform. In some embodiments, the scanning can be implemented through other mechanical means such as through the use of galvanometers. Chip-based steering techniques can also be employed, e.g., by using microchips that employ one or more MEMS based reflectors, e.g., such as a digital micromirror (DMD) device, a digital light processing (DLP) device, and the like. In some embodiments, the scanning can be effectuated through non-mechanical means, e.g., by using electronic signals to steer one or more optical phased arrays.

For a stationary architecture, like solid state LIDAR system 103 shown in FIG. 1B, one or more solid state LIDAR subsystems (e.g., 103a and 103b) can be mounted to the vehicle 105. Each solid state LIDAR unit can face a different direction (possibly with partially and/or non-overlapping fields of views between units) so as to capture a composite field of view that is larger than each unit is capable of capturing on its own.

In either the scanning or stationary architectures, objects within the scene can reflect portions of the light pulses that are emitted from the LIDAR light sources. One or more reflected portions then travel back to the LIDAR system and can be detected by the detector circuitry. For example, reflected portion 117 can be detected by detector circuitry 109. The detector circuitry can be disposed in the same housing as the emitters. Aspects of the scanning system and stationary system are not mutually exclusive and thus can be used in combination. For example, the individual LIDAR subsystems 103a and 103b in FIG. 1B can employ steerable emitters such as an optical phased array or whole the composite unit may rotate through mechanical means thereby scanning the entire scene in front of the LIDAR system, e.g., from field of view 119 to field of view 121.

Figure 2:
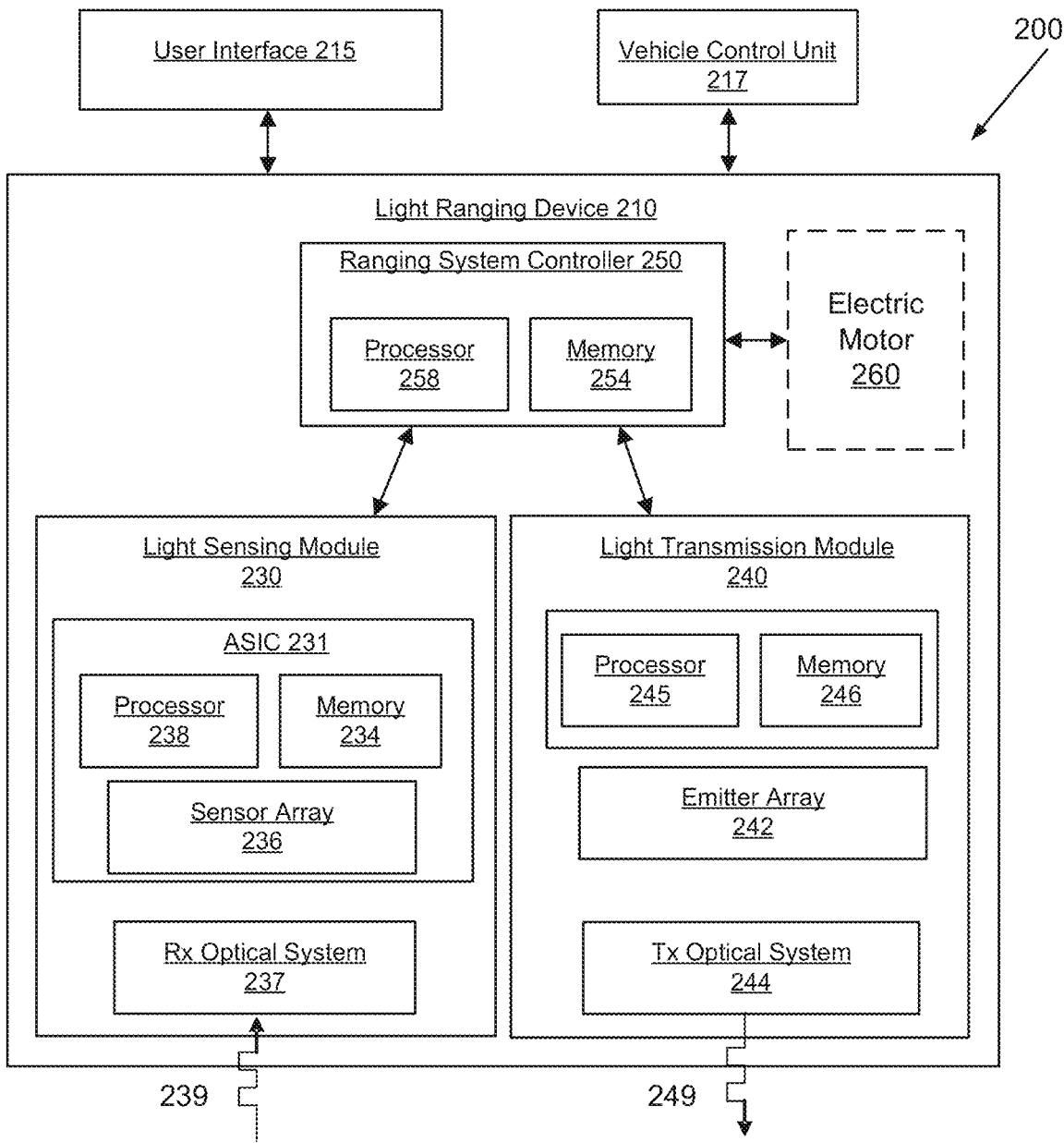
FIG. 2 shows a block diagram of an exemplary LIDAR device for implementing various embodiments.

FIG. 2 illustrates a more detailed block diagram of a rotating LIDAR system 200 according to some embodiments. More specifically, FIG. 2 optionally illustrates a rotating LIDAR system that can employ a rotary actuator on a rotating circuit board, which can receives power and data (as well as transmit) from a stationary circuit board.

LIDAR system 200 can interact with one or more instantiations of user interface 215. The different instantiations of user interface 215 can vary and may include, e.g., a computer system with a monitor, keyboard, mouse, CPU and memory; a touch-screen in an automobile; a handheld device with a touch-screen; or any other appropriate user interface. The user interface 215 may be local to the object upon which the LIDAR system 200 is mounted but can also be a remotely operated system. For example, commands and data to/from the LIDAR system 200 can be routed through a cellular network (LTE, etc.), a personal area network (Bluetooth, Zigbee, etc.), a local area network (WiFi, IR, etc.), or a wide area network such as the Internet.

The user interface 215 of hardware and software can present the LIDAR data from the device to the user but can also allow a user to control the LIDAR system 200 with one or more commands. Example commands can include commands that activate or deactivate the LIDAR system, specify photo-detector exposure level, bias, sampling duration and other operational parameters (e.g., emitted pulse patterns and signal processing), specify light emitters parameters such as brightness. In addition, commands can allow the user to select the method for displaying results. The user interface can display LIDAR system results which can include, e.g., a single frame snapshot image, a constantly updated video image, and/or a display of other light measurements for some or all pixels. In some embodiments, user interface 215 can track distances (proximity) of objects from the vehicle, and potentially provide alerts to a driver or provide such tracking information for analytics of a driver's performance.

In some embodiments, the LIDAR system can communicate with a vehicle control unit 217 and one or more parameters associated with control of a vehicle can be modified based on the received LIDAR data. For example, in a fully autonomous vehicle, the LIDAR system can provide a real time 3D image of the environment surrounding the car to aid in navigation. In other cases, the LIDAR system can be employed as part of an advanced driver-assistance system (ADAS) or as part of a safety system that, e.g., can provide 3D image data to any number of different systems, e.g., adaptive cruise control, automatic parking, driver drowsiness monitoring, blind spot monitoring, collision avoidance systems, etc. When a vehicle control unit 217 is communicably coupled to light ranging device 210, alerts can be provided to a driver or tracking of a proximity of an object can be tracked.

The LIDAR system 200 shown in FIG. 2 includes the light ranging device 210. The light ranging device 210 includes a ranging system controller 250, a light transmission (Tx) module 240 and a light sensing (Rx) module 230. Ranging data can be generated by the light ranging device by transmitting one or more light pulses 249 from the light transmission module 240 to objects in a field of view surrounding the light ranging device. Reflected portions 239 of the transmitted light are then detected by the light sensing module 230 after some delay time. Based on the delay time, the distance to the reflecting surface can be determined. Other ranging methods can be employed as well, e.g. continuous wave, Doppler, and the like.

The Tx module 240 includes an emitter array 242, which can be a one-dimensional or two-dimensional array of emitters, and a Tx optical system 244, which when taken together can form an array of micro-optic emitter channels. Emitter array 242 or the individual emitters are examples of laser sources. The Tx module 240 further includes processor 245 and memory 246. In some embodiments, a pulse coding technique can be used, e.g., Barker codes and the like. In such cases, memory 246 can store pulse-codes that indicate when light should be transmitted. In one embodiment the pulse-codes are stored as a sequence of integers stored in memory.

The Rx module 230 can include sensor array 236, which can be, e.g., a one-dimensional or two-dimensional array of photosensors. Each photosensor (also just called a sensor) can include a collection of photodetectors, e.g., SPADs or the like, or a sensor can be a single photon detector (e.g., an APD). Like the Tx module 240, Rx module 230 includes an Rx optical system 237. The Rx optical system 237 and sensor array 236 taken together can form an array of micro-optic receiver channels. Each micro-optic receiver channel measures light that corresponds to an image pixel in a distinct field of view of the surrounding volume. Each sensor (e.g., a collection of SPADs) of sensor array 236 can correspond to a particular emitter of emitter array 242, e.g., as a result of a geometrical configuration of light sensing module 230 and light transmission module 240.

In one embodiment, the sensor array 236 of the Rx module 230 is fabricated as part of a monolithic device on a single substrate (using, e.g., CMOS technology) that includes both an array of photon detectors and an ASIC 231 for signal processing the raw histograms from the individual photon detectors (or groups of detectors) in the array. As an example of signal processing, for each photon detector or grouping of photon detectors, memory 234 (e.g., SRAM) of the ASIC 231 can accumulate counts of detected photons over successive time bins, and these time bins taken together can be used to recreate a time series of the reflected light pulse (i.e., a count of photons vs. time). This time-series of aggregated photon counts is referred to herein as an intensity histogram (or just histogram). The ASIC 231 can implement matched filters and peak detection processing to identify return signals in time. In addition, the ASIC 231 can accomplish certain signal processing techniques (e.g., by processor 238), such as multi-profile matched filtering to help recover a photon time series that is less susceptible to pulse shape distortion that can occur due to SPAD saturation and quenching. In some embodiments, all or parts of such filtering can be performed by processor 258, which may be embodied in an FPGA.

In some embodiments, the Rx optical system 237 can also be part of the same monolithic structure as the ASIC, with separate substrate layers for each receiver channel layer. For example, an aperture layer, collimating lens layer, an optical filter layer and a photo-detector layer can be stacked and bonded at the wafer level before dicing. The aperture layer can be formed by laying a non-transparent substrate on top of a transparent substrate or by coating a transparent substrate with an opaque film. In yet other embodiments, one or more components of the Rx module 230 may be external to the monolithic structure. For example, the aperture layer may be implemented as a separate metal sheet with pinholes.

In some embodiments, the photon time series output from the ASIC are sent to the ranging system controller 250 for further processing, e.g., the data can be encoded by one or more encoders of the ranging system controller 250 and then sent as data packets to user interface 215. The ranging system controller 250 can be realized in multiple ways including, e.g., by using a programmable logic device such an FPGA, as an ASIC or part of an ASIC, using a processor 258 with memory 254, and some combination of the above. The ranging system controller 250 can cooperate with a stationary base controller or operate independently of the base controller (via pre-programmed instructions) to control the light sensing module 230 by sending commands that include start and stop light detection and adjust photodetector parameters. Similarly, the ranging system controller 250 can control the light transmission module 240 by sending commands, or relaying commands from the base controller, that include start and stop light emission controls and controls that can adjust other light-emitter parameters (e.g., pulse codes). In some embodiments, the ranging system controller 250 has one or more wired interfaces or connectors for exchanging data with the light sensing module 230 and with the light transmission module 240. In other embodiments, the ranging system controller 250 communicates with the light sensing module 230 and light transmission module 240 over a wireless interconnect such as an optical communication link.

The electric motor 260 is an optional component needed when system components, e.g., the Tx module 240 and or Rx module 230, need to rotate. The system controller 250 controls the electric motor 260 and can start rotation, stop rotation and vary the rotation speed.

II. Detection of Reflected Pulses

The Photosensors can be Arranged in a Variety of Ways for Detecting Reflected Pulses. For example, the photosensors can be arranged in an array, and each photosensor can include an array of photodetectors (e.g., SPADs). Different patterns of pulses (pulse trains) transmitted during a detection interval are also described below.

A. Time-of-Flight Measurements and Detectors

Figure 3:
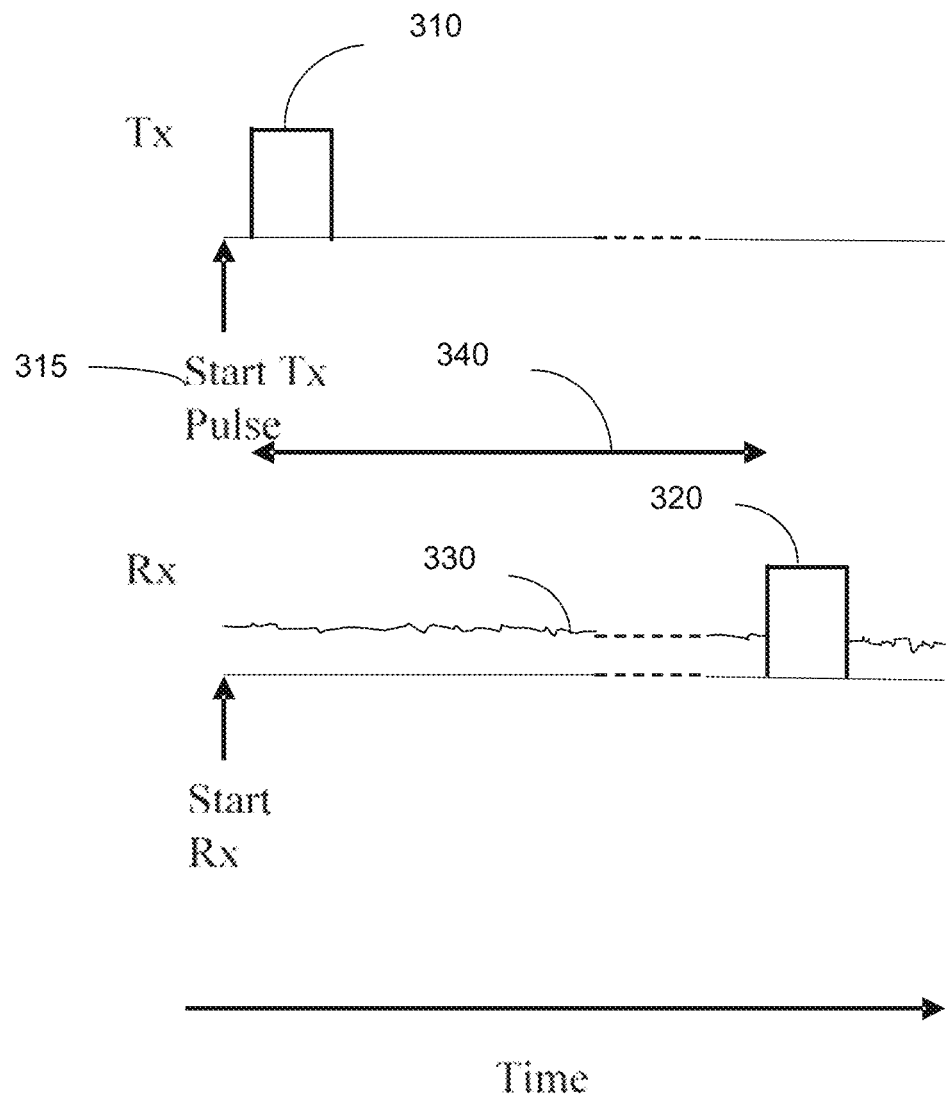
FIG. 3 illustrates the operation of a typical LIDAR system that may be improved by embodiments.

FIG. 3 illustrates the operation of a typical LIDAR system that may be improved by embodiments. A laser generates a light pulse 310 of short duration. The horizontal axis is time and the vertical axis is power. An example laser pulse duration, characterized by the full-width half maximum (FWHM), is a few nanoseconds, with the peak power of a single emitter being around a few watts as seen in the figure below. Embodiments that use side emitter lasers or fiber lasers could have much higher peak powers, while embodiments with small diameter VCSELs could have peak powers in the tens of milliwatts to hundreds of milliwatts.

A start time 315 for the transmission of the pulse does not need to coincide with the leading edge of the pulse. As shown, the leading edge of light pulse 310 is after the start time 315. One may want the leading edge to differ in situations where different patterns of pulses are transmitted at different times, which is described in more detail below for coded pulses.

An optical receiver system can start detecting received light at the same time as the laser is started, i.e., at the start time. In other embodiments, the optical receiver system can start at a later time, which is at a known time after the start time for the pulse. The optical receiver system detects background light 330 initially and after some time detects the laser pulse reflection 320. The optical receiver system can compare the detected light intensity against a threshold to identify the laser pulse reflection 320. The threshold can distinguish the background light from light corresponding to the laser pulse reflection 320.

The time-of-flight 340 is the time difference between the pulse being sent and the pulse being received. The time difference can be measured by subtracting the transmission time of the pulse (e.g., as measured relative to the start time) from a received time of the laser pulse reflection 320 (e.g., also measured relative to the start time). The distance to the target can be determined as half the product of the time-of-flight and the speed of light.

Pulses from the laser device reflect from objects in the scene at different times and the pixel array detects the pulses of radiation reflection.

B. Detection of Object Using Array Lasers and Array of Photosensors

Figure 4:
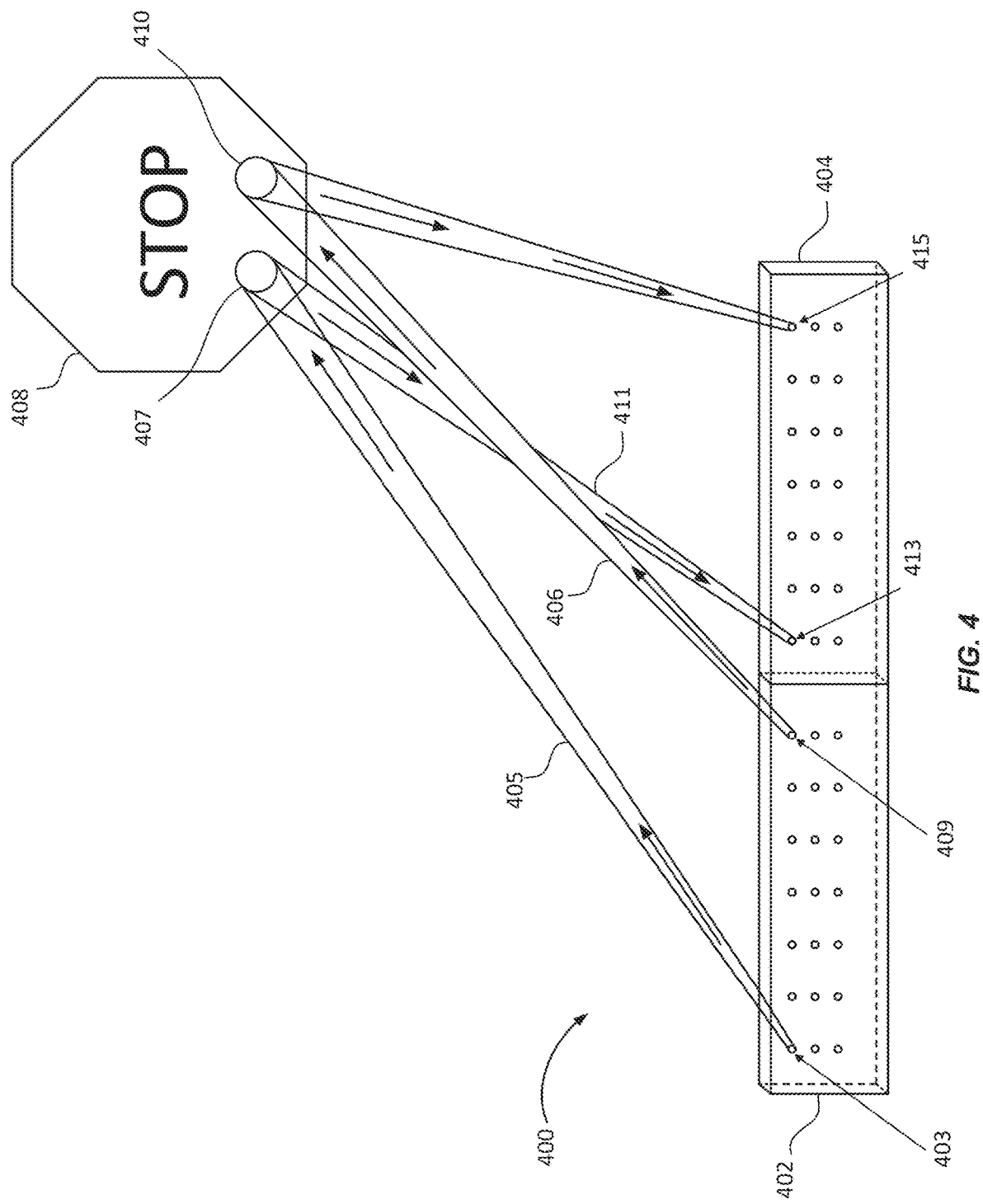
FIG. 4 shows an illustrative example of the light transmission and detection process for a light ranging system according to some embodiments.

FIG. 4 shows an illustrative example of the light transmission and detection process for a light ranging system according to some embodiments. FIG. 4 shows a light ranging system (e.g., solid state or and/or scanning) collecting three-dimensional distance data of a volume or scene that surrounds the system. FIG. 4 is an idealized drawing to highlight relationships between emitters and sensors, and thus other components are not shown.

Light ranging system 400 includes a light emitter array 402 and a light sensor array 404. The light emitter array 402 includes an array of light emitters, e.g., an array of VCSELs and the like, such as emitter 403 and emitter 409. Light sensor array 404 includes an array of photosensors, e.g., sensors 413 and 415. The photosensors can be pixelated light sensors that employ, for each pixel, a set of discrete photodetectors such as single photon avalanche diodes (SPADs) and the like. However, various embodiments can deploy any type of photon sensors.

Each emitter can be slightly offset from its neighbor and can be configured to transmit light pulses into a different field of view from its neighboring emitters, thereby illuminating a respective field of view associated with only that emitter. For example, emitter 403 emits an illuminating beam 405 (formed from one or more light pulses) into the circular field of view 407 (the size of which is exaggerated for the sake of clarity). Likewise, emitter 409 emits an illuminating beam 406 (also called an emitter channel) into the circular field of view 410. While not shown in FIG. 4 to avoid complication, each emitter emits a corresponding illuminating beam into its corresponding field of view resulting in a 2D array of fields of view being illuminated (21 distinct fields of view in this example).

Each field of view that is illuminated by an emitter can be thought of as a pixel or spot in the corresponding 3D image that is produced from the ranging data. Each emitter channel can be distinct to each emitter and be non-overlapping with other emitter channels, i.e., there is a one-to-one mapping between the set of emitters and the set of non-overlapping fields or view. Thus, in the example of FIG. 4, the system can sample 21 distinct points in the 3D space. A denser sampling of points can be achieved by having a denser array of emitters or by scanning angular position of the emitter beams over time such that one emitter can sample several points in space. As described above, scanning can be accomplished by rotating the entire emitter/sensor assembly.

Each sensor can be slightly offset from its neighbor and, like the emitters described above, each sensor can see a different field of view of the scene in front of the sensor. Furthermore, each sensor's field of view substantially coincides with, e.g., overlaps with and is the same size as a respective emitter channel's field of view.

In FIG. 4, the distance between corresponding emitter-sensor channels is exaggerated relative to the distance to objects in the field of view. In practice, the distance to the objects in the field of few is much greater than the distance between corresponding emitter-sensor channels and thus the path of light from the emitter to the object is approximately parallel to the path of the reflected light back from the object to the sensor (i.e., it is almost "back reflected"). Accordingly, there is a range of distances in front of the system 400 over which the fields of view of individual sensors and emitters are overlapped.

Because the fields of view of the emitters are overlapped with the fields of view of their respective sensors, each sensor channel ideally can detect the reflected illumination beam that originates from its respective emitter channel with ideally no cross-talk, i.e., no reflected light from other illuminating beams is detected. Thus, each photosensor can correspond to a respective light source. For example, emitter 403 emits an illuminating beam 405 into the circular field of view 407 and some of the illuminating beam reflects from the object 408. Ideally, a reflected beam 411 is detected by sensor 413 only. Thus, emitter 403 and sensor 413 share the same field of view, e.g., field of view 407, and form an emitter-sensor pair. Likewise, emitter 409 and sensor 415 form an emitter-sensor pair, sharing field of view 410. While the emitter-sensor pairs are shown in FIG. 4 as being in the same relative locations in their respective array, any emitter can be paired with any sensor depending on the design of the optics used in the system.

During a ranging measurement, the reflected light from the different fields of view distributed around the volume surrounding the LIDAR system is collected by the various sensors and processed, resulting in range information for any objects in each respective field of view. As described above, a time-of-flight technique can be used in which the light emitters emit precisely timed pulses, and the reflections of the pulses are detected by the respective sensors after some elapsed time. The elapsed time between emission and detection and the known speed of light is then used to compute the distance to the reflecting surface. In some embodiments, additional information can be obtained by the sensor to determine other properties of the reflecting surface in addition to the range. For example, the Doppler shift of a pulse can be measured by the sensor and used to compute the relative velocity between the sensor and the reflecting surface. The pulse strength can be used to estimate the target reflectivity, and the pulse shape can be used to determine if the target is a hard or diffuse material.

In some embodiments, the LIDAR system can be composed of a relatively large 2D array of emitter and sensor channels and operate as a solid state LIDAR, i.e., it can obtain frames of range data without the need to scan the orientation of the emitters and/or sensors. In other embodiments, the emitters and sensors can be scanned, e.g., rotated about an axis, to ensure that the fields of view of the sets of emitters and sensors sample a full 360 degree region (or some useful fraction of the 360 degree region) of the surrounding volume. The range data collected from the scanning system, e.g., over some predefined time period, can then be post-processed into one or more frames of data that can then be further processed into one or more depth images or 3D point clouds. The depth images and/or 3D point clouds can be further processed into map tiles for use in 3D mapping and navigation applications.

C. Multiple Photodetectors in Photosensor

Figure 5:
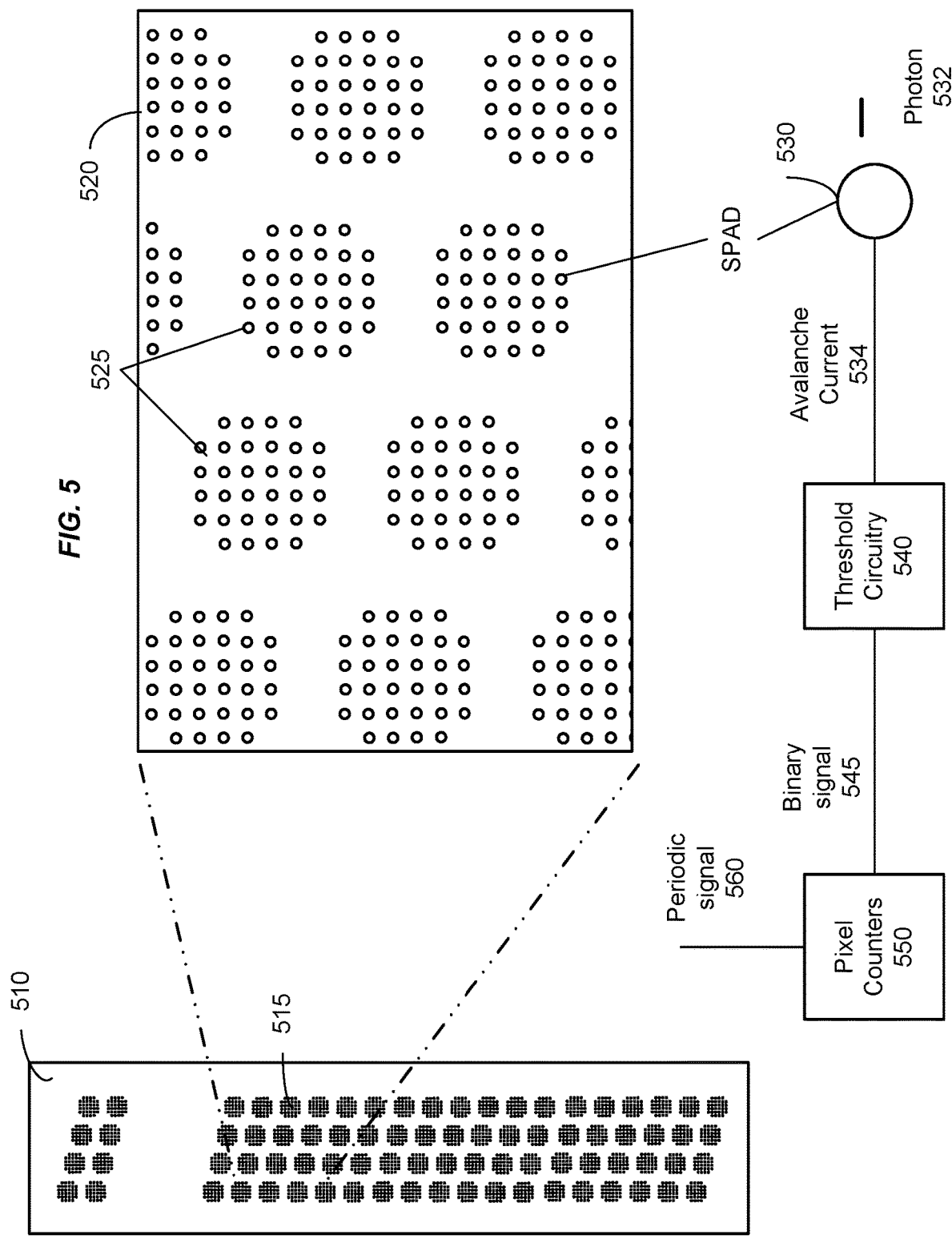
FIG. 5 shows various stages of a sensor array and associated electronics according to embodiments of the present invention.

FIG. 5 shows various stages of a sensor array and associated electronics according to embodiments of the present invention. Array 510 shows photosensors 515 that each correspond to a different pixel. Array 510 can be a staggered array. In this specific example, array 510 is 18×4 photosensors. Array 510 can be used to achieve a high resolution (e.g. 72×1024) as the implementation is amenable to sweeping.

Array 520 shows a magnified view of a portion of array 510. As can be seen, each photosensor 515 is composed of a plurality of photodetectors 525. Signals from the photodetectors of a pixel collectively contribute to a measurement for that pixel.

In some embodiments, each pixel has a multitude of single-photon avalanche diode (SPAD) units that increase the dynamic range of the pixel itself. Each SPAD can have an analog front end circuit for biasing, quenching, and recharging. SPADs are normally biased with a biased voltage above the breakdown voltage. A suitable circuit senses the leading edge of the avalanche current, generates a standard output pulse synchronous with the avalanche build-up, quenches the avalanche by lowering the bias down below the breakdown voltage, and restore the photodiode to the operative level.

The SPADs may be positioned so as to maximize the fill factor in their local area, or a microlens array may be used, which allows for high optical fill factors at the pixel level. Accordingly, an imager pixel can includes an array of SPADs to increase the efficiency of the pixel detector. A diffuser may be used to spreads rays passed through an aperture and collimated by a microlens. The can diffuser serves to spread the collimated rays in a way that all the SPADs belonging to the same pixel receive some radiation.

FIG. 5 further shows a particular photodetector 530 (e.g., a SPAD) that detects photon 532. In response to the detection, photodetector 530 produces an avalanche current 534 of charge carriers (electrons or holes). Threshold circuitry 540 conditions the avalanche current 534 by comparing it to a threshold. When a photon is detected and photodetector 530 is functioning properly, the avalanche current 534 rises above the comparator threshold and threshold circuitry 540 produces a temporally accurate binary signal 545 indicating the accurate time of the SPAD current avalanche, which is in turn an accurate measurement of the photon arrival. The correlation of the current avalanche to the photon arrival can occur with a resolution of nanoseconds, thereby providing high timing resolution. The rising edge of binary signal 545 can be latched by pixel counters 550.

Binary signal 545, avalanche current 534, and pixel counters 550 are examples of data values that can be provided by a photosensor composed of one or more SPADs. The data values can determined from respective signals from each of the plurality of photodetectors. Each of the respective signals can be compared to a threshold to determine whether a corresponding photodetector triggered. Avalanche current 534 is an example of an analog signal, and thus the respective signals can be analog signals.

Pixel counters 550 can use binary signal 545 to count the number of photodetectors for a given pixel that have been triggered by one or more photons during a particular time bin (e.g., a time window of 1, 2, 3, etc. ns) as controlled by periodic signal 560. Pixel counters 550 can store counters for each of a plurality of time bins for a given measurement. The value of the counter for each time bind can start at zero and be incremented based on binary signal 545 indicating a detection of a photon. The counter can increment when any photodetector of the pixel provide such a signal.

Periodic signal 560 can be produced by a phase-locked loop (PLL) or delay-locked loop (DLL) or any other method of producing a clock signal. The coordination of periodic signal 560 and pixel counter 550 can act as a time-to-digital converter (TDC), which is a device for recognizing events and providing a digital representation of the time they occurred. For example, a TDC can output the time of arrival for each detected photon or optical pulse. The measure time can be an elapsed time between two events (e.g., start time and detected photon or optical pulse) rather than an absolute time. Periodic signal 560 can be a relatively fast clock that switches between a bank of memory comprising pixel counter 550. Each register in memory can correspond to one histogram bin, and the clock can switch between them at the sampling interval. Accordingly, a binary value indicating a triggering can be sent to histogram circuitry when the respective signal is greater than the threshold. The histogram circuitry can aggregate binary values across the plurality of photodetectors to determine a number of photodetectors that triggered during a particular time bin.

The time bins can be measured relative to a start signal, e.g., at start time 315 of FIG. 3. Thus, the counters for time bins right after the start signal may have low values corresponding to a background signal, e.g., background light 330. A last time bin can correspond to an end of a detection time interval (also called a shot) for a given pulse train, which is further described in the next section. The number of cycles of periodic signal 560 since a start time can act as a timestamp for when a rising edge of avalanche current 534 indicates a detected photon. The timestamp corresponds to the time bin for a particular counter in pixel counters 550. Such an operation is different from a simple analog-to-digital converter (ADC) following a photodiode (e.g., as for an avalanche photodiode (APD)). Each of the counters of the time bins can correspond to a histogram, which is described in more detail below. Therefore, while the APD is a linear amplifier for the input optical signal with limited gain, the SPAD is a trigger device that provides a binary output of yes/no for a triggering event occurring in a time window.

D. Pulse Trains

Ranging may also be accomplished by using a pulse train, defined as containing one or more pulses. Within a pulse train, the number of pulses, the widths of the pulses, and the time duration between pulses (collectively referred to as a pulse pattern) can be chosen based on a number of factors, some of which includes:

1—Maximum laser duty cycle. The duty cycle is the fraction of time the laser is on. For a pulsed laser this could be determined by the FWHM as explained above and the number of pulses emitted during a given period.
2—Eye safety limits. This is determined by maximum amount of radiation a device can emit without damaging the eyes of a bystander who happens to be looking in the direction of the LIDAR system.
3—Power consumption. This is the power that the emitter consumes for illuminating the scene.

As examples, the spacing between pulses in a pulse train can be on the order of single digits or 10s of nanoseconds.

Multiple pulse trains can be emitted during the time span of one measurement. Each pulse train can correspond to a different time interval, e.g., a subsequent pulse train is not emitted until an expiration of the time limit for detecting reflected pulses of a previous pulse train.

For a given emitter or laser device, the time between the emissions of pulse trains determines the maximum detectable range. For example, if pulse train A is emitted at time $t_0=0$ ns, and pulse train B is emitted at time $t_1=1000$ ns, then one must not assign reflected pulse trains detected after $t_1$ to pulse train A, as they are much more likely to be reflections from pulse train B. Thus, the time between pulse trains and the speed of light define a maximum bound on the range of the system:

$$R_{max}=c\times(t_1-t_0)/2$$

The time between shots (emission and detection of pulse trains) can be on the order of 1 μs to allow enough time for the entire pulse train to travel to a distant object approximately 150 meters away and then back.

III. Histogram Signals from Photodetectors

One mode of operation of a LIDAR system is time-correlated single photon counting (TCSPC), which is based on counting single photons in a periodic signal. This technique works well for low levels of periodic radiation which is suitable in a LIDAR system. This time correlated counting can be controlled by periodic signal 560 of FIG. 5 and use time bins, as discussed for FIG. 5.

A. Generation of Histogram

The frequency of the periodic signal can specify a time resolution within which data values of a signal are measured. For example, one measured value can be obtained for each photosensor per cycle of the periodic signal. In some embodiments, the measurement value can be the number of photodetectors that the triggered during that cycle. The time period of the periodic signal corresponds to time bin, with each cycle being a different time bin.

Figure 6:
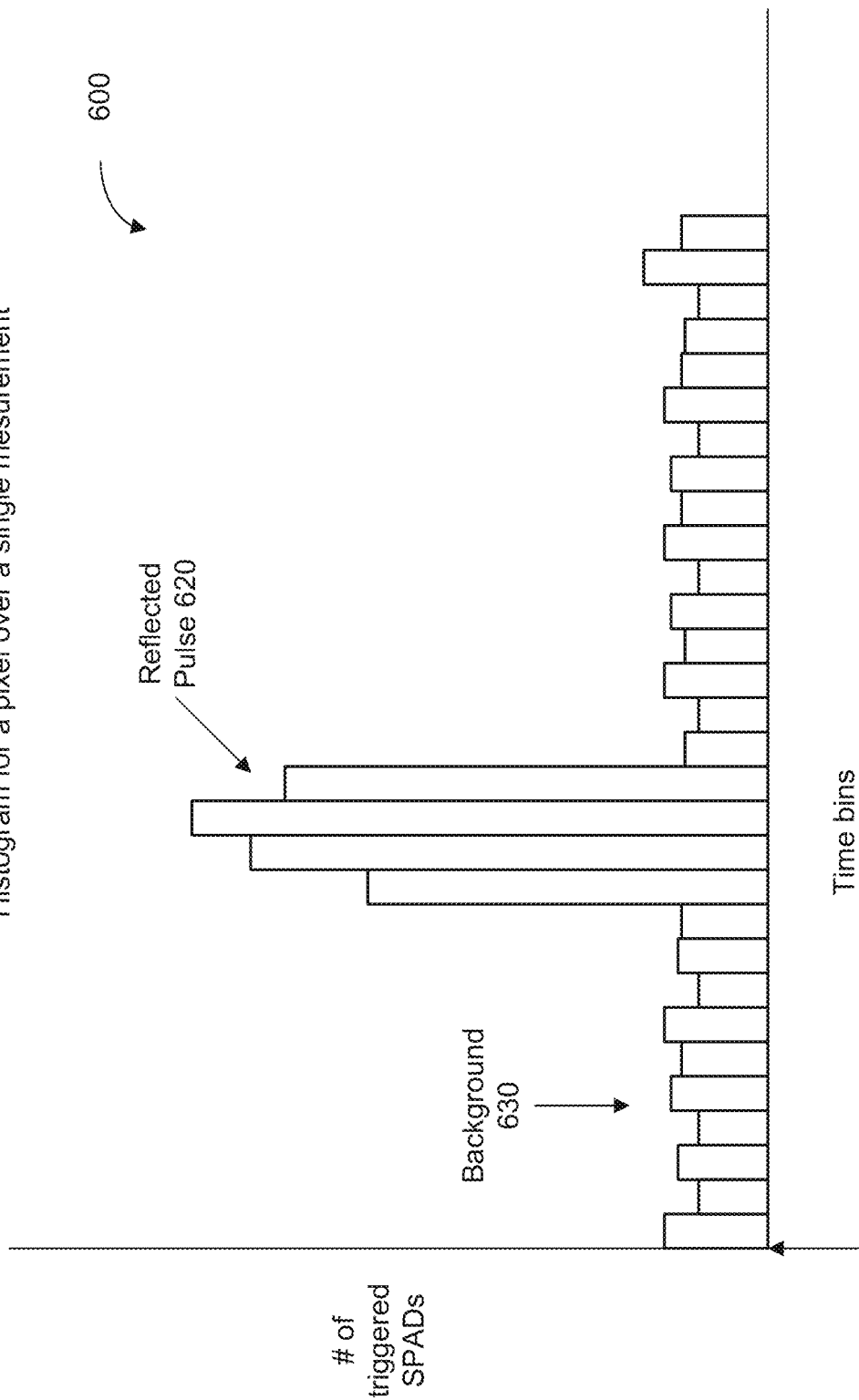
FIG. 6 shows a histogram according to embodiments of the present invention.

FIG. 6 shows a histogram 600 according to embodiments of the present invention. The horizontal axis corresponds to time bins as measured relative to start time 615. As described above, start time 615 can correspond to a start time for the pulse train. Any offsets between rising edges of the first pulse of a pulse train and the start time for either or both of a pulse train and a detection time interval can be accounted for wherein determining the received time to be used for the time-of-flight measurement. The vertical axis corresponds to the number of triggered SPADs. In certain embodiments, the vertical axis could correspond to an output of an ADC that follows an APD. For example, APDs can exhibit traditional saturation effects, such as a constant maximum signal rather than the dead-time based effects of SPADs. Some effects can occur for both SPADs and APDs, e.g., pulse smearing of very oblique surfaces may occur for both SPADs and APDs.

The counter for each of the time bins corresponds to a different bar in histogram 600. The counters at the early time bins are relatively low and correspond to background noise 630. At some point, a reflected pulse 620 is detected. The corresponding counters are much larger, and may be above a threshold that discriminate between background and a detected pulse. The reflected pulse 620 (after digitizing) is shown corresponding to four time bins, which might result from a laser pulse of a similar width, e.g., a 4 ns pulse when time bins are each 1 ns. But, as described in more detail below, the number of time bins can vary, e.g., based on properties of a particular object in an angle of incidence of the laser pulse.

The temporal location of the time bins corresponding to reflected pulse 620 can be used to determine the received time, e.g., relative to start time 615. As described in more detail below, matched filters can be used to identify a pulse pattern, thereby effectively increasing the signal-to-noise ratio, but also to more accurately determine the received time. In some embodiments, the accuracy of determining a received time can be less than the time resolution of a single time bin. For instance, for a time bin of 1 ns, that resolution would correspond to about 15 cm. However, it can be desirable to have an accuracy of only a few centimeters.

Accordingly, a detected photon can result in a particular time bin of the histogram being incremented based on its time of arrival relative to a start signal, e.g., as indicated by start time 615. The start signal can be periodic such that multiple pulse trains are sent during a measurement. Each start signal can be synchronized to a laser pulse train, with multiple start signals causing multiple pulse trains to be transmitted over multiple detection intervals. Thus, a time bin (e.g., from 200 to 201 ns after the start signal) would occur for each detection interval. The histogram can accumulate the counts, with the count of a particular time bin corresponding to a sum of the measured data values all occurring in that particular time bin across multiple shots. When the detected photons are histogrammed based on such a technique, it results in a return signal with a signal to noise ratio greater than from a single pulse train by the square root of the number of shots taken.

Figure 7:
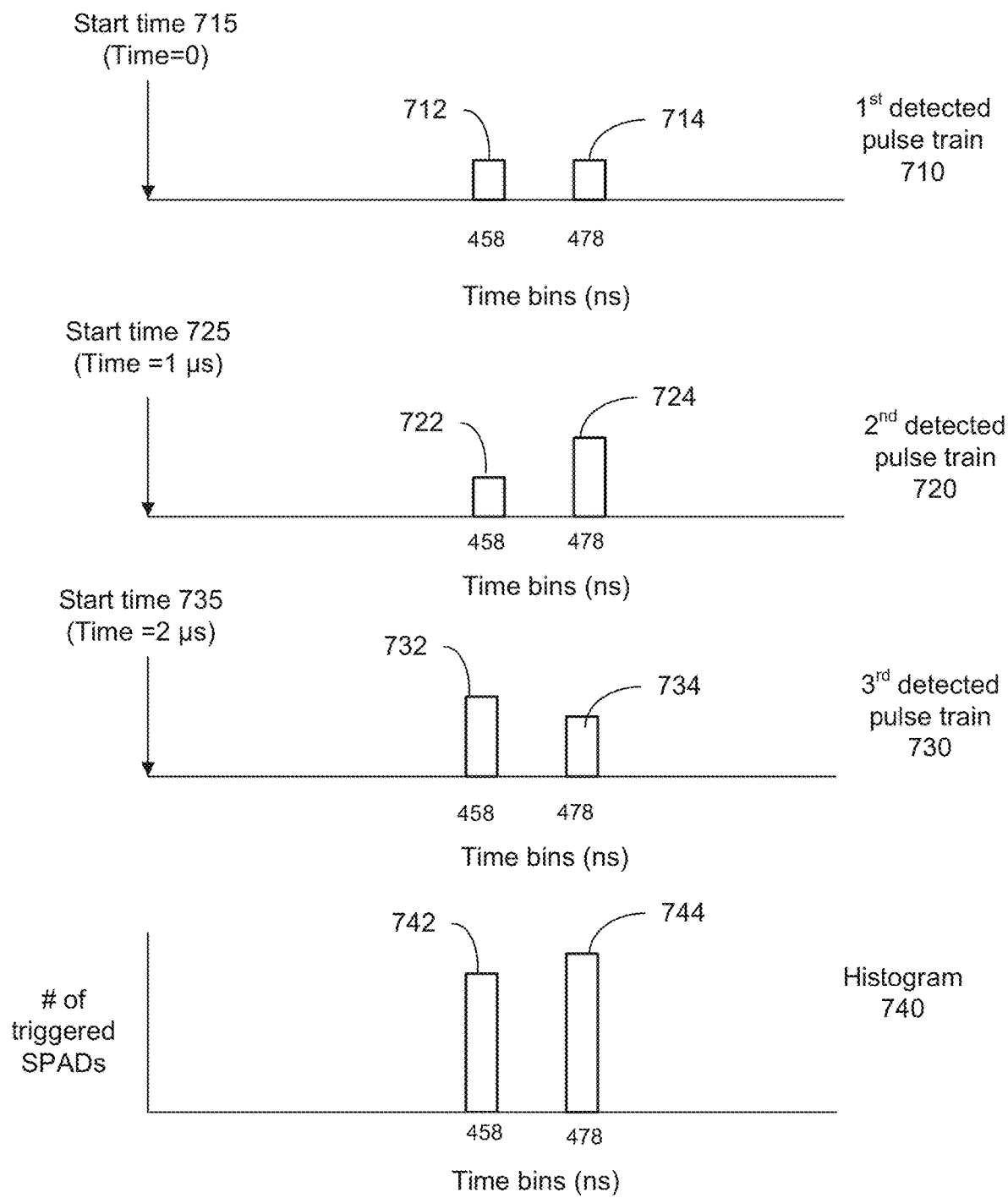
FIG. 7 shows the accumulation of a histogram over multiple pulse trains for a selected pixel according to embodiments of the present invention.

FIG. 7 shows the accumulation of a histogram over multiple pulse trains for a selected pixel according to embodiments of the present invention. FIG. 7 shows three detected pulse trains 710, 720 and 730. Each detected pulse train corresponds to a transmitted pulse train that has a same pattern of two pulses separated by a same amount of time. Thus, each detected pulse train has a same pulse pattern, as shown by two time bins having an appreciable value. Counters for other time bins are not shown for ease of illustration, although the other time bins may have relatively low non-zero values.

In the first detected pulse train 710, the counters for time bins 712 and 714 are the same. This can result from a same number of photodetectors detecting a photon during the two time bins. Or, in other embodiments, approximately the same number of photons being detected during the two time bins. In other embodiments, more than one consecutive time bin can have a consecutive non-zero value; but for ease of illustration, individual nonzero time bins have been shown.

Time bins 712 and 714 respectively occur 458 ns and 478 ns after start time 715. The displayed counters for the other detected pulse trains occur at the same time bins relative to their respective start times. In this example, start time 715 is identified as occurring at time 0, but the actual time is arbitrary. The first detection interval for the first detected pulse train can be 1 µs. Thus, the number of time bins measured from start time 715 can be 1,000. After, this first detection interval ends, a new pulse train can be transmitted and detected. The start and end of the different time bins can be controlled by a clock signal, which can be part circuitry that acts as a time-to-digital converter (TDC), e.g., as is described in FIG. 5.

For the second detected pulse train 720, the start time 725 is at 1 µs, e.g., at which the second pulse train can be emitted. Such a separate detection interval can occur so that any pulses transmitted at the beginning of the first detection interval would have already been detected, and thus not cause confusion for pulses detected in the second time interval. For example, if there is not extra time between shots, then the circuitry could confuse a retroreflective stop sign at 200 m with a much less reflective object at 50 m (assuming a shot period of about 1 us). The two detection time intervals for pulse trains 710 and 720 can be the same length and have the same relationship to the respective start time. Time bins 722 and 724 occur at the same relative times of 458 ns and 478 ns as time bin 712 and 714. Thus, when accumulation step occurs, the corresponding counters can be added. For instance, the counter values at time bin 712 and 722 can be added.

For the third detected pulse train 730, the start time 735 is at 2 µs, e.g., in which the third pulse train can be emitted. Time bin 732 and 734 also occur at 458 ns and 478 ns relative to its respective start time 735. The counters at different time bins may have different values even though the emitted pulses have a same power, e.g., due to the stochastic nature of the scattering process of light pulses off of objects.

Histogram 740 shows an accumulation of the counters from three detected pulse trains at time bins 742 and 744, which also correspond to 458 ns and 478 ns. Histogram 740 could have less number of time bins that are measured during the respective detection intervals, e.g., as a result of dropping time bins in the beginning or the end, or that have values less than a threshold. In some implementations, about 10-30 time bins can have appreciable values, depending on the pattern for a pulse train.

As examples, the number of pulse trains emitted during a measurement to create a single histogram can be around 1-40 (e.g., 24), but can also be much higher, e.g., 50, 100, or 500. Once a measurement is completed, the counters for the histogram can be reset, and a set of pulse trains can be emitted to perform a new measurement. In various embodiments and depending on the number of detection intervals in the respective duration, measurements can be performed every 25, 50, 100, or 500 µs. In some embodiments, measurement intervals can overlap, e.g., so a given histogram corresponds to a particular sliding window of pulse trains. In such an example, memory can exist for storing multiple histograms, each corresponding to a different time window. The weights applied to the detected pulses can be the same for each histogram, or such weights could be independently controlled.

B. Example Signal Profiles from Pixel Detector

Under various conditions, different levels of reflected or ambient radiation might arrive at a photodetector (e.g., a SPAD). This might impact the efficiency and accuracy of the photodetector in perceiving the reflected radiation and hence the performance of the LIDAR system in detecting objects in the scene and reconstructing the scene. Under normal conditions and for reflections from many surfaces, the probability of detecting one photon for a given time period is much less than one. Accordingly, in a LIDAR system, there is no photon during certain time bins, and there is a small signal in some other bins.

However, when large amounts of radiation impinge on a photosensor (e.g., a collection of photodetectors, such as SPADs), the from an optical pulse, the pulse as digitized into the histogram may be very high initially and then decrease, instead of having a more uniform value for the duration of the pulse (assuming a rectangular shape). For instance, for a given optical pulse having a width of five time bins, nearly all of the photodetectors can fire in the first time bin. This effect can be referred to as pileup and can occur in binary counting photodetectors, such as SPADs, that have dead-times during which the photodetectors cannot detect another photon.

High levels of pileup occur when a great number of photons hit the pixel and cause a majority of SPADs in the pixel to fire and enter their dead-time within a small fraction of the pulse width. As a result, the remainder of the photons in the pulse are not captured by the pixel, and the SPADs do not recover in time to account for the true optical profile and magnitude of the signal. Under such circumstances the true amount and profile of reflected radiation in a LIDAR system is not known. These problems might arise both as a result of larger amount of radiation reflecting off of highly reflective objects in the scene or high levels of background radiation.

According to some embodiments, the raw histogram output by a collection of photodetectors in a pixel (e.g., the counters of a histogram over one or more pulse trains) is filtered according to one or more expected or possible profiles of the digitized signal. Different profile filters can be used for different levels of pileup. The level of pileup can correspond to different rates of photons being detected by the photosensor over consecutive time bins. In some implementations, profile filters can be stored, and used to identify a profile type. The type can be used to determine a time more accurately, thereby determining a distance more accurately or for determining other signal properties like pulse width.

Figure 8:
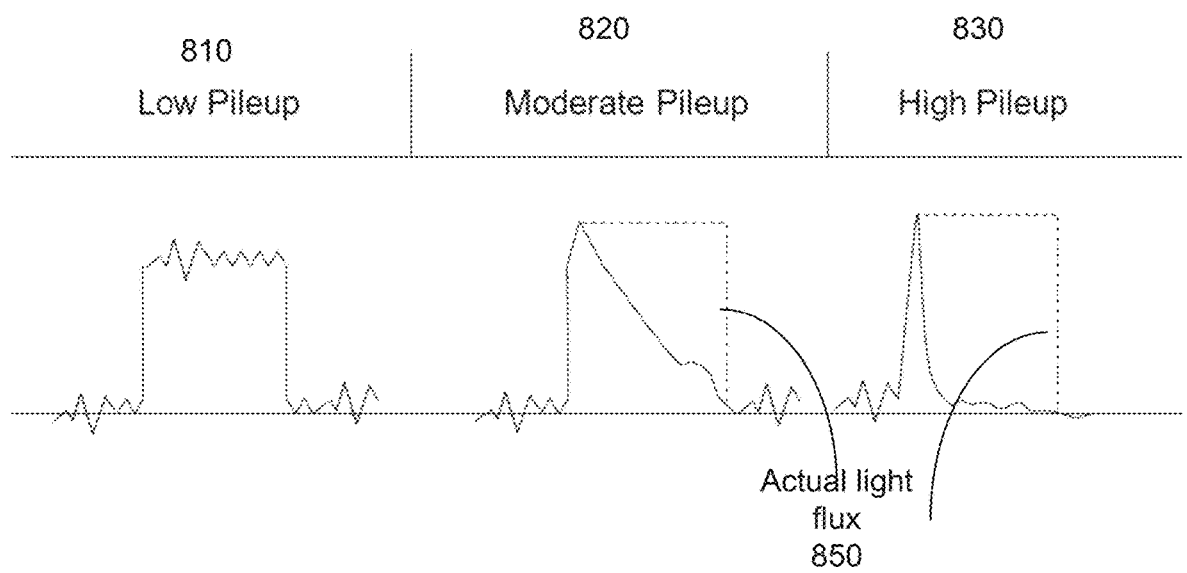
FIG. 8 shows three different types of digitized signal profiles output from a photosensor according to embodiments of the present invention.

FIG. 8 shows three different types of digitized signal profiles output from a photosensor according to embodiments of the present invention. In some embodiments, the a photosensor may be a collection of SPADs. The profile can be stored in a histogram, which may be determined as described above. In the three profiles, the horizontal axis corresponds to time bins, and the vertical axis corresponds to a data value (e.g., number fired SPADs) output from the photosensor during a particular time bin. These example types include signal with no pileup (or low pileup), signal with moderate pileup, and signal with high pileup. In practice, there may be many (K) different profiles.

The different types of digitized signal profiles have different rates of photons being detected. A high rate of photons being detected can correspond to a higher number of photodetectors triggering during an initial time bin than during a later time bin. A low rate corresponds to about a same number of photodetectors triggering during an initial time bin than during a later time bin.

The low pileup profile 810 has a relatively sharp rise and fall and remains fairly flat between these two times, except for some noise level observed. This is characteristic of a small number of photons reflecting from a surface. The low pileup profile corresponds to normal activity. For example, the photons reflecting back from an object may be few enough over several time bins that a same SPAD does not try to trigger multiple times when it is in its dead-time. In that case, the square pulse that is reflected back is digitized by the collection of SPADs (e.g., 16 or 32) to create a square profile in the histogram. For example, when 32 SPADs exist per pixel, four SPADs may fire at any given time, with about four SPADs consistently firing. Thus, even though SPADs that have already fired will be in their dead-time, other SPADs will still be available. Thus, over the duration of a 5-ns pulse, less than half of the SPADs might fire.

The moderate pileup profile 820 has a sharp rise followed by a steady decline over the course of time going back to the background level. The number of SPADs that are not dead, and thus that available to detect photons, goes down more rapidly because the light flux is so high. Moderate pileup profile 820 can result from a relatively large number of photons impinging on the SPAD in a short time duration within the time bin. This could be from background radiation or more commonly due to the laser reflection from a relatively reflective surface. As an example, if 10 SPADs trigger in the first nanosecond, then there are 10 fewer SPADs that can detect photons in the next time bin. Thus, the digitized pulse slopes downward in the histogram for that pixel, even though the actual light flux 850 on the pixel is the square pulse that is shown in dashed lines.

High pileup profile 830 indicates a very sharp rise followed by a fast decline of the signal. A high pileup can occur when all the SPADs are triggered in the initial nanosecond or less. This results in a big spike; and then immediately, no additional firings occur even though the pulse lasts another 5 ns. High levels of pileup could arise from large levels of reflected signal from a very reflective surface, especially one that is close and perpendicular to the axis of the radiation emission from the laser source, resulting in reflection straight back to the imaging device.

The scale of the vertical axis of the different signals can vary among the different profiles, and have been shown at roughly the same scale simply for illustration. As mentioned above, according to the present embodiments, more profiles might be considered. And, besides SPADs, other photodiodes can skew the shape. For example, a retroreflector can saturate an APD. The APD may clip the strong pulse from the retroreflector, which will have two effects: providing a flat top to the digitized signal in memory and a secondary effect of increasing the effective full width at half maximum of the signal because the true maximum value of the signal is not measurable.

C. Problems with Detecting Different Signal Profiles

A matched filter can be used to detect the most accurate position of the detected pulse, e.g., after calculating the convolution of the histogram and the matched filter, where the maximum value of the convolution corresponds to the position of the pulse in the histogram. A matched filter is the optimal filter to detect a known signal in the presence of uncorrelated noise. For example, referring back to FIG. 3, background light 330 can be optimally rejected by a matched filter that has a shape that matches the digitized laser pulse reflection 320.

The low pileup profile most closely resembles the shape of the laser pulse that is emitted. Thus, one might naturally use a matched filter that matches the shape of the laser pulse. Such a filter would provide the most accuracy when the digitized signal has a low pileup profile. But, when the digitized signal has a different pileup (rate of detection), the accuracy decreases.

In situations, where there are pileups, the filtered signal is shifted in time, e.g., to an earlier time. For example, the convolved result of applying the filter to a high pileup profile would provide the center of the pulse at the peak, although the location of the peak is that the leading edge of the pulse. In other words, in a high pileup situation, all of the digitized signal is on the left side the leading edge of the pulse. If a rectangle of similar width to the emitted pulse is matched to that detected high pileup pulse, the best match of the rectangle occur sooner than it would if matched to the actual light flux 850.

A shift of a few bins (e.g., 2.5 ns from a center of a 5 ns pulse to the left) can cause an error of about 37 cm, which is unacceptable error for most 3D sensing applications. This may occur for light reflected from a license plate of a car, where light reflected from the rest of the car may have low pileup. This would make the license plate look closer than the rest of the car, which can cause problems for decision-making of an autonomous vehicle or alerts/warnings for a vehicle.

In embodiments described below, different profile filters can be used to compensate for distortion imposed by pileup or other anticipated factors. For example, instead of only analyzing a raw histogram using a matched filter that resembles the emitted pulse, multiple matched filters each having a different profile can be used so long as the filters powers are all normalized to the same filter "power" (defined as the root mean square of the filters taps) such that their outputs can all be directly compared. For instance, a matched filter that is only one or two time bins wide can be used to determine whether a high pileup profile exists. If the output from such a high pileup filter provides a higher maximum value (e.g., determined by a convolution of the filter with the raw histogram) than a low pileup filter, then the received time would be calculated using the high pileup filter. Further details are provided in a later section.

D. Limits on Accuracy of Matched Filters and Certain Pulse Patterns

As mentioned above, matched filters can be used to determine a temporal location (received time) of a detected pulse. The received time can then be used to determine the total time of flight of the pulse, which can then be translated to a distance. However, the measurement accuracy of the digitized signal from the photosensors (e.g., resolution of time bins) can limit the accuracy of the measured distance. It is desired to have a resolution that is smaller than the width of the time bin. To achieve such a goal, one first needs to identify a best match to within the time resolution of a time bin. However, due to noise, the best match might occur just before or just after.

To address such issues and to reduce interference, various pulse patterns are superior to others in terms of the sidelobe response and temporal "sharpness" of the filter response for a given pulse power. One issue is how to achieve such coded pulses, but the benefits of coded pulses are first described.

Figure 9:
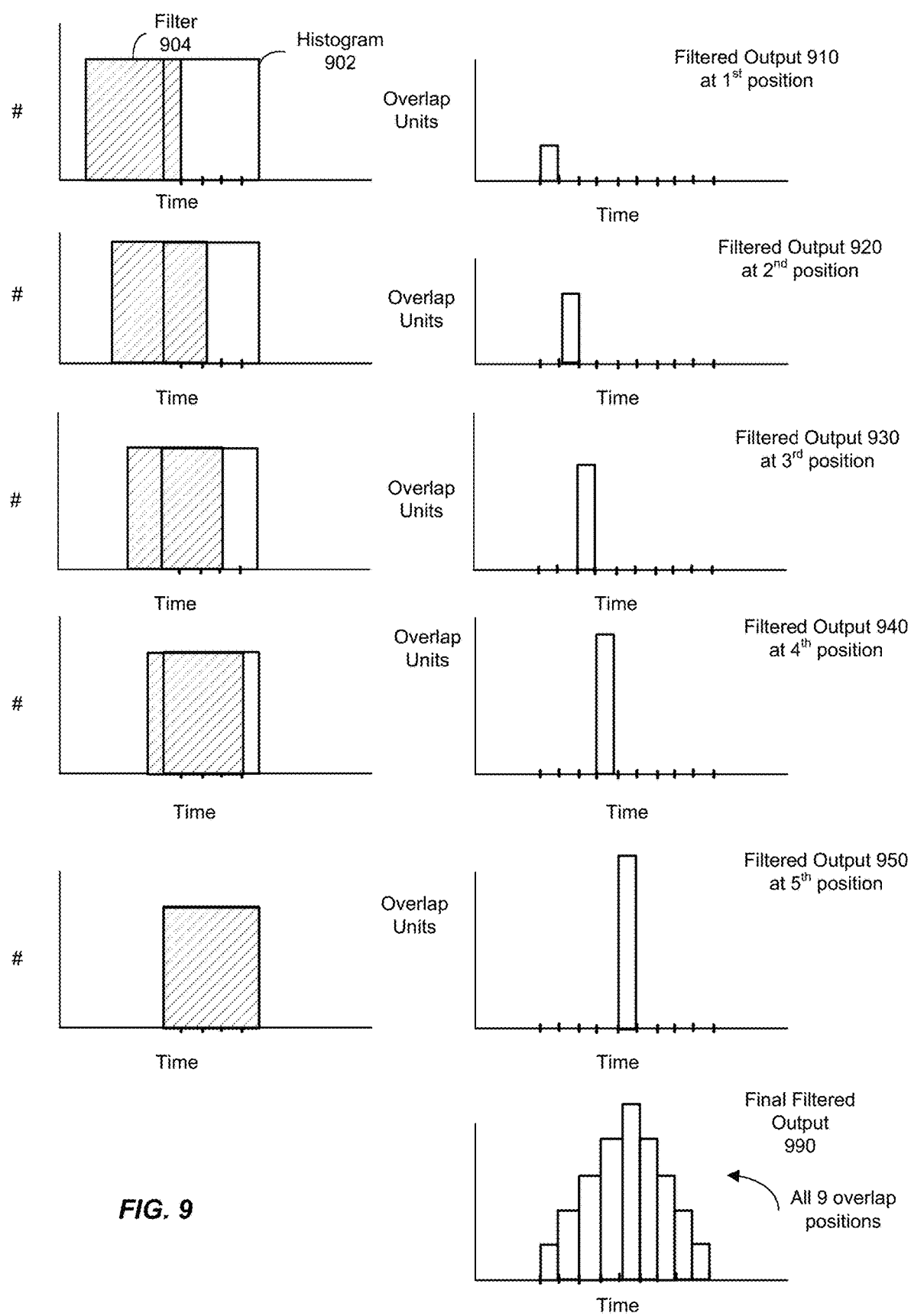
FIG. 9 shows a series of positions for applying a matched filter to a raw histogram according to embodiments of the present invention.

FIG. 9 shows a series of positions for applying a matched filter to a raw histogram according to embodiments of the present invention. The series of positions can be considered sliding positions as the filter is slid (moved) across the raw histogram. Raw histogram 902 depicts a relatively small time window around a detected pulse for a single pixel. Filter 904 corresponds to the shape of the digitized pulse. Both histogram 902 and filter 904 have an idealized shape for ease of presentation. The series of plots on the left side of FIG. 9 show different positions of filter 904 relative to histogram 902. Filter 904 is shifted by one time bin in each consecutive plot.

The filtered outputs resulting from the application of filter 904 to histogram 902 are displayed on the right side of FIG. 9. The bar charts show the level of overlap between filter 904 and histogram 902 at each position. Filtered output 910 corresponds to the first position where the overlap between filter 904 and histogram 902 is only one time bin. The vertical axis of filtered output 910 is in arbitrary units of the amount of overlap, e.g., a sum of the multiplication product of the corresponding values of filter 904 and histogram 902. The value of filtered output 910 is shown at a time bin that corresponds to the center of filter 904. This can be done when the center of the pulse is to be detected. In other embodiments, the value of the filtered output can be shown at a time that corresponds to the leftmost bin of the filter. This can be done when the rising edge of the pulse is to be detected. The values for the center and the rising edge can be derived from the other. It can be easier to define the location of the first filter tap (basically the rising edge), e.g., when the pulses in a pulse train are different widths. The different widths may result from different transmitted widths or due to the detected intensity being different, e.g., as described in FIG. 8.

Filtered output 920 corresponds to a second position where the overlap is two time bins, and thus resulting value is twice as much as in filtered output 910. The value is shown displayed a different time bin then filtered output 910 as filter 904 has been shifted by one time bin to the right. Filtered output 930 correspond to a third position where the overlap is three time bins. Filtered output 940 corresponds to a fourth position where the overlap is four time bins. Filtered output 950 corresponds to a safe position where the overlap is five time bins. As is readily seen, the fifth position is a highest as a corresponds to a perfect overlap between filter 904 and histogram 902.

Final filtered output 990 shows the values at each of the 9 positions that have some level of overlap between filter 904 and histogram 902. Such a filtered output can be analyzed to identify a maximum value as corresponding to a received time of the detected pulse. In various implementations, this time can be directly recorded or modified (e.g., identify where a leading edge would be) as part of a time-of-flight measurement.

FIGS. 10A-10C show the types of matched filter responses (filtered outputs) produced by different coded-pulse types according to embodiments of the present invention. In FIG. 10A, the coded pulse 1010 is formed by the optical transmitter being ON for 5 time-bin intervals. The matched filter response 1015 is wide (spanning multiple time-bins) and has a gradual gradient making it difficult to detect a match, measure the amplitude of the match, and accurately determine the time. Matched filter response 1015 has a similar form as final filtered output 990 of FIG. 9.

In FIG. 10B, the coded pulse 1020 is formed by turning the optical transmitter on and off 5 times and has a higher frequency component permitting more accurate range determination. The coded-pulses of FIGS. 10A and 10B have the same power because both are ON for 5 time-bin intervals. The matched filter response 1025 in FIG. 10B has multiple side-lobes making it difficult to use in the presence of noise.

FIG. 10C shows a coded pulse 1030 corresponding to the sequence {1,1,1,−1,1} that is an example of a Barker code, which are used in radar to generate matched filter responses with minimal or even purely negative side-lobes while retaining a temporally tight filter peak. In FIG. 10C, the matched filter response 1035 shows a sharp peak on the time bin that best matches the coded pulse. The time bin with a peak magnitude of the matched filter response 1035 can be used to compute the received time of the reflected coded pulses.

The peak magnitude has further uses. For example, the peak magnitude of the matched filter response 1035 can be used to compute the amplitude of the reflected coded pulse. The peak magnitude of the matched filter response 1035 depends on (1) the square of the amplitude of the reflected coded pulse and (2) the width and magnitude of the filter. If all of the filters have the same power, then they can be compared directly without scaling. For a given filter, the relative amplitude is given by the square root of the peak magnitude. The amplitude of the reflected coded-pulses is useful in distinguishing different types of reflecting objects or estimating an absolute value of target reflectivity.

Although such codes are known to have desirable properties, it is not clear how to achieve such coding for light pulses. In electrical applications, there can be a negative voltage, but there are no negative photons for light pulses. In radio frequency (RF), techniques use a negative phase of one signal relative to a reference signal e.g., using binary phase shift keying (BPSK). But, such phase differences are not a practical option for light pulses. As described below, some embodiments can assign weights to different pulses based on the detection time interval, e.g., which pulse train it is. For instance, a $1^{st}$ pulse train can have a different weight than a $2^{nd}$ pulse train when accumulating into a histogram.

IV. Coding Pulses Based on Detection Interval

A light ranging system (also called a coded-pulse optical receiver system) can transmit multiple pulses of light, where each coded-pulse has an embedded positive-valued pulse-code formed by the light intensity. The system can determine the temporal position and/or amplitude of optical pulses in the presence of background light by creating an intensity histogram of detected, reflected light at different time bins. For each time bin, the system adds a weighted value to the intensity histogram that depends on the intensity of detected light. The weighted values can be positive or negative and have varying magnitudes.

By selecting different combinations of positive-valued pulse-codes and applying different weights, the system can detect positive-valued and negative-valued codes suitable for standard digital signal processing algorithms. This approach gives a high signal-to-noise ratio while maintaining a low uncertainty in the measured temporal position of the reflected light pulses.

A. Different Weights for Different Pulse Trains

Figure 11:
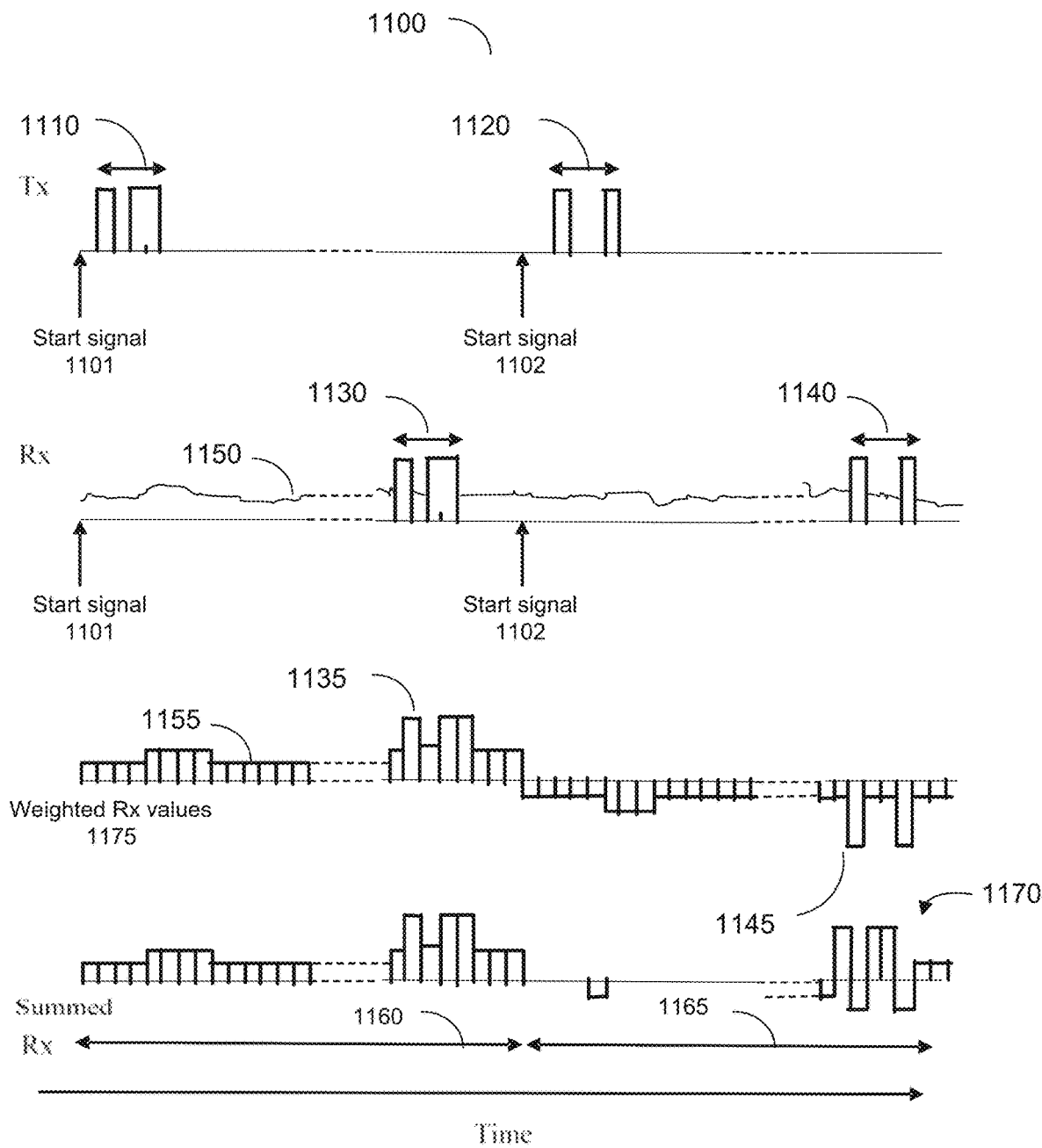
FIG. 11 is an exemplary schematic illustrating the operation of the coded-pulse optical system (CPOS) according to embodiments of the present invention.

FIG. 11 is an exemplary schematic 1100 illustrating the operation of the coded-pulse optical system (CPOS) according to embodiments of the present invention. Coded-pulse 1110 is first transmitted during pulse-time-interval 1160 (also called a detection interval), and coded-pulse 1120 is transmitted at a time after pulse-time-interval 1160 during pulse-time-interval 1165. The coded-pulse is formed by turning the optical transmitter's light transmission ON or OFF. Coded-pulse 1110 can be represented as the sequence 0,1,0,1,1,0 where a 1 means the optical transmitter is ON (i.e., transmitting light) and a 0 means the optical transmitter is OFF. Sequence digits give the ON/OFF value at successive light-sampling-intervals. Coded-pulse 1120 has a different pulse-code to coded-pulse 1110. Coded-pulse 1120 can be represented by the sequence 0,0,1,0,0,1. The coded-pulses are binary because they can have either an ON state or an OFF state.

The light transmission module (optical transmitter) and light sensing module (optical receiver) can be synchronized to start at the same time and be active during the same pulse-time-interval. For coded-pulse 1110, the synchronization can occur as a result of start signal 1101. For coded-pulse 1120, the synchronization can occur as a result of start signal 1102. Start signals 1101 and 1102 can be considered a common start signal from which times are measured.

The light sensing module detects background light 1150 and reflected coded-pulses 1130 and 1140. Received coded-pulse 1130 is the reflection of transmitted pulse-code 1110. Received coded-pulse 1140 is the reflection of transmitted pulse-code 1120. The light sensing module digitizes the received light intensity and produces a light intensity value for each light-sampling-interval called a time-bin or histogram bin. In this specific example, the light transmission interval between pulse trains is the same as the light-sampling-interval of light sensing module, e.g., for creating the histogram. However, the light transmission interval at the light transmission module may differ from the light-sampling-interval of the optical receiver system.

Time-bin 1155 corresponds to a light-sampling-interval when the optical receiver system is detecting background light 1150. Time-bin 1135 corresponds to the light-sampling-interval when the optical receiver system is first detecting coded-pulse 1110. Time-bin 1145 corresponds to the light-sampling-interval when the optical receiver system is first detecting coded-pulse 1120. The CPOS applies (via multiplication) a pulse-weight to the received digitized light intensity to obtain weighted data values 1175. In this example, the CPOS applies a pulse-weight of +1 during pulse-time-interval 1160 and a pulse-weight of −1 during pulse-time-interval 1165. Thus, the weighted light intensity value for time-bin 1135 is positive and the weighted light intensity value for time-bin 1145 is negative.

As described in earlier sections, the light sensing module can maintain an intensity histogram with one accumulated value per time-bin. The light sensing module initially sets the intensity histogram accumulated values to zero. During pulse-time-intervals 1160 and 1165, the light sensing module adds the weighted light intensity values to the existing value in the corresponding time-bins of the intensity histogram. Thus, for the first coded-pulse at pulse-time-interval 1160, the intensity histogram values are set equal to the weighted light intensity values because all values in the histogram started at zero. For the second coded-pulse at pulse-time-interval 1165, the weighted light intensity values are subtracted from the existing intensity histogram values. During pulse-time-interval 1165, the background light intensities of the two pulse-time-intervals tend to cancel each other out and reduce the magnitude of values in the intensity histogram. A result is histogram 1170.

The CPOS can improve its detection and ranging accuracy by repeating coded-pulses as needed. For example, the light intensity histogram may accumulate results from 2 coded-pulses of type 1 and 2 coded-pulses of type 2. The order of the coded-pulse types (i.e., types 1,2,1,2 or 1,1,2,2) often has little effect on the detection and ranging accuracy. In one embodiment the coded-pulse types are alternated.

Figure 12:
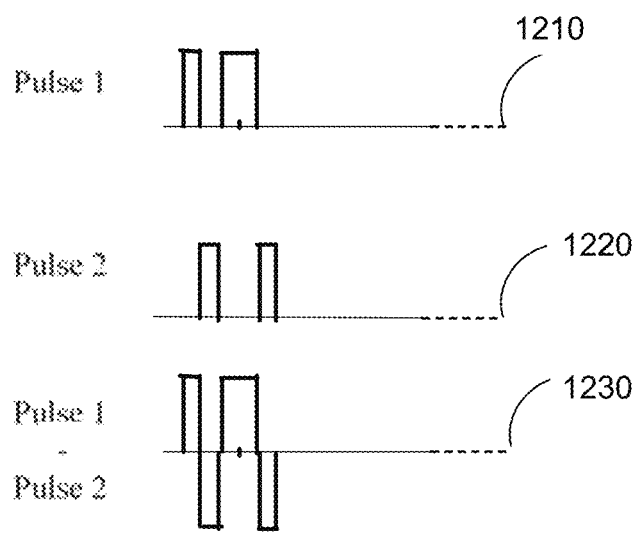
FIG. 12 shows two binary coded-pulse intensities and their difference providing a coded pulse train having positive and negative values according to embodiments of the present invention.

FIG. 12 shows two binary coded-pulse intensities 1210 and 1220 and their difference providing a coded pulse train 1230 having positive and negative values according to embodiments of the present invention. When time-series function of pulse train 1220 is subtracted from time-series function of pulse train 1210, it generates the time-series function 1230. The CPOS can use a matched filter to detect digitized pulses in the intensity histogram.

B. Reduced Interference and Higher Levels of Quadrature

FIGS. 11 and 12 show a simple example in which two types of binary coded-pulses are transmitted, the pulse weights are (+1, −1) and their detected reflections are combined to emulate the effect of sending a positive and negative-valued coded-pulse, which we call the match-code. After a suitable match-code has been selected the CPOS splits the positive and negative-valued match-code into two positive-valued coded-pulses with the first coded-pulse having the match-code's positive components and the second coded-pulse having the match-code's negative components.

In some applications, there may be multiple CPOSs of different light ranging systems active in close proximity, e.g., a different emitter/sensor pair in the respective arrays. One CPOS may detect reflections of coded-pulses transmitted from a second CPOS and report incorrect results. In this case, it is advantageous to assign each CPOS a different match-code combination that avoids interference. In some embodiments, pseudorandom pulse trains can be used instead, and also provide low probability of crosstalk between different ranging devices or between different pixel emitters of a same ranging device.

Further, the codes can be defined in multiple dimensions beyond just positive and negative weighting. For example, different shots can be assigned weights in a 2D vector space with a Y-direction or an X-direction component to the weight. Instead of storing signed numbers, the histogram can be adjusted to store a 2D vector in each time bin and vector addition can be used to accumulate vector weighted codes into each time bin. For example, a pulse train can be sent with a positive Y weight, a next pulse train can be sent with a negative Y weight, but both with zero weights in X direction. Thus, the weights can be in higher dimensions, and can have values nonzero values in both directions. For example, the code could be {+Y, −Y, +Y, +X, −X}, and a corresponding matched filter can be used. The background noise can generally cancel (e.g., zero mean) in this multi-dimensional example in a similar manner as described above for the one-dimensional example, e.g., as long as equal number of pulse trains have positive and negative values in the same dimension.

With higher dimensions, coded-pulses of one system can be unique (or at least less likely to be used by another system), and thus be easier to distinguish from other coded-pulses, thereby reducing cross-talk from other CPOS systems. Accordingly, to reduce interference, embodiments can support advanced codes by combining multiple types of positive-valued coded-pulses with multidimensional vector pulse-weights to produce a multi-dimensional match-code. For example, quadrature phase codes are codes that differ by a phase difference of 90 degrees. The earlier code example with pulse-weights of (+1, −1) can be considered as having 2 codes with a phase difference of 180 degrees in one dimension. With quadrature phase codes the pulse-weights can be ([+1,0], [−1,0], [0,+1], [0,−1]) and the weighted light intensity value and intensity histogram values are 2-dimensional vectors. With magnitude 1 pulse-weights, the desired 2-dimensional match-code is decomposed into 4 positive-valued pulse-codes by selecting positive and negative components for each vector dimension. In some embodiments, the pulse-weights can be in more than two dimensions. Various higher dimension pulse-codes can be used, making it easier to assign unique pulse-codes to multiple CPOSs. Accordingly, the weights can be vectors in two or more dimensions.

Besides different dimensions, the coded pulses can have different values, e.g., different than just 0 or 1. In the example of FIGS. 11 and 12, the transmitted pulse-code values consist of 0 and 1 values corresponding to the optical transmitter being turned ON or OFF. The CPOS also supports multi-valued, non-integer pulse-codes with values such as 0, ½ and 1. Such non-integer pulse-codes can be generated by such methods as a) varying the intensity of the optical transmitter light; and b) transmitting ON/OFF light pulses at a faster frequency than the light-sampling-interval. Accordingly, the match-codes derived from the pulse-codes can include of multi-valued, positive or negative, integer or non-integer numbers. For example, the CPOS could apply weights of +1 to pulse-codes (1, 1, 1), (1, 1, 0) and (1, 0, 0) and produce a match-code of (3, 2, 1).

Interference from other light ranging systems can be reduced using additional techniques. For example, different systems can emit light pulses in different frequency/wave-length ranges. The receiver optical system can use filters (e.g., as part of micro-optics that include one aperture per pixel) that pass light in a relatively narrow range, e.g., a spectral width of 2 nm, 1 nm, 0.5 nm, 0.25 nm or less. Further details on such micro-optics can be found in U.S. Patent Publications 2017/0289524 and 2017/0219426.

If a different system emits light outside of the spectral range of the filters of this system, then such other light will not reach the sensors of this system. The number of different possible types of emitters (e.g., lasers) and corresponding filters can depend upon how narrow the emission spectra are of the emitters and how narrow the spectral range of the filters. In some implementations, different models or fleets of devices (e.g., vehicles, phones, surveying equipment) can be assigned different spectral ranges, thereby decreasing the likelihood or number of interfering devices that are near a system.

In addition or instead, other techniques can have different channels of a same system have different spectral ranges. For example, emitter 403 in FIG. 4 can emit light in a different spectral range than emitters adjacent to emitter 403. And, a filter for sensor 413 can pass light in a range corresponding to that emitted by emitter 403, but different than filters for neighboring sensors. In this manner, cross-talk from other channels can be reduced.

C. System Components

Figure 13:
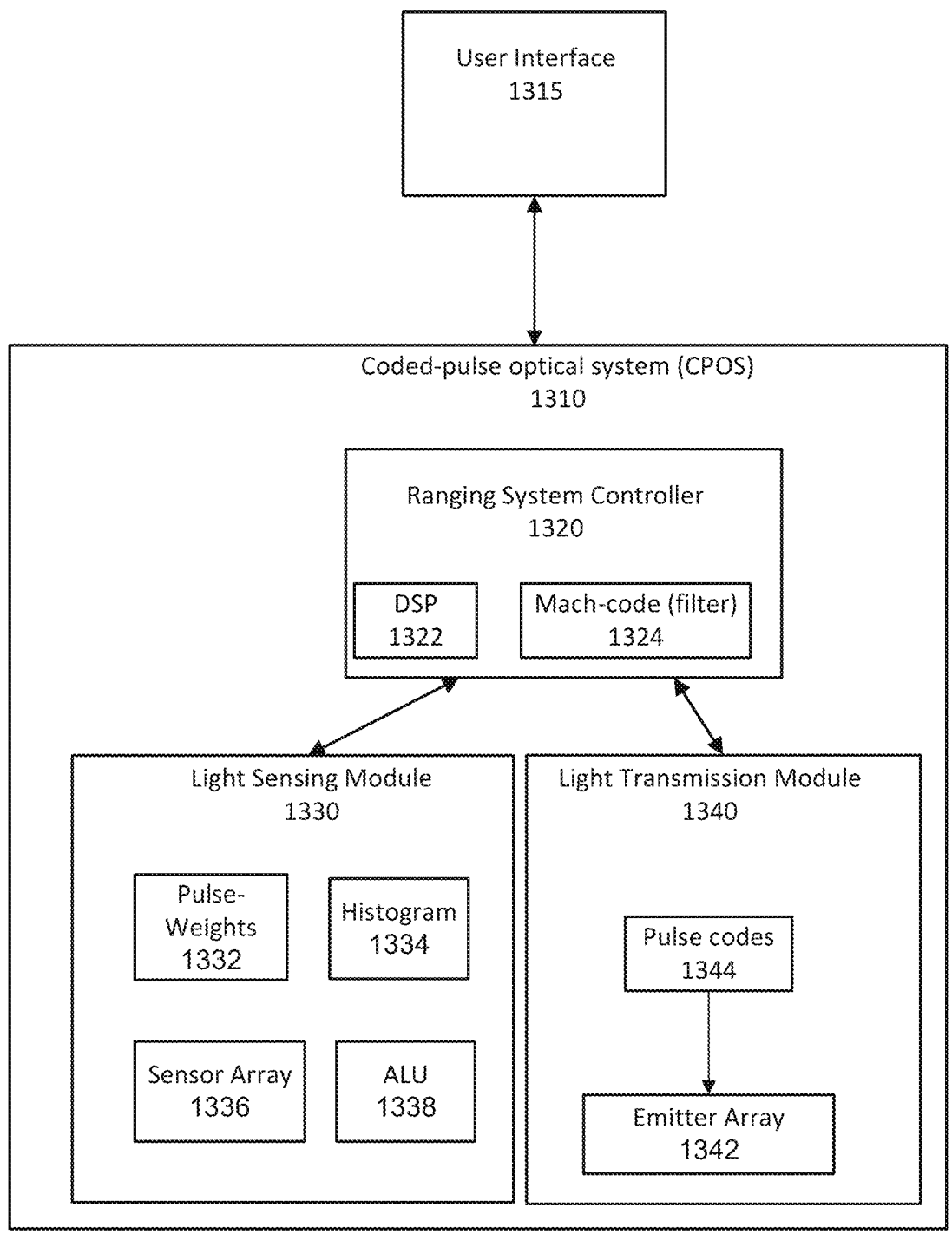
FIG. 13 shows a coded-pulse optical system (CPOS) according to embodiments of the present invention.

FIG. 13 shows a coded-pulse optical system (CPOS) 1310 according to embodiments of the present invention. CPOS 1310 can be light ranging device 210 of FIG. 2, with corresponding devices of FIG. 13 potentially having similar capabilities as those in FIG. 2. CPOS 1310 can interacts with user interface 1315, which can be user interface 215 of FIG. 2. User interface 1315 (e.g., hardware and software) can specify a match-code and other operational parameters. User interface 1315 can display CPOS results, which can include a 3-dimensional map of detected objects and a distance value for a specific object.

A system controller 1320 can control the light sensing module 1330 (also called an optical receiver system) by sending commands that include: a) clear the intensity histogram accumulated values; b) specify the pulse-weights and other operational parameters (e.g., the pulse-time-interval and light-sampling-interval); c) start light detection; d) send the intensity histogram accumulated values. The system controller 1320 can use a command bus to send coded commands and a data bus for sending and receiving data values. In some embodiments, the system controller 1320 can send a 0 or 1 start signal to indicate when light detection should start, and send a 0 or 1 polarity signal to indicate the weight to be applied to the intensity values (positive or negative one).

System controller 1320 can control the light transmission module 1340 (also called an optical transmitter) by sending commands that include: a) specify the pulse-codes and other operational parameters; b) start transmission of pulse trains having the specified pulse-codes.

System controller 1320 can include a digital signal processor (DSP) 1322 for executing the matched filter using a match-code 1324, which may be stored in memory 254 of FIG. 2. More than one match-code (filter) may be stored, as well as different levels of filters, as is described in more detail in later sections. The DSP 1322 can be implemented in multiple ways including: a) a processor specialized for DSP operations; b) using programmable logic blocks within an FPGA; and c) as logic within an ASIC. In an alternative embodiment, DSP 1322 and match-code 1324 can be part of light sensing module 1330. Match-code 1324 defines the template time-series function to be matched. In one embodiment, match-code 1324 is a series of numerical values stored in memory. Match-code 1324 may be stored as in conjugated time-reversed format for ready use by the matched filter.

Light sensing module 1330 contains pulse-weights 1332, an histogram 1334, a sensor array 1336, and an arithmetic logic unit (ALU) 1338. Pulse-weights 1332 can be stored as a sequence of integers or floating point numbers in a register or other memory cells. In an alternative embodiment, the pulse-weights are restricted to having positive or negative unity values (i.e., +1 or −1) in each dimension, and the pulse-weights are implemented as bit patterns in a register or memory. The intensity histogram 1334 can be implemented as a memory (e.g., memory 234 of FIG. 2) with one or more memory cells per time bin. The sensor array 1336 detects photons of lights and creates a digitized intensity value for each time-bin.

In some embodiments, ALU 1338 multiplies the digitized light intensity from the sensor array 1336 by the appropriate pulse-weight 1332 and adds the result to the appropriate memory-cell of the histogram 1334. In other embodiments, light sensing module 1330 can add or subtract detected light intensities to/from the appropriate memory cells of the intensity histogram. In such an embodiment, ALU 1338 can implements addition and subtraction without a multiplier.

Light transmission module 1340 contains pulse-codes 1344 and an emitter array 1342 (e.g., one or more laser diodes) capable of transmitting light. The pulse-codes 1344 indicate when light should be transmitted. The pulse-codes 1344 can be stored as a sequence of integers in memory (e.g., memory 246 of FIG. 2).

The dimensions of histogram 1334 (e.g., number of time bins) can match the application needs. In various implementations, histogram 1334 can contain 1024 12-bit memory cells, when the pulse-time-interval (detection interval) is 1024 ns, the light-sampling-interval is 1 ns, and two types of pulse-codes are each transmitted 12 times. Light travels 30 cm in 1 ns so a light-sampling-interval of 1 ns suggests a nominal range accuracy of 30 cm, or 15 cm when round trip time is taken into account. Accumulating results over a longer period by repeating the coded-pulses 12 times leads to an improved range accuracy in addition to the improved detection accuracy.

Detecting light for 1024 ns means the CPOS can detect reflected light that has traveled up to 307.2 m. If the CPOS were to transmit a second coded-pulse immediately after the first coded-pulse, a distant reflection from the first coded-pulse could get misinterpreted as a reflection from the second coded-pulse. The CPOS can avoid this problem by pausing between coded-pulses to allow the energy of the coded-pulses to dissipate. Various amounts of pausing can be performed, e.g., a same amount as a detection interval, or more or less. Transmitting 2 different types of pulse-codes 12 times and pausing for 1024 ns between coded-pulses takes 48×1024 ns, approximately 50 μs. If the object reflecting the light has moved a significant distance in those the 50 μs, the range accuracy could suffer but this is not a concern for most objects. Even a car moving at 100 km per hour moves only 1.4 mm in 50 μs.

D. Method of Coding Pulses

Figure 14A:
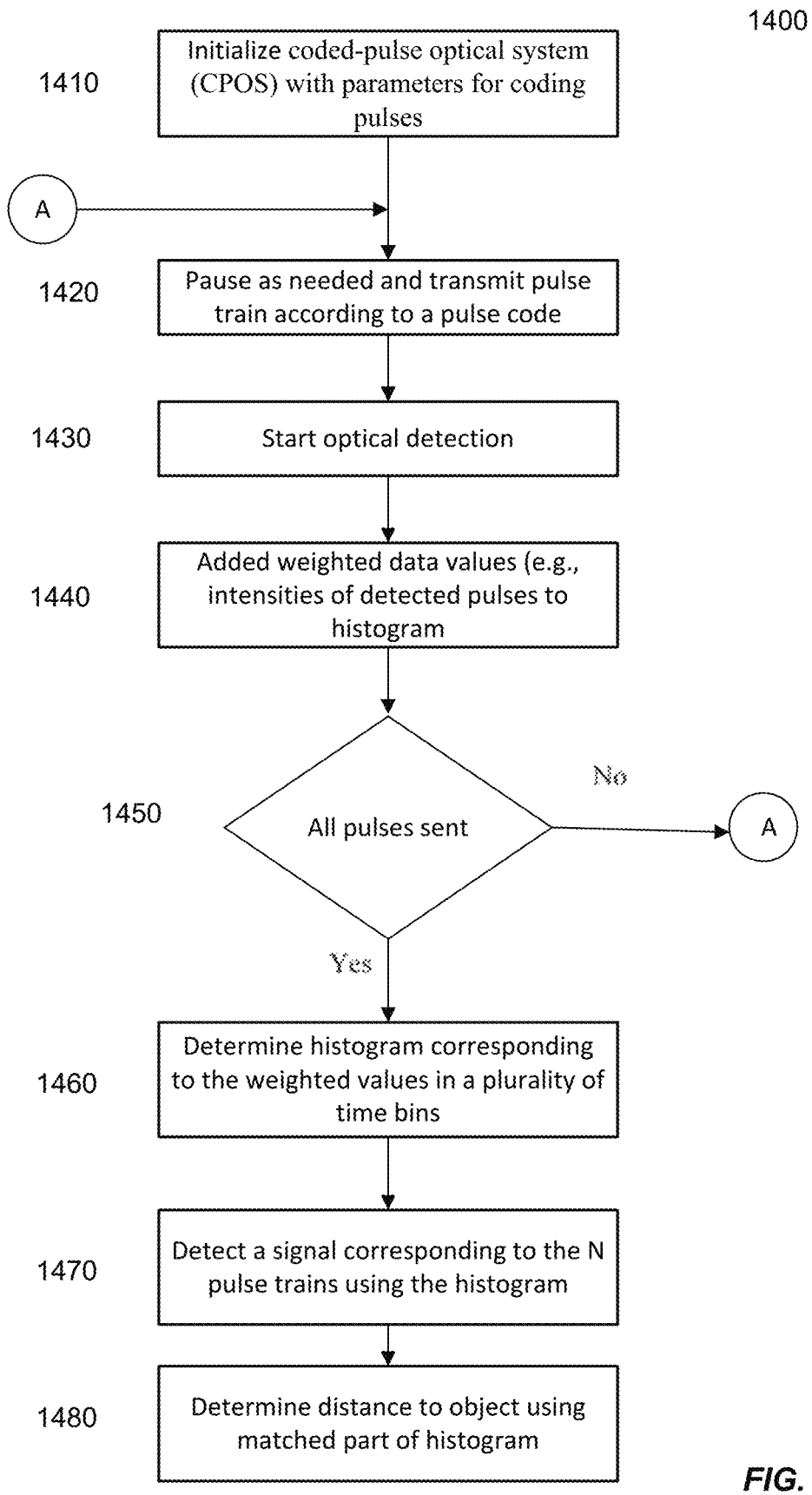
FIG. 14A is a flowchart illustrating a method 1400 of using coded pulses in an optical measurement system according to embodiments of the present invention.

FIG. 14A is a flowchart illustrating a method 1400 of using coded pulses in an optical measurement system according to embodiments of the present invention. The optical measurement system may be a light ranging system. Method 1400 can detect the temporal position of a reflected pulse from a target using multiple coded-pulses. In a real-time 3-dimensional application, method 140 may be repeated continuously for multiple directions. Method 1400 may be implemented by any of the optical measurement systems described herein.

At 1410, a coded-pulse optical system (CPOS) performs an initialization. For example, the CPOS can respond to user interface commands for starting, stopping, and changing parameters. The CPOS can initialize an optical transmitter to indicate parameters, e.g., pulse-codes, light power level, and various time intervals (e.g., for a detection interval, an interval for pausing between detection intervals, and an overall measurement time interval). The CPOS can initialize a light sensing module to indicate parameters such as pulse-time-interval and light-sampling-interval. The CPOS can also clear histogram values, e.g., in histogram 1334.

At 1420, a pulse train is transmitted from a light source (e.g., a laser) as part of an optical measurement. The pulse train can be transmitted as part of N pulse trains transmitted for the measurement. The N pulse trains can reflect from an object, thereby allowing a ranging measurement to the object. Each of the N pulse trains can include one or more pulses from the light source (e.g., VCSELs) and correspond to a different time interval that is triggered by a start signal. For example, FIG. 11 shows start signals 1101 and 1102 triggering time intervals 1160 and 1165 respectively.

In some embodiments, the CPOS can wait for a specified time to allow a previous pulse train (coded-pulse transmission) to dissipate. The CPOS can then transmit a next pulse train of the N pulse trains of a measurement, where the N pulse trains form a code. Once a measurement is complete, e.g., a last of the N pulse train has dissipated (e.g., after a predetermined time expected for any reflections), the CPOS can then start the first/next coded-pulse transmission using the appropriate pulse-code. N can be an integer greater than one, e.g., 2, 3, 4, 5, or higher.

At 1430, optical detection can be started, e.g., in response to the start signal that triggers the pulse train to be transmitted. Thus, the CPOS can start light detection at the same time that it started coded-pulse transmission. As part of the optical detection, a pulse train can be detected by a photosensor (e.g., corresponding to a pixel) of the optical measurement system, thereby generating data values at a plurality of time points. In some embodiments, the photosensor is a collection of photodetectors (e.g., SPADs). The data values may be of various forms, e.g., counts of a number of SPADs that triggered at a time point (e.g., within a time bin of a histogram). As another examples, the data values can be a digitized value from an ADC that follows an analog photosensor (e.g., an APD). Both examples can correspond to an intensity. In total, N pulse trains can be detected. Further, the process can be performed separately for each photosensor of the optical measurement device.

At 1440, a weight is assigned to the data values at time points within the time interval corresponding to the pulse train, thereby obtaining weighted values. The assigned weight can come from pulse-weights 1332. A weight can be assigned for each of the N pulse trains. Some of such weights for different pulse trains can be the same as other pulse trains. In some embodiments, at least two of the N pulse trains are assigned different weights and have a different pulse pattern. For example, FIG. 12 shows two pulse patterns that have different weights. The two pulse trains can have some similarity (e.g., portions of pulses can overlap), but there is at least some times where one pulse train is ON and the other pulse train is OFF. Such different pulse patterns can have a similar shape but have a different delay, e.g., {1, 0, 1, 1, 0} has a similar shape of non-zero values to {0, 1, 0, 1, 1}, but they are different pulse patterns due to an offset as may be achieved by a delay in the second signal relative to the first signal.

Accordingly, the CPOS can detect light and create a digitized intensity value for each light-sampling-interval. For each light-sampling-interval, the CPOS can apply a pulse-weight to the digitized intensity value and add the result to the appropriate time-bin of the intensity histogram.

At 1450, the CPOS tests if it has sent the required number of coded-pulses. If the CPOS has sent the required number of coded-pulses it continues at block 1460, otherwise it loops back to block 1420.

At 1460, a histogram corresponding to the weighted values in a plurality of time bins is determined. As described above, a counter of the histogram at a particular time bin can be determined by accumulating the weighted values at time points within the particular time bin across a plurality of time intervals. For example, histogram 1170 is accumulated over two time intervals and includes time bins of the weighted data values 1175.

At 1470, the histogram is used to detect a signal corresponding to the N pulse trains. For example, the CPOS can determine whether the histogram has a sequence of values that match the match-code (filter). The CPOS can report whether the match-code was found and the amplitude of the match. The match may allow detection of the desired signal relative to noise or interference from other light sources.

As an example, the technique of FIG. 9 may be used to detect the signal. A filter can include a set of values to be applied to a window of time bins of a histogram. The filter can be slid over the histogram to calculate a filtered histogram having counters corresponding to different sliding positions of the profile filter relative to the histogram. Each of the counters of the filtered histogram can correspond to an overlap of the profile filter and the histogram at a particular sliding position. A maximum value of the counters of the filtered histogram can be identified, thereby allowing detection, e.g., when the maximum value is above a threshold. The particular sliding position for the maximum value of the counters can correspond to the received time, which may be used for ranging measurements. Further details and techniques for using filters are described herein and may be used with method 1400.

In some embodiments, the signal may be a reflected signal caused by the N pulse trains reflecting from an object, e.g., when the optical measurement system is configured to perform ranging measurements. In other embodiments, the signal may be a communication signal, e.g., when the light source is at one location and the photosensors are at a different location. Such a configuration can be used for communication purposes. For example, a microwave transmission tower can transmit data to a receiving tower. The transmitted data can include coded pulses, which may help to reduce errors in data reception as may be caused by noise or interference from other sources. The receiving tower can identify pulse trains and create a histogram by selecting an arbitrary time between two pulse trains as a start time for a first time bin. A match filter can then be applied (e.g., by sliding over the histogram); and if a sufficient match is found, then that communication signal can be detected. A sufficient match can be measured by the maximum value obtained the filtered histogram. As a further embodiment, the system can detect an interference signal from another CPOS in a similar manner used to detect the communication signal. If interference is measured, some implementations can change the transmitted code, e.g., of the interference code is similar to the code currently being used.

At 1480, a distance to the object can be determined. For example, a received time corresponding to the N pulse trains relative to the start signal can be determined. A distance to the object can be determined using the received time. The received time may be offset from the transmission times of the pulse trains, but such an offset can be taken into account. Accordingly, the CPOS can report the time at which it was detected. The distance can corresponds to a round trip time between the received time and a start time of the start signal, and thus the distance may be expressed in time.

The detected signal can be used for other purposes than ranging. For example, the quality of the detected signal can be used to measure the reflectivity of an object. For example, if the detected signal has a strong intensity, then the system can determine that the object has a high reflectivity. Implementations for communications and interference measurements are discussed above. For detection of interference from another light source, the detected signal would be from another set of pulse trains transmitted by the interfering light source.

As a generalization, embodiments can transmit N+1 unique codes with N+1 unique weights to generate an N dimensional vector space histogram. For example, instead of a bin holding a signed number, the bin can hold a 1-D vector (e.g., equivalent to a signed number), by transmitting at least two unique codes: one positive and one negative. To store a 2-D vector (e.g., in polar or Cartesian coordinates), the system can transmit at least three unique codes, which could be weighted with three different polar angles and sum to a single 2-D vector. An N-D vector (defined with N separate numbers all held within a single "bin") would require N+1 different codes, each weighted at a different angle (in other worlds having a component to its weight that is orthogonal to all other weights) when doing the vector summation. By increasing the dimensionality, more advanced coding techniques like quadrature phase coding or code division multiple access (CDMA) that are used in RF communications may be used. An N-dimensional matched filter can be used in this context.

As mentioned above, method 1400 can be used to reduce interference among channels. For example, method 1400 can be repeated for a plurality of channels of light sources and photosensors as part of a plurality of optical measurements. The plurality of optical measurements can overlap in time, e.g., performed substantially simultaneously. Thus, each channel can perform a measurement at the same time. To reduce interference, the codes can be different for at least some of the channels. For example, the pulse patterns of the N pulse trains of at least two channels of the plurality of channels can be different, thereby causing different histogram patterns for different channels. In addition or instead, the weights assigned to the N pulse trains of at least two channels of the plurality of channels can be different, thereby causing different histogram patterns for different channels.

E. System Having Multiple Memory Banks

Data from different detection intervals (e.g., of a same measurement interval) can be stored in different memory banks, e.g., via a signal that switches between memory banks. For instance, a signal can indicate that data values for one detection interval (shot) having a first pulse pattern can be stored in one memory bank and that data values for another detection interval having a second pulse pattern can be stored in another memory bank. In some implementations, all the data values from pulse trains sharing the same pulse pattern can be stored in a same memory bank for the given measurement interval.

Higher performance can be achieved by saving the positive and negative weighted values (or any other differently weighted data values, e.g., fractional values) into separate memory banks instead of summing them into a single memory bank immediately. The system can have a memory bank per weight and the ability to switch between these memory banks on a shot by shot basis. This approach can preserve the total number of photons to arrive in the detector, which can be valuable information, e.g., for normalization, improved estimation of background noise, or other statistics. The summation of the two or more memory banks can be performed at the end of the measurement interval, e.g., before applying a matched filter.

Figure 14B:
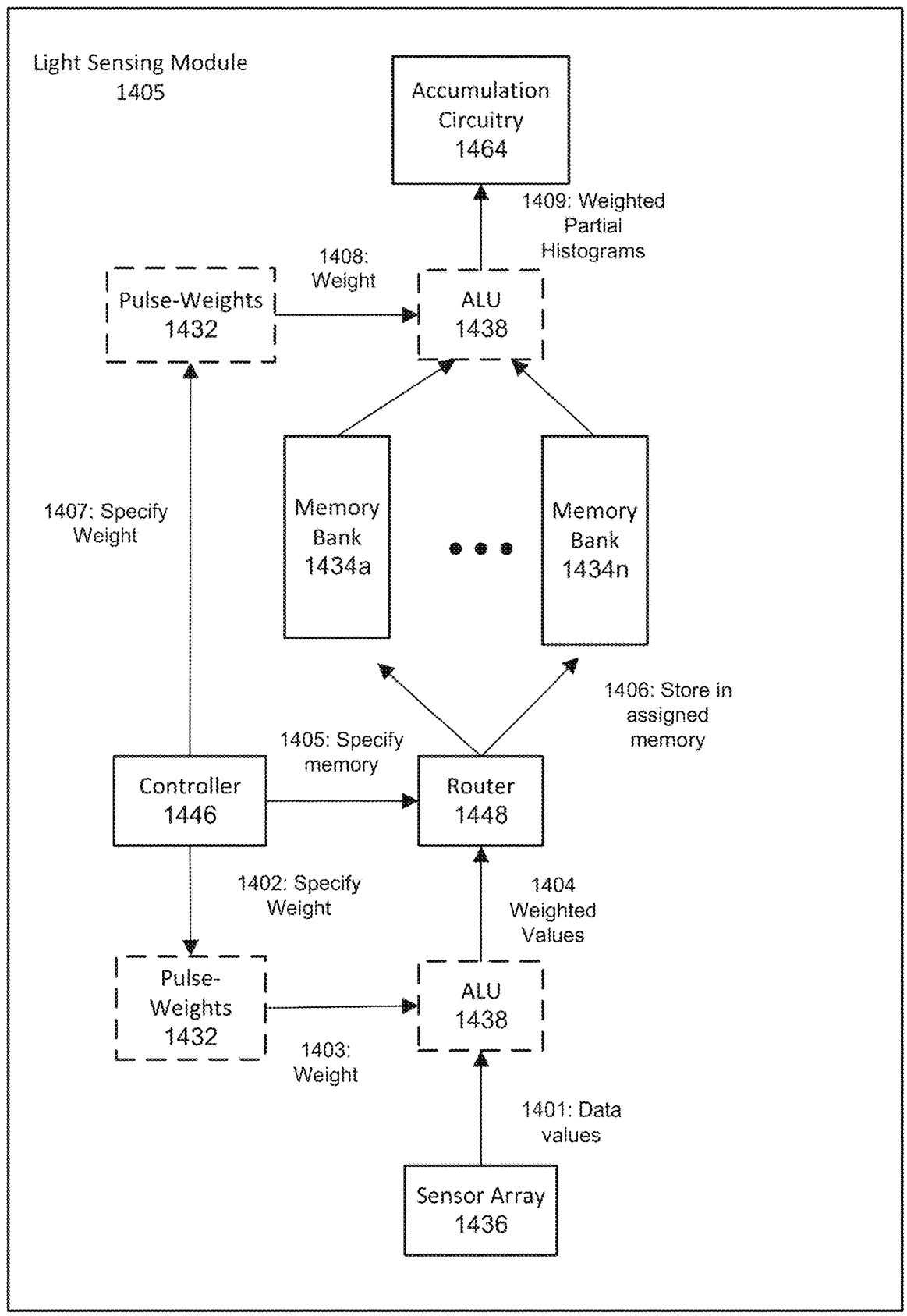
FIG. 14B shows a light sensing module having multiple memory banks for use with data values from different detection intervals according to embodiments of the present invention.

FIG. 14B shows a light sensing module 1405 having multiple memory banks for use with data values from different detection intervals according to embodiments of the present invention. Light sensing module 1405 can correspond to other light sensing modules described herein, e.g., light sensing module 1330.

Light sensing module 1405 can use multiple memory banks as part of generating a total histogram corresponding to coded pulses of a measurement. For example, a light transmission module (e.g., 1340) can emit pulse trains, each for a different detection interval. The pulse trains can include at least two different pulse patterns, e.g., as shown in FIG. 12. The system can coordinate which pulse train is emitted with which weight is assigned to the pulse train. For example, a controller 1446 can track which pulse train has been emitted for a given detection interval so that the proper weight is applied and so that the data values are stored in the correct memory bank. Each memory bank can store the data values of pulse trains having a same pattern as a partial histogram, e.g., without counters as described herein.

Such coordination can occur in various ways, e.g., controller 1446 can be or reside in a ranging system controller (e.g., 1320), e.g., on a different integrated circuit. As another example, the ranging system controller can provide a timing signal to both the light transmission module and light sensing module 1405 so that the two modules are synchronized. Each module can be programmed to respectively emit pulse trains in a particular order and apply weights in a particular order, so that direct communication of which particular weights to use for a given detection interval is specified based on the timing signal, e.g., a periodic clock signal.

The weights can be applied in various ways and at various times. For example, FIG. 14B shows two ways that weights can be applied to the data values for generating a total histogram from a set of partial histograms, each corresponding to a different memory bank 1434a-1434n. Optional locations of modules in a pipeline are shown with dotted lines. For example, an arithmetic logic unit (ALU) 1438 can be implemented at either one of two different points in the pipeline of FIG. 14B. Other types of logic units (e.g., those operating on floating point numbers) can also be used.

At 1401, sensor array 1436 generates data values corresponding to photons detected during a current detection interval. Data values can be generated for each nanosecond time bin and provided to ALU 1438. In another implementation, sensor array 1436 can provide the data values directly to a router 1448.

At 1402, controller 1446 can optionally specify which pulse-weight of pulse-weights 1432 is to be applied by ALU 1438, i.e., when weights are applied before storing the data values in a memory bank. As mentioned above, controller 1446 can be synchronized with the pulse train emission so that the correct weight is specified. As an example, the weight can be specified via an identifier, e.g., an identifier value of '0' for a weight of '-1' and an identifier value of '1' for a weight of '1'. Accordingly, the data values in the first memory bank can be weighted by a positive number (e.g., an integer, fraction, real number, etc.) and the data values in the second memory bank can be weighted by a negative number. To accomplish this, controller 1446 can be communicably coupled with the memory of pulse-weights 1432 so as to identify a respective weight to be applied to respective data values.

At 1403, the selected weight is provided to ALU 1438 when the weight is done before storing the data values in a memory bank. ALU 1438 can then apply the weight to the data values of a current detection interval for a most recently emitted pulse train.

At 1404, the weighted values are sent to a router 1448, which can store the data values in the appropriate memory bank. Router 1448 can received an indication from controller 1448 about which memory bank is to be used for this current set of data values, which may be weighted or unweighted, depending on the particular implementation.

At 1405, controller 1446 specifies which memory bank is to be used for the current set of data values. The memory bank can be specified in various ways, e.g., using an address or other identifier. Accordingly, controller 1446 can be configured to assign data values generated from the plurality of photosensors during each of a plurality of detection time intervals to be stored in a respective memory bank of the plurality of memory banks.

At 1406, router 1448 sends the data values to the assigned memory bank. The data values for one pulse pattern can be stored in one memory bank. In some embodiments, at least one pulse train of the N pulse trains is assigned to each of the plurality of memory banks during the optical measurement. Consecutive pulse trains can be assigned to different memory banks, e.g., when the pulse trains alternate with different pulse patterns. Accordingly, after detecting photons of a pulse train by the photosensors of the optical measurement system, the data values at time points within the time interval corresponding to the pulse train can be assigned to a respective memory bank of a plurality of memory banks.

The data values can be accumulated in each memory bank, thereby forming a partial histogram in each memory bank. Accordingly, a first partial histogram can be determined for a first memory bank. A counter of the partial histogram at a particular time bin can be determined by accumulating the data values at time points within the particular time bin across a plurality of time intervals of pulse trains assigned to the first memory bank. For instance, a new data value (e.g., # of SPADs triggered in a time bin of a current detection interval) can be added to a corresponding counter of the assigned memory bank. Thus, a counter for a first time bin of the first partial histogram stored in the first memory bank can be incremented when a photon is detected at a time point within the first time bin for a pulse train that is assigned to the first memory bank. The total number of triggered SPADs can be tracked based on the absolute value of a sum across all memory banks. Accordingly, a total number of photons detected by the photosensor during the optical measurement can be determined by summing the data values in the plurality of memory banks.

At 1407, controller 1446 can optionally specify which weight of pulse-weights 1432 is to be used by ALU 1438, when weights are applied after storing the data values in a memory bank. In some embodiments, each of the plurality of memory banks is assigned a different weight.

At 1408, the selected pulse weight is provided to ALU 1438, e.g., when the weight is done after storing the data values in a memory bank. The weighting can be achieved by applying a same weight to all of the counters of a same memory bank while a different weight can be applied to counters of a different memory bank. Thus, a first weight can be applied to a first partial histogram as part of determining the total histogram.

At 1409, the weighted partial histograms are provided to accumulation circuitry 1464, which can determine a total histogram corresponding to weighted data values for a plurality of time bins. Accumulation circuitry 1464 can determine the total histogram by respectively accumulating weighted values of the plurality of memory banks into respective counters for each time bin across a plurality of time intervals. For example, a sum can be computed of the counters for the $1^{st}$ time bin in each memory bank, a sum of the counters for the $2^{nd}$ time bin, and so on.

Accordingly, a total histogram corresponding to the data values in a plurality of time bins can be determined using the data values in the plurality of memory banks. Similar to other histograms, a counter of the total histogram at a particular time bin can be determined by accumulating the data values in the plurality of memory banks at time points within the particular time bin across a plurality of time intervals. Whether weights are applied before or after storage in the memory banks, the accumulating can include weighting the data values in a first memory bank of the plurality of memory banks by a different weight than the data values in a second memory bank.

V. Match Filtering Using Different Profile Filters

As described above for FIG. 8, the signal resulting from a detected pulse can vary depending on the type of object from which the pulse reflected. As shown in FIG. 8, the portion of the resulting signal (e.g., a histogram accumulated over multiple detection interval) corresponding to one pulse (e.g., a first pulse of the coded pulse pattern) from a highly reflective object can have a sharp peak at the beginning and then decrease quickly. Such a behavior can result when using SPADs, as there is a dead time (e.g., 10-20 ns) after a SPAD detects a photon before it can detect another photon. In contrast, a portion of a histogram for a pulse reflected from a standard object can be relatively square-like, thereby resembling the actual transmitted pulse. Thus, even if a coded pulse pattern is used to increase the ability to differentiate a reflected pulse from background, other issues may arise due to different shapes of the detected signal, e.g., due to detecting pulses of different intensities. Detected signals can be longer than the transmitted pulse width, e.g., a smeared pulse can occur when a pulse reflects from an angled surface.

The above behavior can be moderated by using more SPADs or other photodetectors per pixel (i.e., per pixel sensor) so that even under moderate light fluxes, some SPADs will fire, but there will always be some SPADs active. However, under very high light fluxes, there will be situations where most or all of the SPADs are fired, and the pixel sensor cannot immediately detect many photons because most or all of the SPADs are turned off.

To further illustrate, assume a SPAD has dead time of 20 ns, but a high light flux from a reflected pulse is 1 photon every 10 ns. The output of the SPAD will indicate a photon only every 20 ns. As another example, with a strong 50 ns pulse of reflected light, then every SPAD can fire (register) and then turn off for 20 ns. After 20 ns, the SPADs will turn back on, register again, turn off, turn on one more time. Thus, a 50 ns pulse will look like three short spikes. Such a change in the detected signal might cause a coded pulse to be entirely missed, cause confusion about the number of objects, or at least a received time of the 50 ns pulse to be inaccurately determined. To address this problem, different matched filters can be used to identify the different decay/responses/pileup of the SPADs.

Accordingly, embodiments can use filters corresponding to different types of signal profiles (e.g., no/low pileup, moderate pileup, and high pileup). A matching process can determine the type of signal from the photodetectors of a pixel sensor, thereby allowing a better determination of a reception time for performing a time-of-flight calculation used to determine a distance to an object. In some embodiments, multiple layers of filtering can be performed, e.g., a coarse filter can identify a window of values for performing more refined analysis, as may be done by interpolating the signal in the window using a subset of interpolation filters (e.g., corresponding to the matched coarse filter). Such refinement is described later.

A. Application of Filter Profiles to Raw Histogram (and Normalization)

In some embodiments, the profile filters can be applied to the raw histogram. The profile filters can generally correspond with the nominal laser pulses, although the profile filters can be modified to be shorter, longer, or have different shapes or distortions applied based on the anticipated effects of the target or the detectors on the nominal pulses, e.g., as varied as the different detected signals in FIG. 8. A shorter profile can correspond to a higher pile up situation, and a longer profile can correspond with a situation where a pulse hits an angled surface, thereby smearing the reflected pulse in time (e.g., one side (e.g., left) of the laser pulse is closer than the other side (e.g., right) of the laser pulse due to the angled surface). The overall height of the raw histogram can decrease due to the light flux getting smeared. As other examples, a cloud or foliage can also cause a smeared pulse. Generating filter profiles may be achieved by simulating the different sources of distortion and applying their effects to the nominal pulse profile. Alternatively, filter profiles may be derived empirically by taking histogramming measurements in situ and saving the digitized pulse profiles that appear in the histograms as the filter profiles.

Accordingly, the different profiles can account for a different impulse width due to orientation of objects, as well as the intensity of light reflected (e.g., due to an effect of a dead time, as explained for FIG. 8). Both effects result in a different rate of photons being detected by the photosensor over consecutive time bins.

Figure 15:
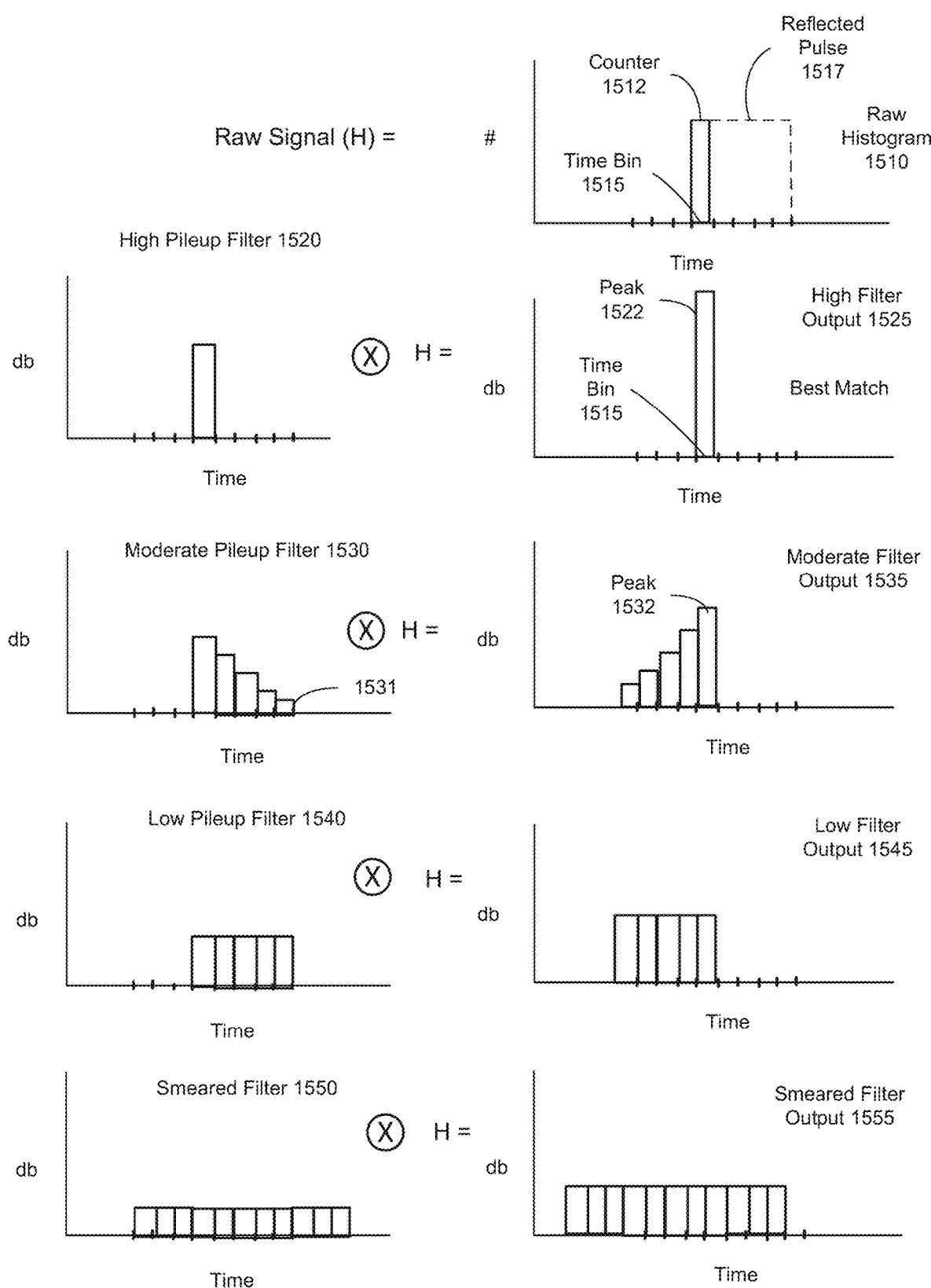
FIG. 15 shows a plurality of profile filters applied to a raw histogram according to embodiments of the present invention.

In some embodiments, the profile filters are designed based on the technique of normalized cross-correlation, according to which the highest value will be returned by the filter that matches the shape of the input signal most closely. Accordingly, in some embodiments, three different filter profiles are designed based on the profiles of the digitized signal with no pileup, moderate pileup, and high pileup as seen in FIG. 8 and FIG. 15 below. FIG. 15 also shows a smeared filter. To illustrate the application of different profile filters, a single pulse is assumed for one or more pulse trains in the example below.

FIG. 15 shows a plurality of profile filters applied to a raw histogram 1510 according to embodiments of the present invention. FIG. 15 shows various filters that can be applied to an unknown signal to determine a profile shape of the detected signal, its location, and a received time of the pulse that generated the detected signal. In this example, the emitted pulse has a width of 5 time bins. Raw histogram 1510 can be much larger; only a portion is displayed for ease of illustration.

Raw histogram 1510 has one time bin 1515 with an appreciable value, specifically counter 1512. Such a shape corresponds to a high pileup. The type of actual signal shape is unknown to the system, and thus various filter profiles can be applied. Reflected pulse 1517 shows the actual pulse being received (5 time bins), even though time bin 1515 is the only time bin with a measurable signal due to the dead time in the last four time bins. Reflected pulse 1517 corresponds to an actual light flux hitting the photosensor, although not all of it is actually detected. In other examples, reflected pulse 1517 could be longer (e.g., due to angled surface or relative distance to object increasing) or shorter (e.g., relative distance to object decreasing).

High pileup filter 1520 has one time bin with a nonzero value and is similar to high pileup profile 830 of FIG. 8.

High pileup filter 1520 can be applied to raw histogram 1510 to generate high filter output 1525, which has a single time bin with an appreciable value, where the time bin corresponds time in 1515, as is shown by alignment of the time bins and raw histogram 1510 and high filter output 1525. As would be expected, high pileup filter 1520 provides the best match, as is evidenced by peak 1522 (i.e., maximum value of high filter output 1525) being higher than maximum values of other filter outputs.

Moderate pileup filter 1530 has a shape similar to moderate pileup profile 820 of FIG. 8. Moderate pileup filter 1530 can be applied to raw histogram 1510 to generate moderate filter output 1535, which has multiple time bins with an appreciable value. The value of the filtered output at a given time bin can be shown at a time that corresponds to the leftmost (first) bin of the filter. This can be done when the rising edge of the pulse is to be detected. Moderate filter output 1535 has a shape that is inverted relative to moderate pileup filter 1530 as the rightmost tap 1531 is the first to overlap with counter 1512. Each movement to the right provides more overlap since the tap filters increase. But, a peak 1532 of moderate filter output 1535 is lower than peak 1522.

Low pileup filter 1540 has a shape similar to low pileup profile 810 of FIG. 8, which is similar to the emitted pulse that is 5 time bins. Low pileup filter 1540 can be applied to across raw histogram 1510 to generate low filter output 1545, which has multiple time bins with an appreciable value. The maximum value in low filter output 1545 is below peak 1522. The peak is hard to identify since the filtered output is flat. But, as will be described later (FIG. 16), an additional filter layer can be applied, e.g., when a first layer is a coarse filter layer. Thus, there are some embodiments that use an initial coarse filter, which may be similar to low pileup filter 1540, and then apply a second level filter to the coarse filter output.

Smeared filter 1550 has a shape that corresponds to a reflected pulse that is longer than the emitted pulse (9 time bins vs. 5 time bins). As with the other filters, smeared filter 1550 can be applied to raw histogram 1510 to generate smeared filter output 1555. This is useful for detecting targets that smear the pulse width in time either due to high angles of incidence to the target or because the target is a diffuse medium like a bush or in an extreme case a patch of fog. Filters 1520, 1530, 1540, and 1550 can each have an anticipated signal profile corresponding to a different digitized signal profile.

As peak 1522 of high filter output 1525 is the global maximum from all of the various filter outputs, time bin 1515 is selected as the temporal location of the reflected pulse. The match filter circuitry may not know that only one time bin had an appreciable value, just that time bin 1515 of high filter output 1525 had the highest value of any of the other filters. If desired, the center of the emitted pulse can be determined using a width of the emitted pulse, e.g., by adding half of the width to the time of time bin 1515.

If the digitized signal had a moderate pileup, then the moderate filter output would have the highest value as the most overlap would occur when the filter overlaps exactly with the raw histogram. And, the peak of the moderate filter output would also be at time bin 1515. Similarly, if the digitized signal had a low pileup, low filter output 1545 would have the highest value, and similar for smeared filter 1550 for a smeared digitized signal.

To ensure the global maximum value corresponding to the peak of the correct filter output, the power of the various filters can be normalized. For example, as shown, the one tap in high pileup filter 1520 has a higher value than any of the other filters. Similarly, the highest tap in moderate pileup filter 1530 is higher than the taps in low pileup filter 1540, which are higher than the taps in smeared filter 1550. In some embodiments, the root mean square of each set of filter taps is equivalent. In another embodiment, the total integrated area of each filter can be equivalent, thereby forcing the values to decrease when more taps are added.

Accordingly, before comparing the individual filtered signals, these individual signals can be normalized. In one embodiment (as shown), the normalized comparison is done by performing a cross-correlation (matched filter) using normalized filters. To create a normalized filter, the root mean square of each set of filter taps can be calculated, and then entire filter is divided by the square root of the energy. Other functions besides a square root can be used.

In other embodiments, the normalized comparison is done by first applying the non-normalized filter and then dividing the result (i.e., the filter output) by the square root of the filter energy. This latter embodiment can be computationally simpler. After the normalized comparison of the multiple filtered signals, the largest value corresponds to a best match. In this way, according to the present embodiments, information about the nature of the reflecting surface can be obtained (e.g., an angle of a surface, how reflective, and relative velocity of object).

As part of generating a filter output, a sliding step size can be one time bin, as is shown in FIG. 15. In other embodiments, a smaller step size can be used. For example, an overlap value (e.g., from convolving filter with the raw histogram) can be determined every 0.1, 0.2, or 0.5 of a time bin.

B. Application of Profile Filters to Filtered Histogram

In some embodiments, different profile filters can be applied to a filtered signal, e.g., which was generated by an initial coarse filter. Such an initial coarse filter can be applied across a raw histogram to identify sections of the histogram corresponding to a reflected pulse (i.e., distinguishing from background light). The resulting filter output has different profiles for different digitized signal profiles.

1. Comparisons Among Different Profile Filters

Figure 16:
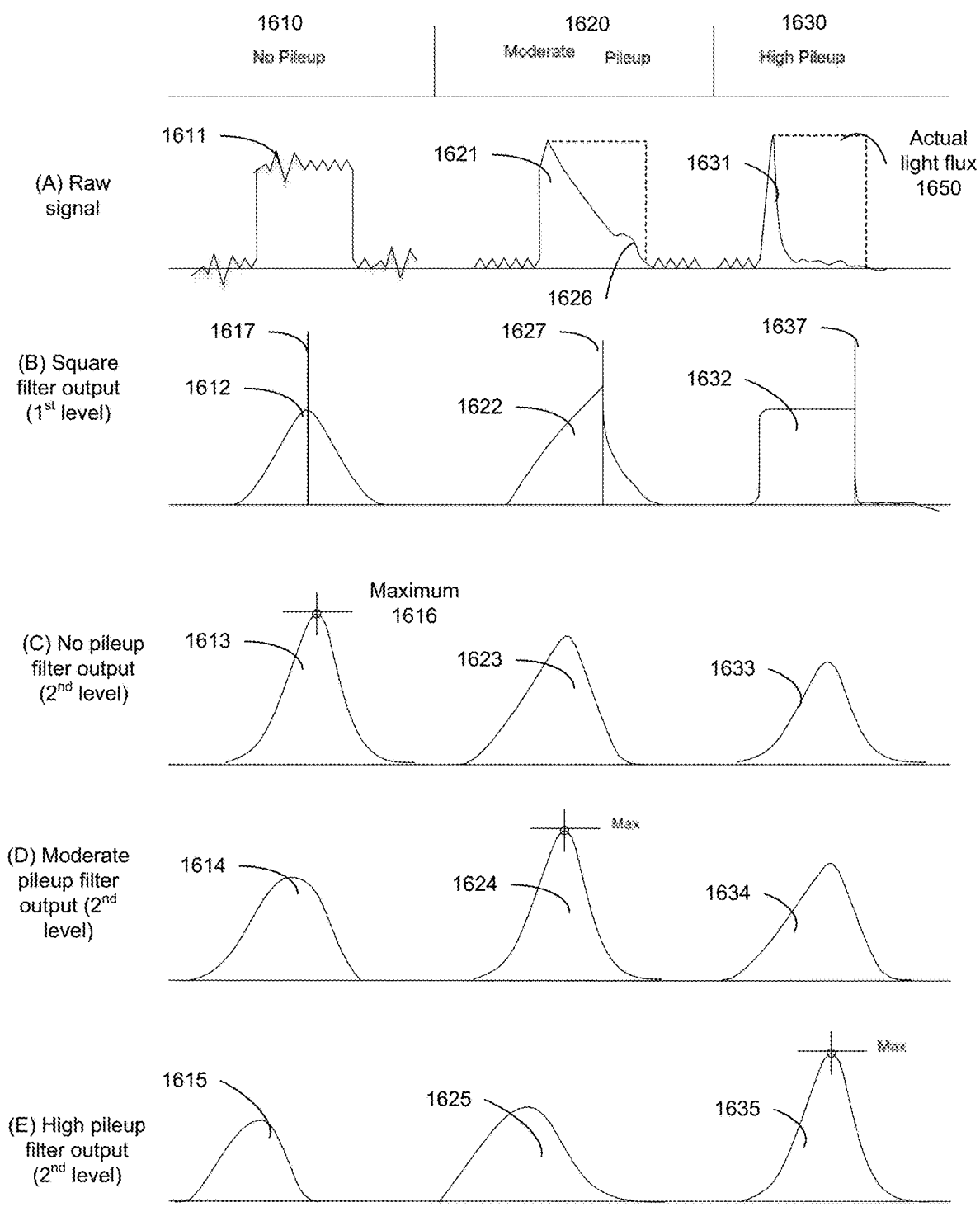
FIG. 16 shows the application of different second-level profile filters to a filtered output from a first-level filter according to embodiments of the present invention.

FIG. 16 shows the application of different second-level profile filters to a filtered output from a first-level filter according to embodiments of the present invention. FIG. 16 has three columns and five rows. The three columns are no pileup 1610, moderate pileup 1620, and high pileup 1630. The rows correspond to: (A) the raw histogram, (B) a coarse filter output (e.g., from a single square filter) that is applied at a first filter level, (C) no pileup filter output that is applied at a second filter level, (D) moderate pileup filter output that is applied at the second filter level, and (E) high pileup filter output that is applied at the second filter level.

A no pileup signal 1611, a moderate pileup signal 1621, and a high pileup signal 1631 respectively correspond to low pileup profile 810, moderate pileup profile 820, and high pileup profile 830. The actual light flux 1650 on the pixel is the square pulse that is shown in dashed lines In FIG. 16, a single square filter is applied to each of the raw histograms. The square filter can have a width of the emitted pulse. This square filter can be considered coarse in that it is applied at a first level (i.e., apply directly to the raw histogram) and the resolution may be the size of a single time bin (e.g., sliding steps are one time bin). The different filter outputs result from the different raw histogram inputs. The filter outputs are determined by determining an overlap of the square filter and the signal for different positions of the square filter.

A coarse no pileup filter output 1612 has a triangular shape, e.g., similar to final filtered output 990 of FIG. 9. The horizontal axis on the filtered histogram corresponds to a given position of the square filter. But, the actual temporal position of filter output 1612 relative to no pileup signal 1611 does not necessarily relate to their relative positions on the horizontal axis. If the filter output is generated to detect a rising edge of the reflected pulse (e.g., filtered value at a time bin corresponds to a leftmost position of the filter), the peak of filter output 1612 would correspond to the rising edge of no pileup signal 1611. Further, the width of filter output 1612 is a larger than the width of the no pileup signal 1611 (e.g., 9 bins vs. 5 bins). Thus, the scales on the horizontal axis are different for the two plots, although line 1617 can correspond with a center of the detected pulse when a value of a time bin is keyed off a center of the coarse filter, as in FIG. 9.

A coarse moderate pileup filter output 1622 increases with each time step for a first portion, e.g., similar to moderate filter output 1535. The decrease at time 1627 (e.g., corresponding to center of detected pulse) can result from the leading edge of the square filter passing the peak in moderate pileup signal 1621.

A coarse high pileup filter output 1632 resembles a square pulse, e.g., similar to low pileup filter output 1545, as the square filter can be considered a low pileup filter at this first level. High pileup signal 1631 can be approximated as a single time bin having an appreciable value above a threshold, similar to raw histogram 1510. Line 1637 illustrates the ambiguity associated with a flat top filter response. The maximum of the filter response could easily occur anywhere along the flat top of coarse high pileup filter output 1632 with the addition of noise.

Rows C-E correspond to second-level filters being applied to the square filter outputs in row B. Each row corresponds to a different second-level filter being applied to the respective square filter output in row B. The three different second-level filters have profiles that roughly correspond to the profiles of the outputs in row B. Thus, the second-level filters can be considered to be different profile filters having profiles shown in row B. The second-level filter that corresponds to the underlying digitized signal (i.e., by being a similar shape to the corresponding filter output) will provide the best match, and thus be used to determine the received time.

In row C, the profile filter output 1613 is generated by applying a no pileup profile filter to filter output 1612. In this example, the no pileup profile filter is similar in shape to filter output 1612 itself (although more of an exponential rise and decay, e.g., Gaussian), and not to low pileup filter 1540. These profile filters differ as they are applied at different levels: one applied directly to the raw histogram and the other applied to a first-level filter output. As filter output 1612 is essentially convolved with itself, profile filter output 1613 is symmetric and can have a peak in essentially the same time as filter output 1612.

Profile filter output 1623 is generated by applying the no pileup profile filter (essentially filter output 1612) to coarse moderate filter output 1622. The asymmetric shape of coarse moderate filter output 1622 causes an asymmetric shape in profile filter output 1623. And, since the no pileup profile filter does not exactly match coarse moderate filter output 1622, the peak of profile filter output 1623 is less than a maximum 1616 of profile filter output 1613.

Profile filter output 1633 is generated by applying the no pileup profile filter to coarse high pileup filter output 1632. The generally symmetric shape of coarse high pileup filter output 1632 provides a symmetric shape in profile filter output 1633. And, since the no pileup profile filter does not exactly match coarse high pileup filter output 1632, the peak of profile filter output 1633 is less than the maximum 1616.

In row D, the moderate pileup profile filter is applied to the various filter outputs in row B. The moderate pileup profile filter has a similar shape to coarse moderate filter output 1622. Thus, filter output 1624 has a maximum value relative to filter output 1614 (no pileup) and filter output 1634 (high pileup).

In row E, the high pileup profile filter is applied to the various filter outputs in row B. The high pileup profile filter has a similar shape to coarse high pileup filter output 1632 (i.e., essentially a square filter). Thus, filter output 1635 has a maximum value relative to filter output 1615 (no pileup) and moderate output 1625 (moderate pileup).

2. Max Window Finder—Moderate Pileup Example

In some embodiments, the first-level filter can identify a particular window for performing the second-level filtering. The first level filter can be applied across the entire raw histogram, as it is not known exactly where the reflected pulse will be detected. A location of a maximum of the filter output can be identified, and a window around that maximum can be analyzed using the profile filters of the second level. Savings in memory, time, and computational effort can be saved by applying the profile filters only in this maximum window. Accordingly, by applying each of these filters to the maximum window result and comparing them to find which one has the highest value, one can find which pileup scenario best approximates the true signal.

Figure 17:
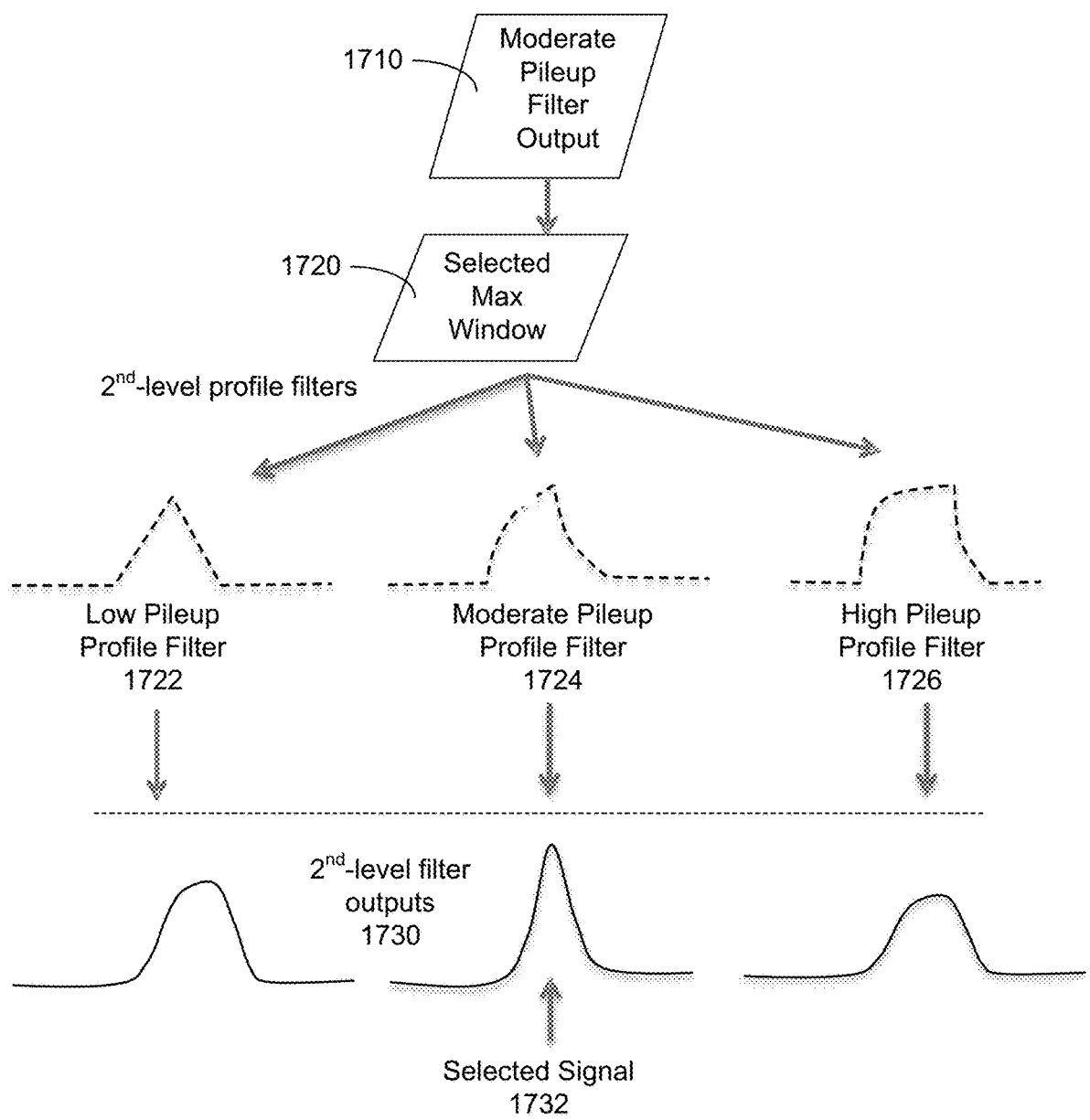
FIG. 17 is a diagram illustrating a process flow using two levels of filters applied to a moderate pileup signal according to embodiments of the present invention.

FIG. 17 is a diagram illustrating a process flow using two levels of filters applied to a moderate pileup signal according to embodiments of the present invention. A first-level filter (e.g., a square filter) can be applied to a moderate pileup signal to obtain a moderate pileup filter output 1710, which may look like coarse moderate filter output 1622. As part of obtaining moderate pileup filter output 1710, the first-level filter can be slid across the raw histogram, and a maximum in the filter output can be identified. A window around this maximum can be selected, where the window would include the relevant portion of moderate pileup filter output 1710, thereby obtaining selected max window 1720.

Once max window 1720 is selected, a plurality of second-level profile filters can be selected. Which second-level profile filters are selected can depend on properties of the filtered output (e.g., pattern of non-zero values, such as its width), as well as properties of the first-level filter used (e.g., pattern of non-zero values, such as its width). The selected second-level profile filters can then be applied to the filter output data within selected max window 1720.

In this example, three second-level profile filters 1722-1726 are selected, e.g., to correspond to anticipated signal profiles, or more precisely to the filtered outputs for such signal profiles. Low pileup profile filter 1722 provides the leftmost second-level filter output, moderate pileup profile filter 1724 provides the middle second-level filter output, and high pileup profile filter 1726 provides the rightmost second-level filter output. As the original raw histogram has a moderate pileup and selected max window 1720, a selected signal 1732 will be the middle second-level output.

In some embodiments, more than one profile filter can be selected for a given shape. For example, multiple moderate pileup profile filters can be used, each having a slight variation from each other, depending on when a rising edge of the reflected pulse is received within a time bin. Such a set of profile filters can effectively interpolate the detected raw histogram to identify a received time of the reflected pulse at a resolution finer than the width of a time bin. The next section provides further details on such interpolation.

C. Interpolation

In some embodiments, an interpolator performs interpolation between the histogram bins. Digital interpolation is commonly done by zero filling and applying a finite impulse response (FIR) or infinite impulse response (IIR) filter to the data. In other implementations, a more precise and economical scheme is used. In these embodiments the interpolator uses prior knowledge of the signal shape as identified according to the above. Thus, the interpolator can apply many matched filters, each of which corresponding with an interpolation offset of less than 1 histogram bin. As an exemplary implementation, the interpolator does this by applying 10 different matched filters per profile, each of which corresponds with a different interpolation offset.

Accordingly, a block in a digital signal processor (DSP) scheme can include an interpolator, which can use interpolation filters. The interpolation filters can be first-level filters or second-level filters. The interpolation filters can provide information about a received time of a detected pulse with greater precision than the width of a time bin.

As an example of interpolation, assume that a rising edge of a square reflected pulse arrives exactly in the middle of a time bin (e.g., 500 ps into a one-nanosecond time bin), where the detected pulse is 3 ns wide. Since the rising edge arrived halfway through the time bin, about half as much photon flux will be detected in that first time bin than in the next two time bins. A fourth time bin will also have about half as much flux detected since the falling edge will land halfway through the fourth time bin. Thus, the raw histogram might have four values {5, 10, 10, 5} in the four consecutive time bins. The '10' indicates that full light flux was detected in that bin, and the '5' indicates that half of the full flux is detected in that bin.

The ratio of the values in the leading and trailing bins can be used to determine the location of the rising edge. For example, if the leading bin had a value of 4 and the training bin had a value of 6, then the rising edge would be at 600 ps into the leading bin (e.g., 100.6 ns). In practice, the specific values of the raw histogram may not have such ideal value, e.g., due to noise and a stochastic nature of the detection process. Accordingly, instead of computing such a ratio, different interpolation filters can be used. For example, if the leading bin is between 100 ns and 101 ns, there can be an interpolation filter for 100.1 ns, 100.2 ns, 100.3 ns, and so on. In such an example, the best matched filter can identify the received time to within 100 ps. Such interpolation filters can perform fixed point multiplications of more bits than used for a coarse filter when the interpolation filter is applied as a second-level filter.

Different sets of interpolation filters can be used for different profiles. For example, one set of interpolation filters can be used for high pileup profiles, and a different set of interpolation filters can be used for a moderate pileup profile, and so on. Each interpolation filter in a set can have a slightly different profile that takes into account the slight quantization shifts in pulse profile as the filter slide in time. To interpolate by 10× (e.g., 0.1 accuracy when width of time bin is 1), 10 interpolation filters can be used. In the simple case of a 2-bin rectangular pulse (e.g., high pile-up profile), the interpolation filters can be (10,0), (9,1), (8,2), (7,3), (6,4), (5,5), (4,6), (3,7), (2,8), (1,9). Each of these interpolation filters can be applied to the signal to identify the one that fits best to get the interpolated range down to 1/10th of a bin. The skilled person will appreciate the application of such interpolation filters to pulses of more than two time bins, as well as more complex pulse shapes and lengths. Further, successive pulses trains (e.g., successive ones of a same pulse pattern) can be offset (e.g., staggered by 1/10th of a bin) from each other to ensure than the raw histogram occupies more than one time bin, as is described in more detail in a later section.

1. Application of Interpolation Filters to Raw Histogram

Figure 18:
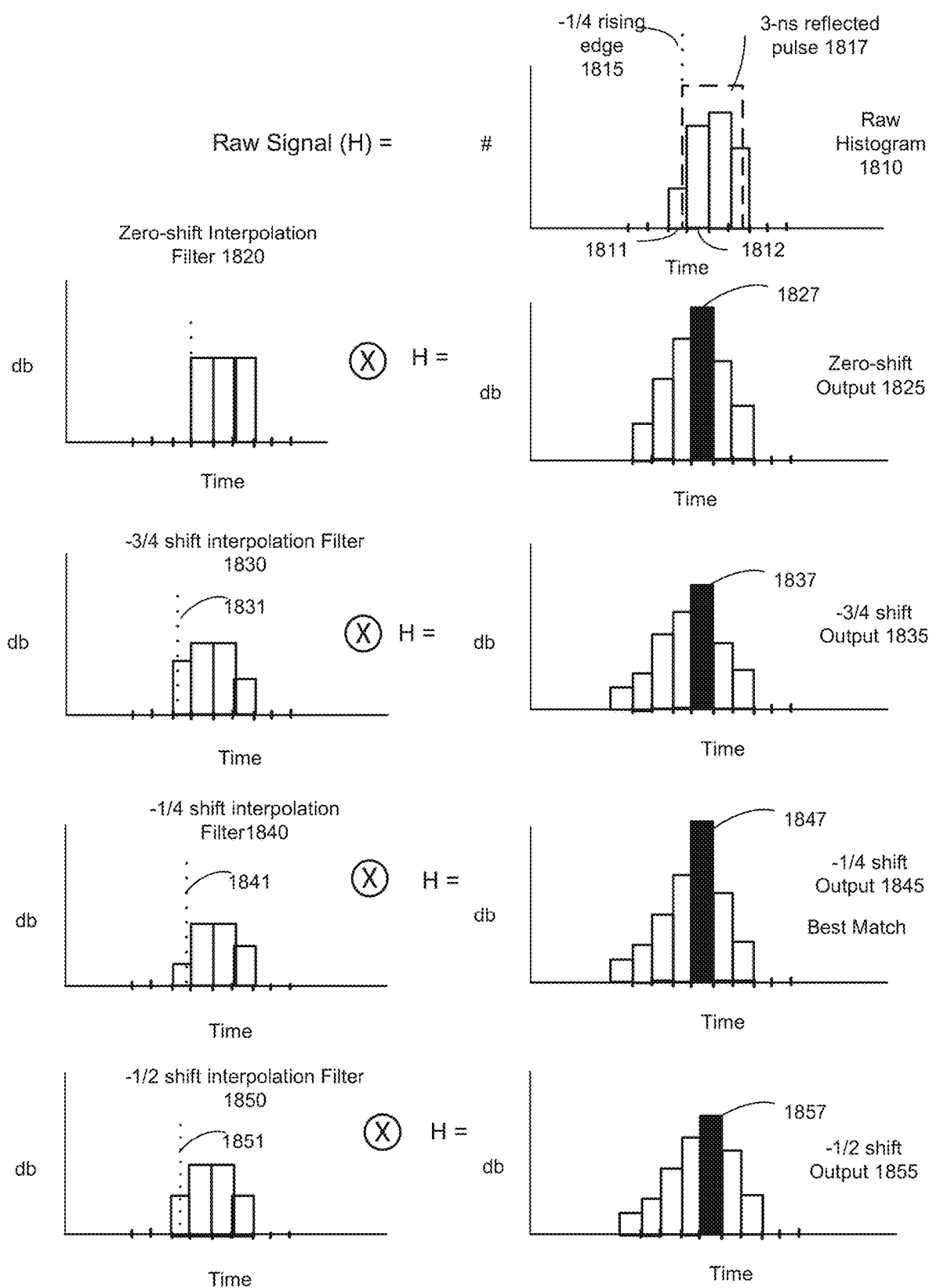
FIG. 18 shows the application of different interpolation filters to a raw histogram according to embodiments of the present invention.

FIG. 18 shows the application of different interpolation filters to a raw histogram according to embodiments of the present invention. FIG. 18 shows four interpolation filters applied to raw histogram 1810, which is generated in response to a 3-ns reflected pulse 1817. Raw histogram 1810 (labeled as H) has a rising edge 1815 that is shifted by −¼ of a time bin relative to time bin 1812. Each of the interpolation filters can have a different pattern of values in corresponding time bins to provide interpolation, e.g., a different pattern of non-zero values.

The zero-shift interpolation filter 1820 comprises three taps with the same value. Zero-shift interpolation filter 1820 is convolved with H to provide zero-shift output 1825. The convolution process can provide J+K−1 time bins with an appreciable value, where J is the number of taps of the interpolation filters and K is the number of time bins of the raw histogram that an appreciable value (e.g., above a background threshold).

At each time step, a convolution (e.g., an overlap) can be determined between the two profiles, and the resulting value can be used for the time bin corresponding to the position of the first interpolation tap. In this example, a peak 1827 occurs when the leftmost interpolation tap coincides with time bin 1812, as these three time bins have higher values than time bin 1811.

The −¾ shift interpolation filter 1830 has a higher leading tap than a trailing tap as the ¾ of the time bin would include a reflected pulse with a rising edge 1831. The convolution provides filtered output 1835 with peak 1837, which is lower than peak 1827, since a zero-shift is closer to the actual shift of −¼ than the −¾ shift is.

The −¼ shift interpolation filter 1840 has a lower leading tap than the trailing tap as ¼ of the time bin would include the reflected pulse with a rising edge 1841. The convolution provides filtered output 1845 with peak 1847, which is the highest of all the filtered outputs since a −¼ shift is the same as the actual shift of rising edge 1815.

The −½ shift interpolation filter 1850 has an equal leading tap and trailing tap as ½ of each corresponding time includes the reflected pulse when it has a rising edge 1851. The convolution provides filtered output 1855 with peak 1857, which is about equal to peak 1857, since a zero-shift is the same distance from the actual shift of −¼ than a zero shift.

The example of FIG. 18 assumed a no pileup filter, but the particular profile may not be known. In such a case, various profile filters can be applied to the raw histogram, with each profile having a different width. These profile filters can each be coarse filters, as the purpose of this first stage is to identify which profile best matches the digitized signal. Such different profile filters or their output can be normalized, as described herein. Depending on which profile filter best matches, then interpolation filters of that type (e.g., high pileup) can then be applied in an interpolation stage. The initial coarse filter having a best match can be one of the set of interpolation filters, e.g., corresponding to a particular shift in the rising edge (e.g., a zero shift for a square coarse filter).

Applying the interpolation filters to the raw histogram can be more effective at detecting a signal within noise than applying to a filter output (e.g., interpolation filters being second-level filters) because the filters can better match the variety of signal shapes in the histogram, but it can be computationally expensive, as the location of the pulse may not be known. In such an instance, each of the interpolation filters could be applied across the whole raw histogram. However, in one implementation, the peak location of a first interpolation could be used to specify where the other interpolation filters should be applied. In other embodiments, one or more coarse filter profiles can first be applied (e.g., as described herein) to achieve much of the benefit of running the interpolation filters on the raw histogram, which can be used to find a window around the reflected pulse, and then the interpolation filters can be applied.

2. Application to Filtered Histogram

In some embodiments, the interpolation filters can be applied to a filter output, as opposed to being applied directly to the raw histogram. For example, referring back to FIG. 16, when the second-level filters are applied to provide the various second-level filter outputs, more than one second-level filter can be applied. Accordingly, there may be more than one high pileup second level filter. In FIG. 16, the high pileup second-level filter nominally resembles coarse high pileup filter output 1632. But, instead of a single square filter, multiple (e.g., 10) interpolation filters can be used, each having a different profile that corresponds to a different position of the rising edge of the reflected pulse, e.g., similar to FIG. 18. The number of interpolated pulses can depend on the accuracy desired.

Accordingly, if a raw high pileup signal had one time bin with a large value, but a next time bin with a smaller but significant value (e.g., as a result of the rising edge of a strong pulse arriving near then end of the first time bin), then the filtered output would not be perfectly square. For example, for a 5-bin square filter, there would be four time bins of equal height, with two smaller time bins on each side—with the left most time bin being larger than farthest right time bin, since the raw histogram had a larger first bin. If one just used a 5-bin square filter as the second level filter, the maximum would seem to be the same as the example of just one time bin having an appreciable value (i.e., next time bin is essentially zero, e.g., less than background), which would not be as accurate as using multiple interpolation filters.

The interpolation filters can use 6 taps, with the first and last boxes different, e.g., so the filtered output would match exactly to the best matching interpolated filter, within a specified resolution. For example, using 20 interpolation filters of different combinations for the first and the last tap can provide an accuracy of 50 ps. The maximum would be slightly shifted depending on the relative ratio of the two time bins in the raw histogram; calculating such a ratio is another way to determine the position of the rising edge, i.e., once the coarse filter has been used to identify the part of the raw histogram to analyze.

In some embodiments, a single second-level profile filter can be used for each of the profiles, e.g., the 3 profiles shown in FIG. 16. The profile filter that provides the maximum value can then be used to select the corresponding interpolation filters to use, e.g., in a similar manner as an initial coarse filter can be used to select which interpolation filters are applied to the raw histogram, but here the interpolation filters (corresponding to the best match coarse filter) are second-level filters. Accordingly, not all of the interpolation filters for each profile need to be used.

3. Selecting Filters

As mentioned in the last section, as an alternative to applying all interpolator filter profiles to the measured histogram in all measurements, only specific interpolation filters are used. As certain interpolation filters are associated with certain coarse filters or collectively belong to a set, a best match of one filter can be used to select which interpolation (or additional interpolation) filters to use. In various implementations, these interpolation filters can be selected when they correspond to, e.g., best match coarse filter, top N best matching coarse filters (e.g., 2 or more), a best matching interpolation filter that is representative of a particular set (e.g., high pileup interpolation set), best N matching interpolation filters, or any filter than matches above a threshold.

In other implementations, a set of interpolation filters can be selected based on measurement results, such as a maximum value in the raw histogram and/or a maximum value in the filter output. As one example, by comparing the ratio of these two numbers, it is possible to determine a threshold that reliably identifies certain levels of pileup. For instance, if the maximum value in the raw histogram is equal to the maximum value output of a multi-tap coarse filter, this can indicate very strong pileup as all of the optical energy is contained in a single histogram bin. This simple ratio method is a computationally efficient alternative method for selecting which interpolation filter to apply.

In other embodiments using a maximum value of a filter output as a selecting criterion, an additional check can be implemented. For example, if there are multiple SPADs per pixel, and most of them fire, the system can assume that pileup has occurred. The degree of pileup (related to maximum in raw histogram) can be directly correlated with the number of photons detected. To take advantage of this relationship, a threshold or multiple thresholds on the maximum in the raw histogram or the coarse filter output can determine which pileup profiles to use.

For instance, a maximum above a first threshold can indicate that just high pileup interpolation filters should be used. A maximum below the first threshold can indicate that low and moderate (medium) pileup interpolation filters should be used. A second threshold can indicate usage of moderate and high pileup interpolation filters when a maximum is above the second threshold and indicate usage of low pileup interpolation filter when below. The values for these thresholds may be determined based on a current operating setpoint of the device in addition to static or real-time knowledge about the environment in which the sensor is operating.

4. Variations

Interpolation can be performed in additional ways. For example, a distribution function (e.g., Gaussian) could have a width similar to the width of the filtered output (or the raw histogram depending on when interpolation is performed). Moving this distribution function slowly (e.g., 100 ps steps) would provide an approximation of the center of the raw histogram or of the filtered histogram. This would not require 10 tap filters for each profile, but may require more than one filter value per nanosecond. Such distributions could be symmetric or asymmetric, e.g., having different profiles within them. Different widths of distributions could be used, which may provide a benefit over using multiple tap filters with different patterns for a single profile.

D. Combination of Multiple Coarse Filters and Interpolation Filters

As described above, a coarse filter can be applied to the raw histogram to provide a filter output, and interpolation filters having a best match profile can be applied to the filter output. In some embodiments, multiple coarse filters can be applied, and interpolation filters corresponding to the best match can be used. As the interpolation filters correspond to the best match profile, they can be part of digital signal processing (DSP) scheme devised to identify the type of pileup and thereby more precisely identify the range and nature of objects in the scene.

Figure 19:
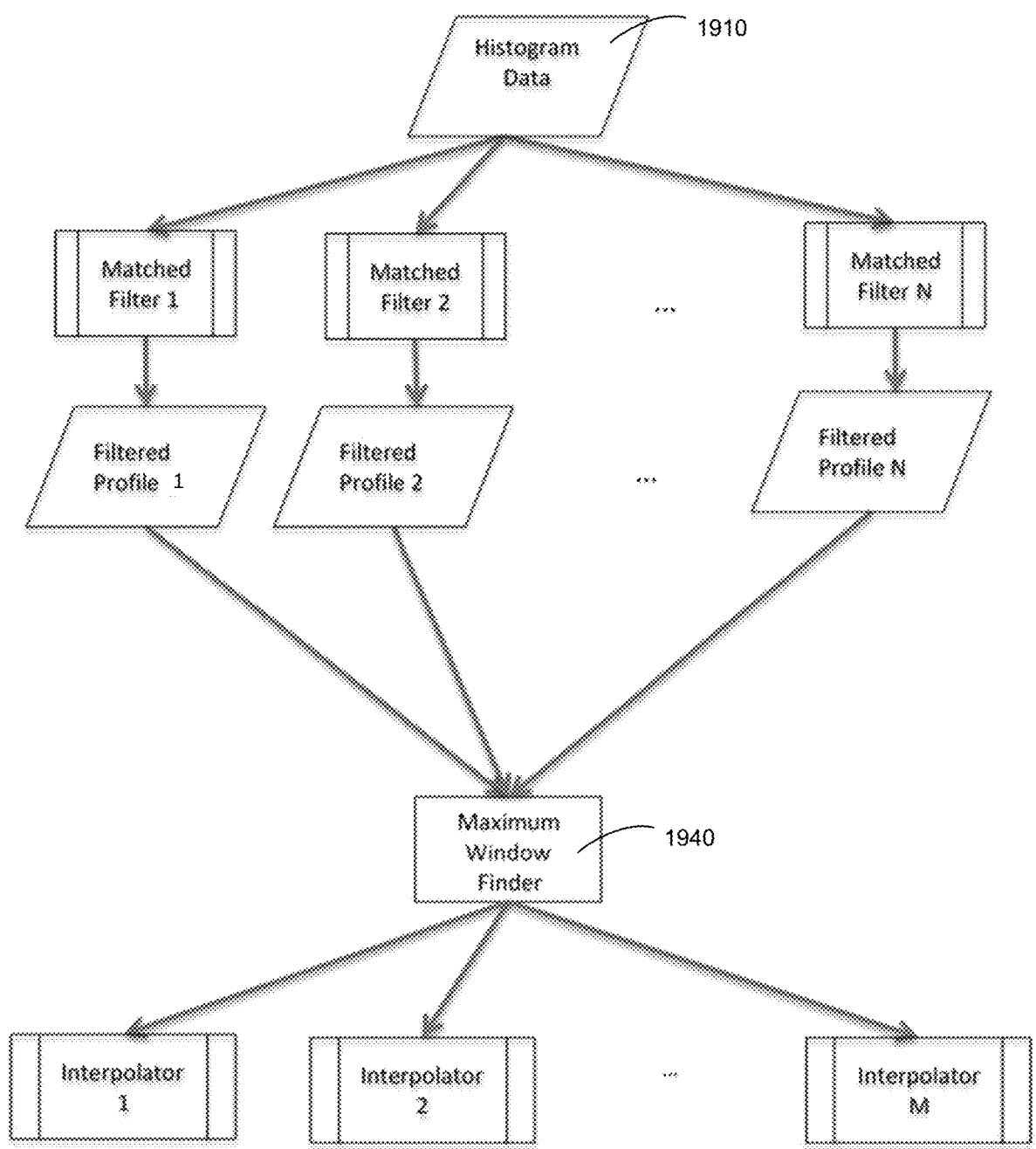
FIG. 19 is a diagram illustrating a two-level filtering scheme using multiple coarse filters according to embodiments of the present invention.

FIG. 19 is a diagram illustrating a two-level filtering scheme using multiple coarse filters according to embodiments of the present invention. Histogram data 1910 corresponds to a raw histogram, which may be determined using multiple pulse trains.

According to some embodiments, to estimate the shape of the digitized signal, multiple matched coarse filters are first applied to the raw histogram, labeled as matched filters 1-N in FIG. 19. Each of these coarse filters can provide a filter output, labeled as filtered profiles 1-N. In some embodiment, a Barker code matched filter is applied. This filter uses Barker code as filter taps and performs a cross correlation of the raw histogram with these taps. There may be N different matched filters according to the present embodiment. Accordingly, the histogram data from each measurement can be filtered with N different matched filters. The number of coarse filters can correspond to the number of different profiles expected or possible in a given environment (e.g., based on types of objects) and based on the profile shapes from the light sensing module.

In the next step, a maximum window finder 1940 can identify the maximum value of the matched filtered output signal. A window of values around that index can be saved. If multiple coarse matched filters are used, only the normalized matched filter with the maximum value is considered. The coarse matched filter with the maximum value is recorded.

The max window is passed to an interpolator to perform fine interpolation. The interpolation filters to be used are determined by the coarse matched filter that had the maximum value. Therefore, there may be a total of N*M interpolator filters, where N is the number of coarse matched filters applied to each measurement, and M is the number of fine interpolation filters for each coarse filter. In various embodiments, the interpolation filters can be applied to the raw histogram or to the filtered profile corresponding to the beast match.

E. Coded Pulses and Profile Filters

Matched filters (including different profile filters) can also be used in combination with the coded pulses described in previous sections. Below is an example for a coarse filter that has a tap pattern matching a pulse pattern. And, operation of a max window finder is also described.

1. Coarse Filter

Figure 20:
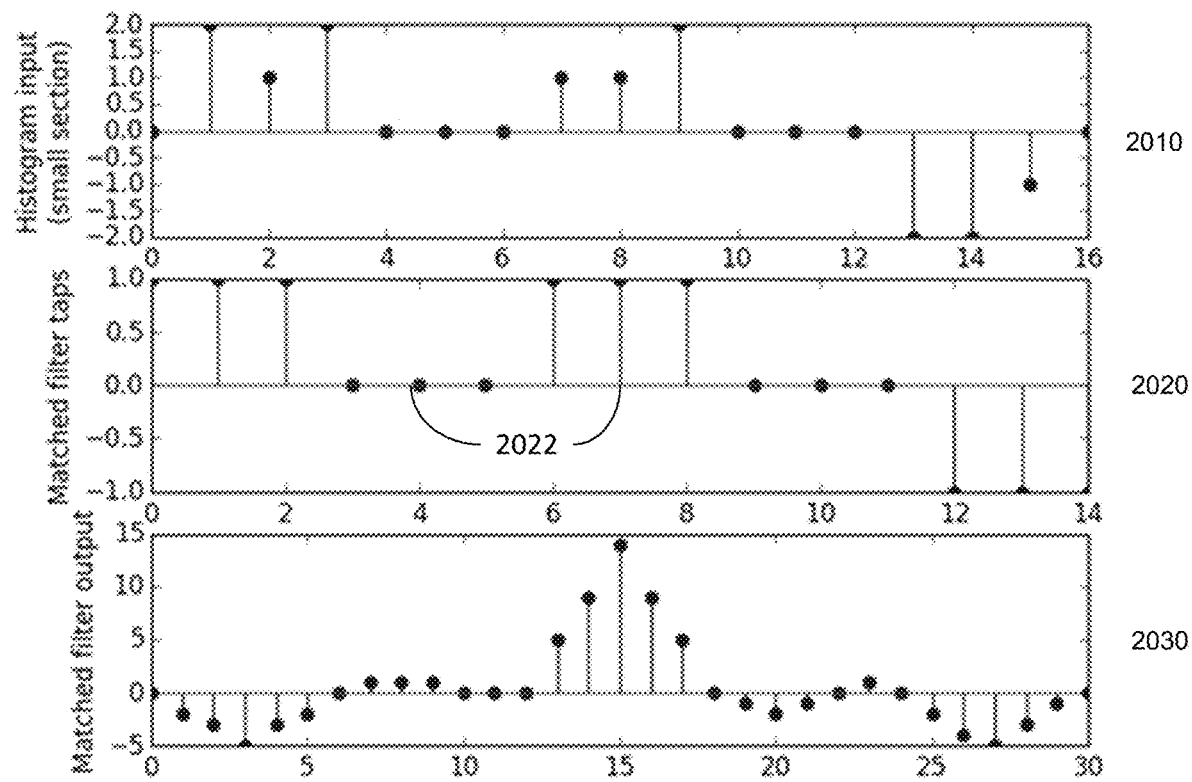
FIG. 20 shows a raw histogram resulting from coded pulses, a matched filter, and the corresponding filter output according to embodiments of the present invention.

FIG. 20 shows a raw histogram resulting from coded pulses, a matched filter, and the corresponding filter output according to embodiments of the present invention. Raw histogram 2010 represents the case of no or low pileup, but with some noise. Raw histogram 2010 has a {+1, +1, −1} pattern corresponding with a Barker code of length 3. The values in the various time bins from 0-16 are values between −2 and 2. The negative values can be achieved by assigning a negative weight to pulses detected during a particular portion of detection intervals. In the example shown, raw histogram 2010 only has integer values, i.e., −2, −1, 0, 1, or 2.

Matched filter 2020 has filter taps that match the expected pulse pattern {+1 +1 −1}. However, the taps only have values of +1, 0, and −1. Matched filter 2020 has one tap 2022 for each time bin. A cross correlation is performed between the histogram input data and filter taps 2022. Matched filter 2020 can constitute a coarse filter.

Filter output 2030 shows the cross-correlation of the input signal (raw histogram 2010) and filter taps 2022, thereby obtaining a coarse filtered signal. As can be seen in filter output 2030, there is a central positive peak in the cross correlation function. This combines all of the power from all three pulses of the histogram into a single large pulse. In addition, the cross-correlation of the input histogram with the matched filter yields a triangular shape as seen in filter output 2030. The scale on the vertical axis of filter output 2030 illustrates the cross-correlation aspect by essentially providing a sum of the data values in the time bins of raw histogram 2010 when matched filter 2020 is at a sliding time step that matches exactly with the pattern of raw histogram 2010.

In some embodiments, the cross correlation can be performed without floating point operations when the values of raw histogram 2010 and matched filter 2020 are integers. Fixed point modifications can be used, which are more efficient. And, in this example, since matched filter 2020 has only values of −1, 0, or +1. As the coarse filter can be applied across an entire histogram (e.g., 1,000 time bins), it can be important to have efficient implementation of this first-level filter.

Such a coarse filter allows identifying where the signal is on a rough scale. This can be useful when not sending out a single laser pulse as such additional pulses could otherwise increase computational requirements. Application of the matched filter can recombine the pulses into a single signal corresponding to the peak at time bin 15 in filter output 2030.

FIG. 20 illustrates a benefit of using coded pulse. Raw histogram 2010 is a pretty weak signal, e.g., by values in time bins not being large and by variations due to noise. When the matched filter precisely matches the histogram input, the resulting signal gets much stronger, as evidenced by the clear maximum in filter output 2030. And, the side lobes are negative, which is a property of Barker codes.

2. Max Window Finder

A shown in FIG. 19, a next block in a DSP scheme can be a maximum window finder. A purpose of this block is to find the maximum of the filter output and save the values around this maximum for interpolation and/or application of different profile filters. The maximum window finder can identify the maximum in each matched filter and determine the global maximum from the individual maximums.

In some embodiments, to compare different filter outputs, the matched filter can be normalized, e.g., as described herein. For example, the normalization can divide an individual maximum value by the number of taps. This can provide an average power that was captured in the matched filter and can reduce the likelihood that a filter with more taps is improperly chosen over a filter with fewer taps even when the filter with fewer taps is a better match to the input shape. In embodiments where filter outputs are directly compared to each other, the filter power of each of the filters profiles can be normalized so that the comparison is unbiased.

Figure 21:
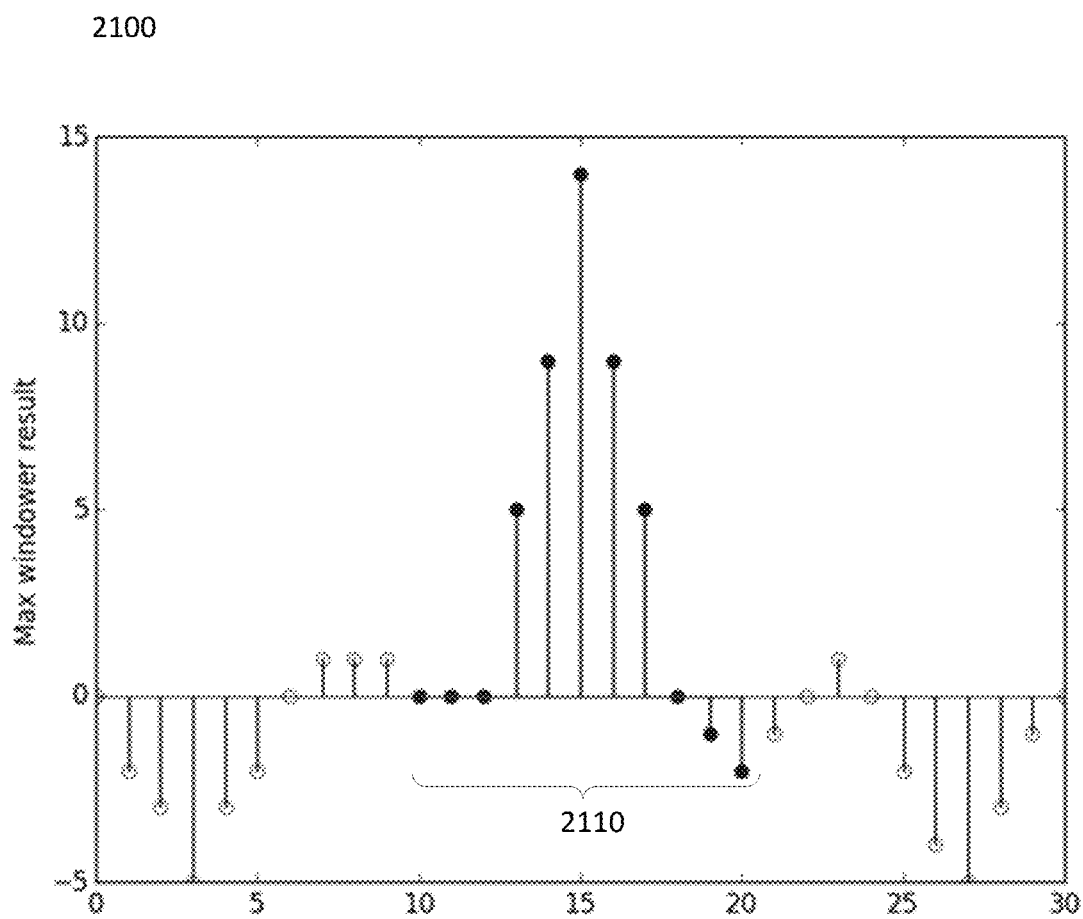
FIG. 21 shows a max windower result according to embodiments of the present invention.

FIG. 21 shows a max windower result 2100 according to embodiments of the present invention. The maximum value is found at time bin (index) 15, and a window 2110 of 11 values is saved around the maximum index. These 11 values can be saved and used in second-level filtering, which can involve interpolation and/or different profile filters. For example, a low pileup profile filter, a moderate pileup profile filter, and a high pileup profile filter can be applied to the 11 values in the time bins of window 2110. A best match of these profile filters can then be used to select a set of interpolation filters for identifying a received time at a resolution greater than one time bin, as is described herein. In this manner, performing a fine interpolation on these 11 values is computationally much cheaper and faster, than having used a full set of interpolation filters (possibly for different profiles) to the entire raw histogram. The values of the interpolator filter taps can be any real value instead of being limited to only values of +1, 0, and −1.

3. Multiple Coarse Profile Filters for Different Objects

Using the techniques explained in herein can make a LIDAR system more effective to detect certain objects. For instance, street signs are known to have strong reflections. This might cause high pileup in a sensor composed of SPADs. Using proper matched filter and corresponding interpolation can greatly improve the detection and proper range estimation of such surfaces. Likewise, radiation reflection from a slanted surface could be smeared and spread, which can also be better detected and have better estimated range by such embodiments.

Figure 22:
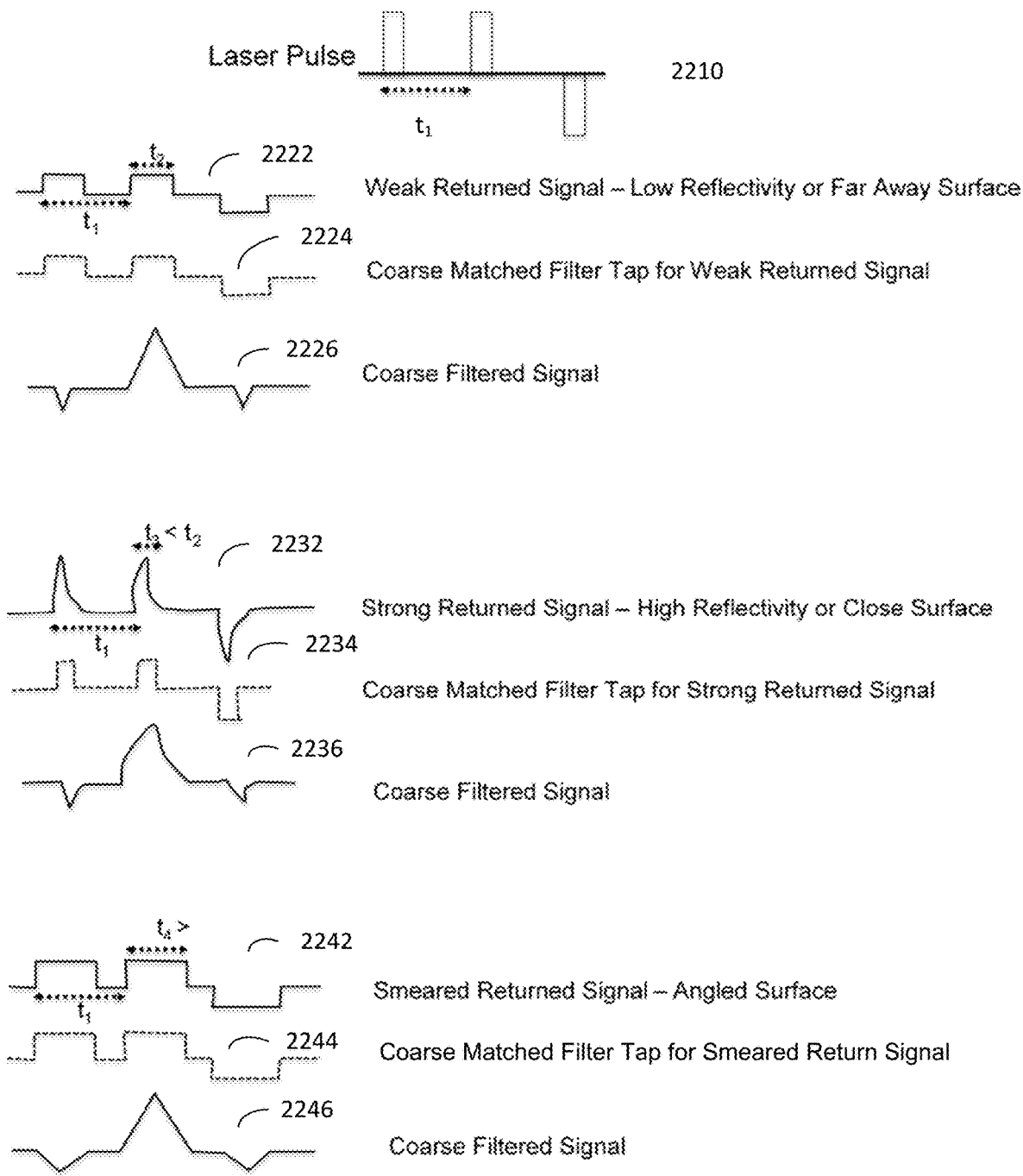
FIG. 22 shows an application of multiple coarse profile filters having different widths according to embodiments of the present invention.

FIG. 22 shows an application of multiple coarse profile filters having different widths according to embodiments of the present invention. The outputs of the different coarse profiles can be used to identify which second-level filters to use. FIG. 22 schematically shows specific scenarios corresponding to reflection of the laser pulse from three different types of surface and the corresponding processing according to the present embodiments. As shown, each of the coarse profile filters has a different number of consecutive time bins having non-zero values.

In FIG. 22, consecutive laser pulses in pulse train 2210 are apart by the time interval $t_1$, and they have specific, well-defined pulse shapes. When these pulses are reflected from different surfaces and the reflected signal is measured by the SPADs at a pixel sensor, the resulting detected signals have different profiles depending on the objects they reflect from, even though all of them have the same pitch time $t_1$ in the original pulse train.

Low pileup digitized signal 2222 represents a weak returned signal, which is an indication of reflection from an object far away or a reflection from low reflectivity surface. These two scenarios could be further distinguished by time-of-flight calculation. The reflected signal has a same pitch $t_1$ as pulse train 2210, and has a detected pulse width of $t_2$. A weak matched filter 2224 has a width that corresponds to a weak returned signal. A weak filter output 2226 corresponds the application of weak matched filter 2224 to low pileup digitized signal 2222. The resulting shape is similar to that shown in FIG. 22.

High pileup digitized signal 2232 represents a strong returned signal, which is an indication of reflection from an object close by or a reflection from high reflectivity surface. Once again, these two scenarios could be further distinguished by time-of-flight calculation. The reflected signal has same pitch $t_1$ as pulse train 2210, but a pulse width of $t_3$, which is smaller than $t_2$. This happens due to the large amount of reflected radiation causing a high pileup at the SPAD. As a result, the digitized signal profile out of SPAD has the typical sharp rise and fast decline, which makes the full width at half maximum (FWHM) small. Strong matched filter 2234 has a profile that is suitable for calculating a cross correlation with high pileup digitized signal 2032. A strong filter output 2236 has a distinct peak in the middle of the plot in a similar manner as weak filter output 2226, although with a different shape in the middle.

A smeared digitized signal 2242 represents a smeared returned signal, which is an indication of reflection from an slanted surface with respect to the optical axis of the laser radiation. The reflected signal shares the same pitch $t_1$ as pulse train 2210, and has a pulse width of $t_4$, which is larger than $t_2$. This can happen due to the reflected radiation from a slanted surface arriving at the SPAD over a longer period due to the close edge being closer and the far edge being farther from the detector. As a result, the digitized signal profile out of SPAD is spread out which makes the duration large. Smeared matched filter 2244 has a suitably spread-out profile for calculating a cross correlation with smeared digitized signal 2242. Smeared filter output 2246 has a distinct peak in the middle of the plot, which is more spread out compared with the aforementioned two other cases as shown, but will exhibit a higher peak and a more accurate position estimate than filters 2224 and 2234. Coarse matched filters 2224, 2234, and 2244 can correspond to anticipated signal profiles corresponding to emitted pulse train 2210.

It should be noted that, even though three profiles were discussed here, the techniques of the present embodiments could encompass multiple profiles associated with multiple types of reflection and corresponding scenarios. Any of the interpolation filters described herein can be of various sizes, e.g., up to 17 bins wide. For smeared cases, all 17 might be nonzero.

In some embodiments, such different coarse matched filters 2224, 2234, and 2244 can be used to determine a best match to crossing. The various widths of such filters can be selected based on the widths of the transmitted pulses, and thus can be more or less than the transmitted pulse. The width of the square filter and its best match location can identify a position of a rising edge of the pulse. Stopping at this point may only give 1 ns accuracy, but this can still be better than errors due to using just one coarse profile filter. For higher accuracy, interpolation filters having a similar width as the best matching coarse filter can be used. In some embodiments, the corresponding interpolation filters can be loaded into memory in real-time for application to a current raw histogram.

Reasons for using multiple matched filters can be twofold 1) to get around the nonlinear response of SPADs to varying signal powers and 2) to better detect pulses smeared in the time domain (which corresponds to pulses smeared in the physical domain too, such as highly angled surfaces or diffuse surfaces). An ability to identify smeared pulses is a useful feature to output to the later stages of a LIDAR system or to an end user, e.g., for classifying objects. For instance, a collection of tree-shaped points could be better classified as a tree, if the system was provided information that a trunk has non-smeared points and the canopy has many smeared pulses, indicating diffuse foliage.

In addition, using matched filters tuned for smeared pulses allows highly-angled surfaces (like a road surface) to be detected farther out than a traditional system as the smeared filter captures a higher fraction of the signal energy. This can be important, because pulses that hit the road surface far in front of a car are always hitting at a very high angle and this smears them considerably in time. Without a bank of tuned filters to optimally detect the smeared pulse, the LIDAR system can be limited as to the extent of the road that can adequately be identified. Such detection of objects at a far range can provide a distinct advantage when decisions need to be made by a self-driving vehicle, or simply by an alert system.

As mentioned above, use of multiple first-level (first-stage) coarse filters alone can provide increased accuracy. For instance, a pulse smeared 10× in time but filtered with a nominal filter that is 1× wide will have a filtered peak and a signal-to-noise ratio (SNR) that is 10× lower than the unsmeared pulse. This has a high probability of not being detected correctly and not passed to a second-level filter—random noise spikes could be passed on instead. If a second first-level filter is used in parallel (or serially) with taps tuned to detect a 10× smeared pulse, then the filtered SNR can be reduced from 10× to sqrt(10)×, i.e., only 3.16× lower in SNR than the unsmeared case.

F. System Components

Figure 23:
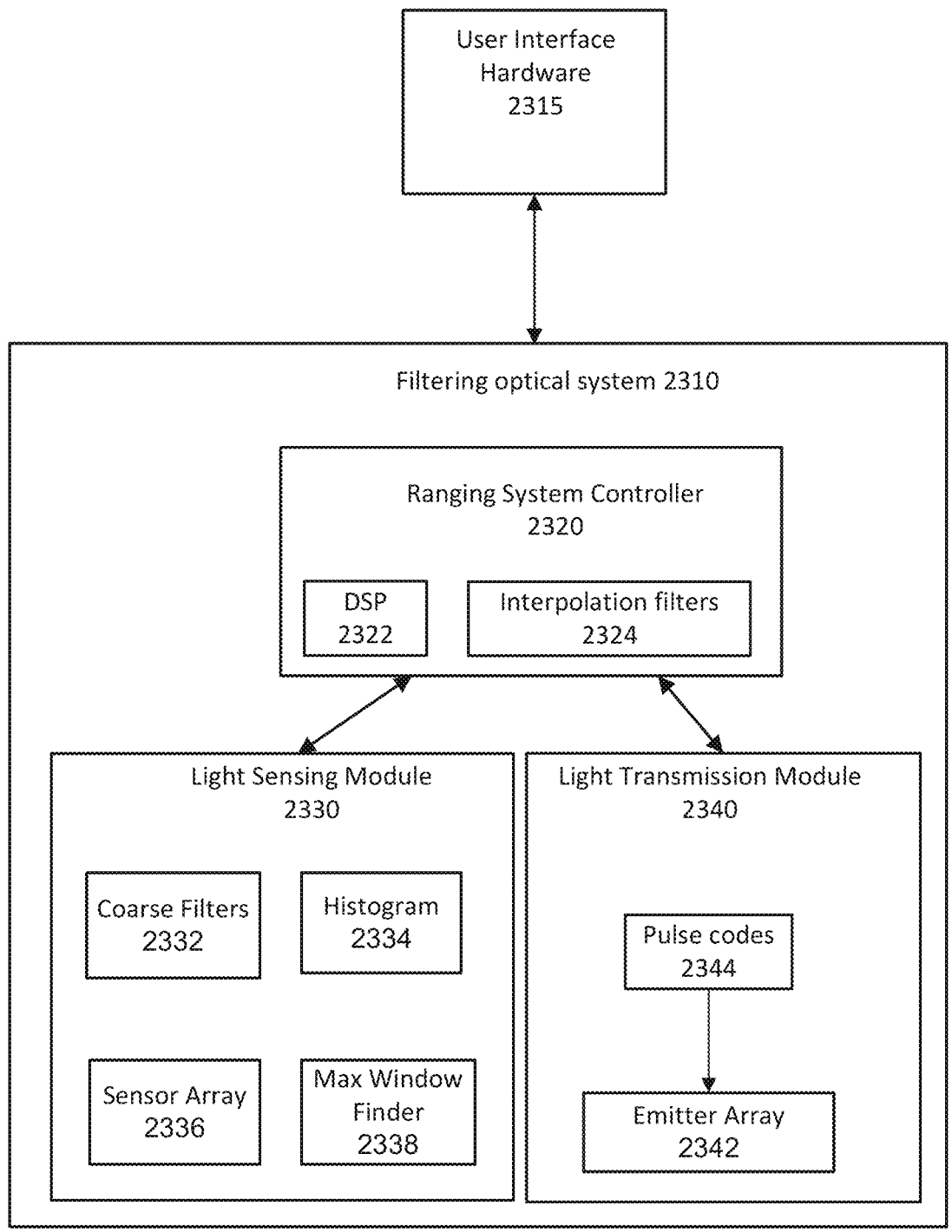
FIG. 23 shows a filtering optical system according to embodiments of the present invention.

FIG. 23 shows a filtering optical system 2310 according to embodiments of the present invention. Elements of FIG. 23 may operate in a similar manner as elements of FIG. 13, and include components from FIG. 13, although some may be omitted from FIG. 13 for clarity. For example, filtering optical system 2310 can be part of the same system as CPOS 1310 of FIG. 13. Filtering optical system 2310 can interact with a user interface hardware 2315, which can be user interface 215 of FIG. 2 and/or 1315 of FIG. 13. User interface hardware 2315 can specify matched filters to use in other operational parameters. User interface 1315 can display filtering results, which can include a 3-dimensional map of detected objects and a distance value for a specific object.

System controller 2320 can perform in a similar manner as system controller 1320 of FIG. 13, e.g., by controlling a light sensing module 2330 and a light transmission module 2340. Light transmission module 2340 can contain pulse-codes 2344 and an emitter array 2342 (e.g., one or more laser diodes) capable of transmitting light. System controller 2320 can include a DSP 2322 for analyzing data received from light sensing module 2330.

Light sensing module 2330 contains one or more coarse filters 2332, an histogram 2334, a sensor array 2336, and a max window finder 2338. Sensor array 2336 detects photons of lights and creates a digitized intensity value for each time bin, e.g., based on a time-to-digital converter. Data values from sensor array 2336 can be stored in histogram 1334, e.g., with one memory cell per time bin. Histogram 2334 can be created for a give measurement time interval, and then cleared for a new measurement time interval. In some embodiments, multiple histograms can be computed for different overlapping measurement time intervals, e.g., where data values from a particular detection interval might contribute to multiple histograms, each for a different overlapping measurement time interval that includes the particular detection interval.

Coarse filters 2332 can be stored as a sequence of integers or floating point numbers in a register or other memory cells. Each coarse filter can be associated with a label that indicates a width or a profile corresponding to that coarse filter, e.g., when multiple coarse filters are used. A processor of light sensing module can select which coarse filters to use, e.g., based on data values in histogram 2334. For instance, a maximum value in histogram 2334 can indicate which coarse filter(s) to use, as is described herein.

Max window finder 2338 can analyze one or more outputs of one or more coarse filters, as is described herein. Max window finder 2338 or another processing module can determine which coarse filter matches best, e.g., based on a maximum value of each filter output. In some embodiments, light sensing module 2330 can output certain values in a best matching filter output (e.g., in the window identified by max window finder 2338) and the window.

DSP 2322 can analyze the filter output within the identified window using interpolation filters. In some embodiments, light sensing module can indicate which coarse filter matched best, e.g., so certain interpolation filters can be used (e.g., loaded into cache) for analyzing the current filter output. Different interpolation filters may be used for different filter outputs during different measurement intervals, e.g., as different objects will reflect the corresponding pulses. In other embodiments, interpolation filters 2324 and DSP 2322 can be part of light sensing module (e.g., on a same chip as sensor array 2336). Thus, light sensing module 2330 can optionally incorporate an additional DSP and interpolation filters 2324. In another embodiment, light sensing module 2330 can include the entire ranging system controller functionality.

G. Method of Using Profile Filters

Figure 24:
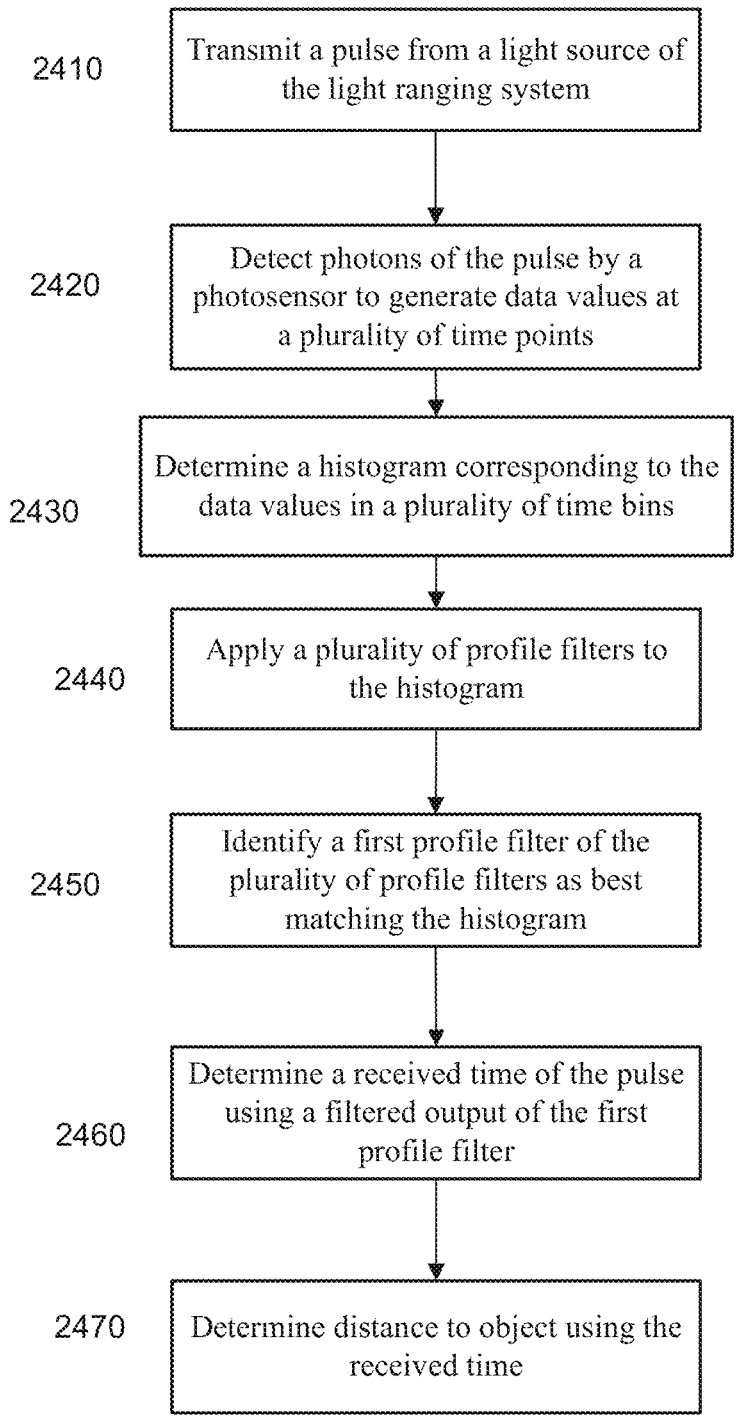
FIG. 24 is a flowchart illustrating a method of performing ranging using profile filters of a light ranging system according to embodiments of the present invention.

FIG. 24 is a flowchart illustrating a method 2400 of performing ranging using profile filters of a light ranging system according to embodiments of the present invention. The light ranging system can be part of a LIDAR system that also detects objects. Method 2400 is described with respect to a single pulse, the can be equally applied to a pulse train and a plurality of pulse trains over measurement time interval. As with method 1400, method 2400 and other methods may be used for other purposes than ranging, e.g., for communication purposes or detection of interfering signals.

At block 2410, a pulse is transmitted from a light source (e.g., a laser or light emitting diode) of the light ranging system. The pulse can reflect from an object so that the pulse can be detected at the light ranging system. As examples, the light source can be light sensing module 2340, emitter array 2342, or any specific emitter in emitter array 2342. Examples of types of lasers are provided herein.

At block 2420, photons of the pulse are detected by a photosensor of a pixel of the light ranging system. As a result of the detection, data values can be generated at a plurality of time points. For instance, photodetectors (e.g., SPADs) of a pixel photosensor can provide digital signals indicating a time when a photon is received. In other embodiments, the photosensor can be an APD or other photosensor that provides an analog signal, which can be converted to non-binary values (e.g., on a scale from 0-255) that correspond to the data values.

At block 2430, a histogram corresponding to the data values is determined in a plurality of time bins. A counter of the histogram at a particular time bin (e.g., 100-101 ns) can correspond to one or more data values at one or more time points within the particular time bin. For example, the data values can be positive signals indicating a photon has been received at a particular photodetector of the photosensor. This positive signals can be received at different times during a time bin.

At block 2440, a plurality of profile filters are applied to the histogram. Each profile filter can correspond to a different rate of photons being detected by the photosensor over consecutive time bins. In various implementations, the different profile filters can correspond to a high pileup profile, a moderate pileup profile, and a low/no pileup profile. In some embodiments, the application of profile filters can be performed directly on histogram. In other embodiments, an initial coarse filter can be applied to the histogram to provide an initial filter output, and the profile filters can be applied to the initial filter output. In such an instance, the profile filters are still applied to the histogram.

The different profile filters can be determined in various ways. For example, test measurements can be performed to identify different profiles in the detected signal. Such measurements can be performed with various objects under various conditions, so that a representative set of profile filters can be identified. In other embodiments, simulations can be performed to determine the types of profiles that would occur.

At block 2450, a first profile filter of the plurality of profile filters is identified as best matching the histogram. For example, a cross-correlation function (e.g., an overlap function) between the profile filters and the histogram can be used as described herein to determine a maximum value at a particular sliding time step of the best matching filter.

In some implementations, each of the plurality of profile filters can be slid across a histogram. For example, an embodiment can perform sliding the profile filter over the histogram to calculate a filtered histogram having counters corresponding to different sliding positions (e.g., different time steps) of the profile filter relative to the histogram. Each of the counters of the filtered histogram can correspond to an overlap of the profile filter and the histogram at a particular sliding position. A maximum value of the filtered histogram can be identified. In this manner, a plurality of maximum values can be obtained for a plurality of filtered histograms. Then, a global maximum value can be determined from the plurality of maximum values. Such a global maximum value corresponds to the first profile filter and the received time of the pulse (e.g., the sliding position of the profile filter than provided the global maximum value).

At block 2460, a received time of the pulse is determined using a filtered output of the first profile filter. In various implementations, the received time can correspond to a leading edge of the pulse, a middle of the pulse, or a trailing edge of the pulse. The received time can be measured relative to a start time of a detection interval, e.g., from a time when the pulse is transmitted.

At block 2470, a distance to the object is determined using the received time. The distance can be determined based on an elapsed time from transmission of the pulse to detection of the pulse. This elapsed time as an example of a distance. In other embodiments, such an elapsed time can be converted to an actual distance using the speed of light.

VI. Staggered Pulses

Interpolation filters can be used to provide increased accuracy, as described above. For instance, then different interpolation filters can correspond to different temporal positions of a rising edge (e.g., temporal positions that vary by 100 ps within a 1 ns time bin). But, problems can arise for a strong pulse that causes a high pileup, which may result in only one time bin having any appreciable values. In such an instance, interpolation will not help as a relative heights of two or more time bins cannot be used to interpolate a more precise time for the rising edge.

As a solution, pulse trains can be staggered such that the detected pulse arrives at different times, e.g., different pulse trains with the same pulse pattern have delays with respect to each other. If the amount of staggering extends over a time bin (e.g., 1 ns of staggering for 1-ns time bins), at least two time bins will have appreciable values, except when the rising edge is exactly at the beginning of a time bin. Once more than one time bin has an appreciable value, interpolation may be performed. However, such interpolation profiles would then need to account for the signal shape resulting from the staggering.

A. Inability to Interpolate for Very High Pileup Profiles

Figure 25A:
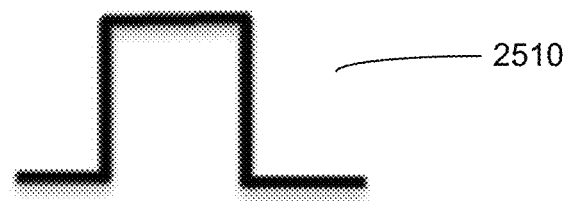
FIG. 25A shows a single square pulse typically used in a LIDAR system to illuminate a scene.

FIG. 25A shows a single square pulse 2510 typically used in a LIDAR system to illuminate a scene. Depending on the surface (e.g., orientation and smoothness), the reflected pulse could have different shapes. In particular, when reflecting from a flat and smooth surface that is relatively perpendicular to the optical axis of the outgoing pulse, the shape of the reflected signal will be very similar to the outgoing laser pulse train.

Figure 25B:
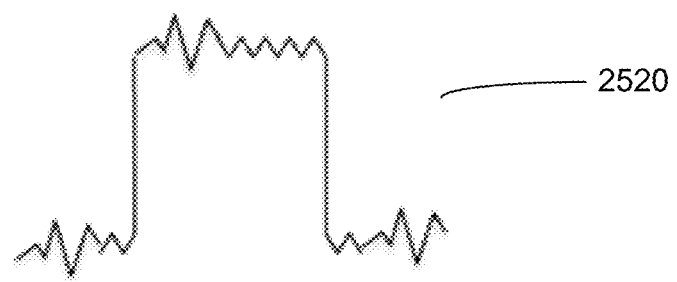
FIG. 25B shows a reflected pulse with some noise.

FIG. 25B shows a reflected pulse 2520 with some noise. Reflected pulse 2520 would have a lower intensity than emitted pulse 2510, but the level of intensity can vary. The level of intensity (amplitude) of the pulse can be greater for flat and smooth surfaces, particularly when the pulse is perpendicular to the surface. In such situations, a high pileup signal can occur. The strong reflections from such a surface can cause a pileup in a detector (e.g., a SPAD) as explained above. As such, the signal at the SPAD can have a high pileup profile with a sharp rising edge and fast falloff.

Figure 25C:
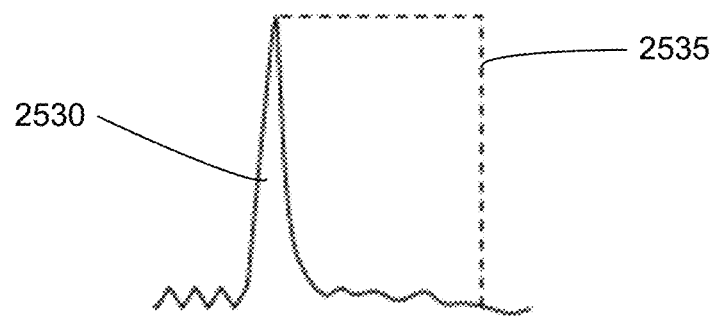
FIG. 25C shows a high pileup signal detected at a rising edge of the reflected pulse according to embodiments of the present invention.

FIG. 25C shows a high pileup signal 2530 detected at a rising edge of the reflected pulse 2535 according to embodiments of the present invention. High pileup signal 2530 does not resemble the true reflected signal, which is a more like a square pulse. Determining the true signal position becomes increasingly difficult when pileup is as severe as high pileup signal 2530, and systems employing detectors with dead time, like SPADs, are particularly susceptible to pileup. For example, the resulting histogram, in such a case, might only consist of a single time bin being populated and all the other bins empty, which does not resemble the incoming photon signal from reflected pulse 2535.

Figure 26:
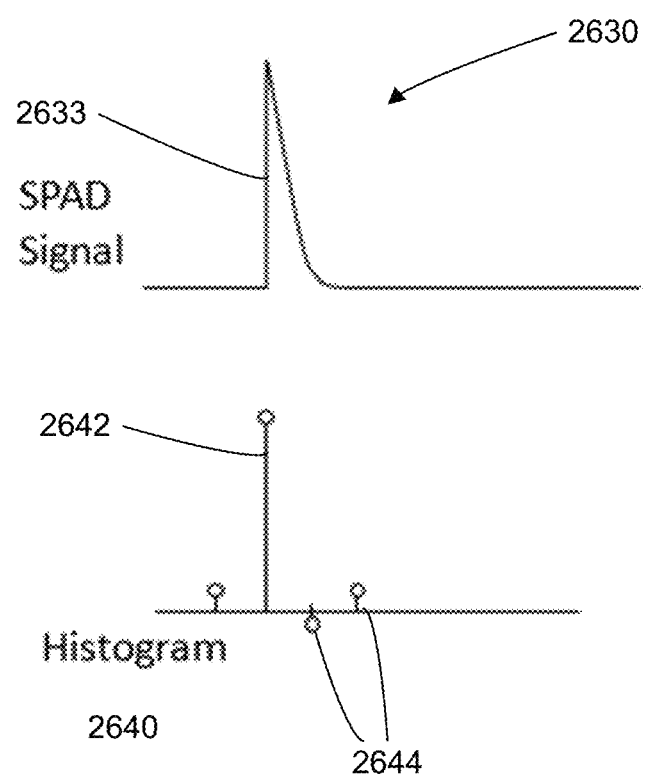
FIG. 26 shows a SPAD signal in a resulting histogram according to embodiments of the present invention.

FIG. 26 shows a SPAD signal 2630 in a resulting histogram 2640 according to embodiments of the present invention. Similar to high pileup signal 2530, SPAD signal 2630 rises quickly and falls almost as quickly. Histogram 2640 shows counters for four time bins to the time that the corresponding reflected pulse was received. Time bins 2644 have very small values, which can be attributed only to background noise. A negative value for a time bin can result from a negative weight is applied to the data values detected in one or more detection intervals, e.g., as described herein for coded pulses.

A primary characteristic of the histogram 2640 is that time bin 2642 as the only appreciable value. In such a case, the histogram 2640 cannot be interpolated since there is no information about where rising edge 2633 of SPAD signal 2630 occurs in time bin 2642.

Even if multiple pulse trains are used, two corresponding pulses sent during different detection intervals but at about a same time relative to the start signal might provide a similar histogram. Thus, the accumulated histogram for both pulses might be identical. One could introduce a delay between the two pulse trains that is less than a width of a time bin, but such a delay can still result in a similar problem.

Figure 27A:
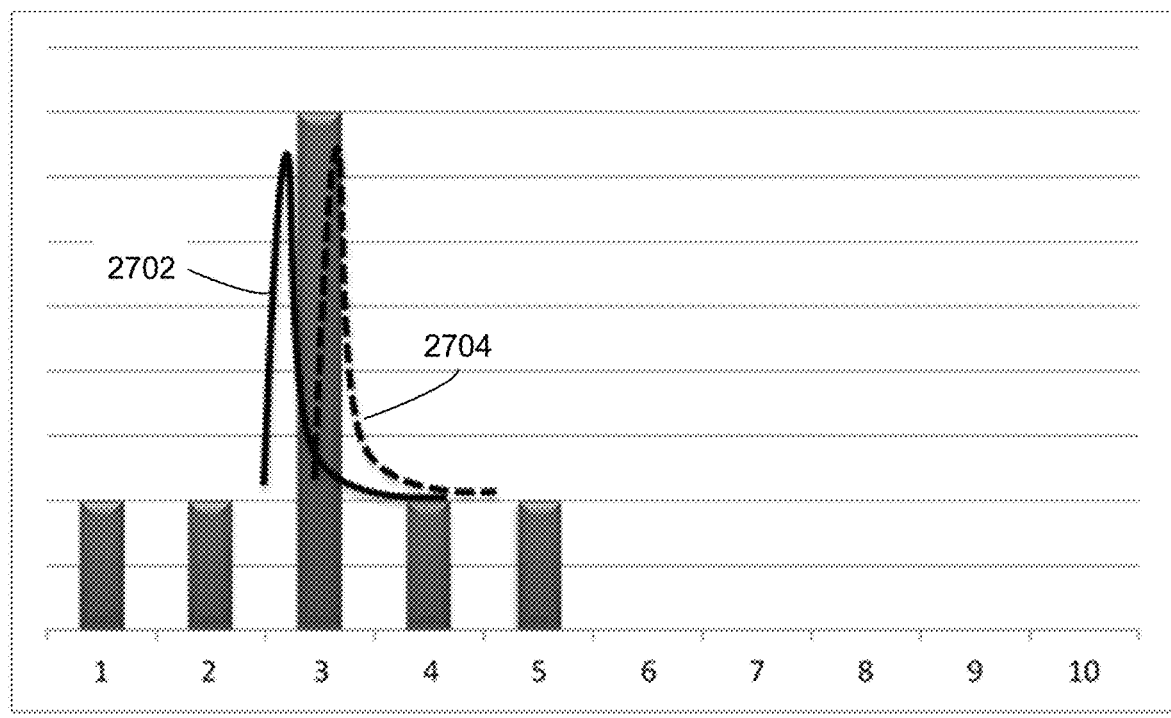
FIGS. 27A and 27B show two instances of pulses in different pulse trains delayed with respect to each other resulting in a histogram with only one bin having an appreciable value.
Figure 27B:
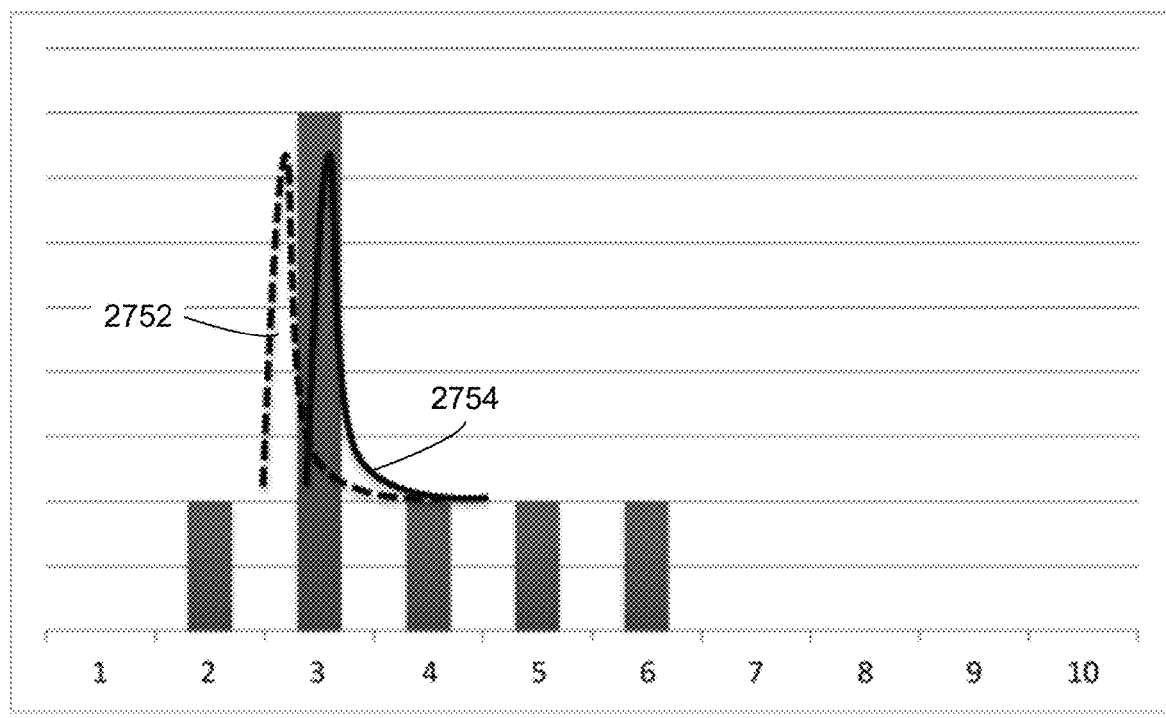

FIGS. 27A and 27B show two instances of pulses in different pulse trains delayed with respect to each other resulting in a histogram with only one bin having an appreciable value. The horizontal axis corresponds to time bins; the start and end of the time bins are demarcated by hash marks. Counters are shown for five different time bins. As displayed, the bars for the counters only occupy part of a time bin. Thus, the bars do not correspond to a full width of a time bin.

In FIG. 27A, solid signal 2702 shows the detected signal for a pulse of a first pulse train. A dashed signal 2704 shows the detected signal for a pulse of a second pulse train. In some embodiments, these detected signals can correspond to signals obtained from a collection of SPADs. The particular value at any instant in time can correspond to a total number of SPADs that are triggered at an instant in time. Both signals 2702 and 2704 arrive in time bin 3, and fall to near zero before time bin 4 begins as essentially all the SPADs enter their dead time after firing due to the strong signal. Even though dashed signal 2704 occurs after solid signal 2702, only time bin 3 has any appreciable value that is accumulated over the two detection intervals of the two pulse trains.

In FIG. 27B, the solid and dashed pulses are interchanged. Solid signal 2754 occurs after dashed signal 2752. Again, both signals only contribute appreciably to time bin 3. Thus, in both histograms, time bin 3 is the only populated bin, apart from some noise. Interpolation will not help better the resolution under such circumstances. FIGS. 27A and 27B also illustrate that even though the two signals are received at different times, the resolution of the detection circuitry cannot differentiate between the two signals.

B. Staggering Pulses for Interpolation for High Pileup Signals

The resolution of the imaging detector electronics is, as an example, 1 ns. Embodiments can use interpolation to get higher accuracy. However, high pileup signals can cause problems, as described above. However, the laser pulse modulation can a finer resolution. For instance, two distinct consecutive laser pulses could be generated within 0.1 ns. As shown in FIGS. 27 and 28 is a some offset between two pulses will not necessarily allow for finer resolution in all instances.

In some embodiments, to achieve higher resolution, several identical laser pulses can be staggered in time by a fraction of the resolution of the imaging detector. This staggering can cause rising edges of the different pulses to span at least two time bins. Once more than one time bin has an appreciable value, interpolation can be performed.

In some embodiments, several laser pulses are staggered within 0.1 ns of each other. As the reflection from these different trains of laser pulses arrive at the SPAD, the SPAD may experience high pileup after the leading edge of each pulse. However, because the pulses are staggered in time, the leading edges of the group of pulses will fall into different histogram bins. The staggered consecutive laser pulses effectively serve as introduced noise that is known and can be used to increase the time resolution of the imager.

This effectively reduces the effects of quantization noise in the TDC, which constrains the resolution of the histogram. By averaging multiple measurements with known offsets, according to the present embodiments, one can achieve timing resolutions finer than the TDC bin width.

Figure 28A:
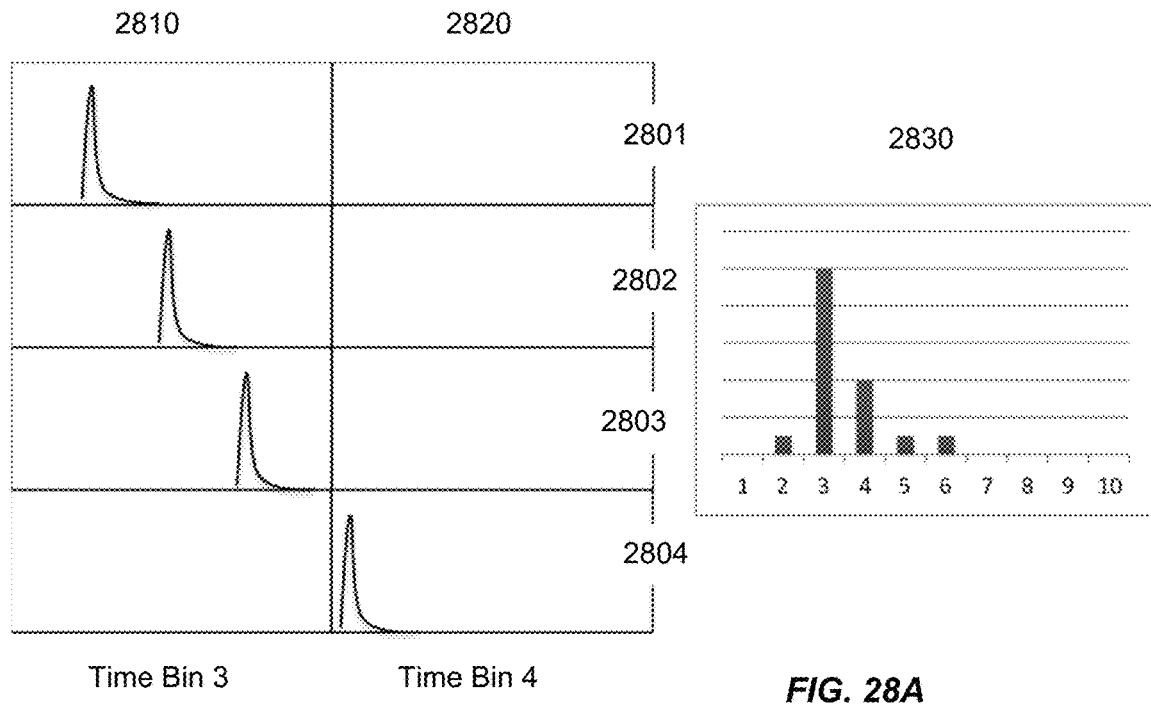
FIGS. 28A and 28B show examples of staggering emitted pulses of different pulse trains such that the detected high pileup pulses span multiple time bins according to embodiments of the present invention.
Figure 28B:
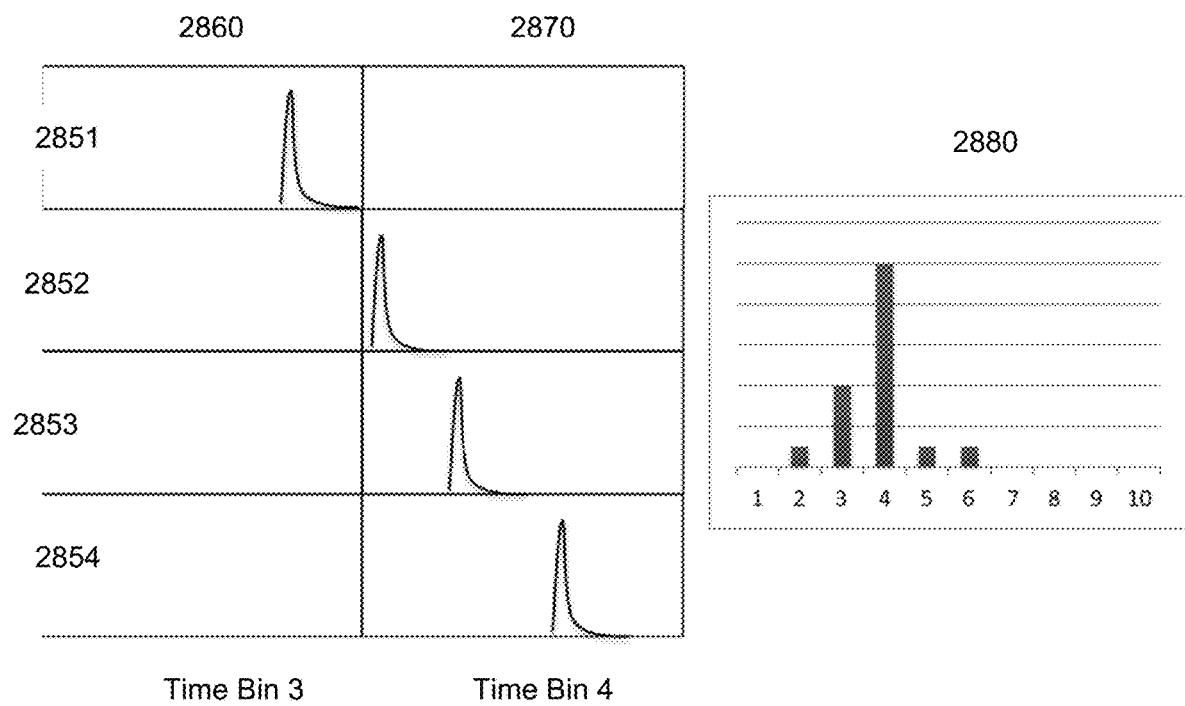

FIGS. 28A and 28B show examples of staggering emitted pulses of different pulse trains such that the detected high pileup pulses span multiple time bins according to embodiments of the present invention. FIGS. 28A and 28B show the detected pulses in different detection intervals and a corresponding histogram. Specifically, each figure shows signals in four detection intervals across two time bins. The histograms show two time bins with appreciable values.

In FIG. 28A, column 2810 corresponds to time bin 3 in histogram 2830. Column 2820 correspond to time bin 4 in histogram 2830. Each row corresponds to different detection intervals 2801-2804. Thus, each of the pulses is emitted and detected before a next pulse of a next detection interval is emitted. Each of the pulses are offset from a pulse of a previous detection interval. In this example, the offsets are about ¼ of a time bin, but other offsets can be performed. Further, the offsets do not have to be uniform, e.g., a ½ offset could be performed before a ¼ offset, as may occur if the pulse train in detection interval 2802 occurred before the pulse train in detection interval 2801.

The location of the signals in columns 2810 and 2820 mirror histogram 2830. Time bin 3 has a higher value as more pulses are detected in column 2810, which provides a magnified view of time bin 3. But, time bin 4 still has an appreciable value since one pulse is within column 2820. When histogram 2830 is interpolated, the approximate 3:1 ratio between the values in time bins 3 and 4 will indicate that the first pulse in detection interval 2801 (zero offset in this example) occurs at about ¼ ns into time bin 3, i.e., when a time bin has a width of 1 ns. If the rising edge of the first pulse (or more generally the one with zero offset) occurred at ½ ns, then time bins 3 and 4 would be about equal since both would have two pulses. If time bin 3 was the only time bin with an appreciable value, then the received time of the rising edge would be at the start of time bin 3.

In FIG. 28B, column 2860 corresponds to time bin 3 in histogram 2880. Column 2870 correspond to time bin 4 in histogram 2880. Each row corresponds to different detection intervals 2851-2854. As three pulses are in time bin 4, histogram 2880 has a higher value in time bin 4 than in time bin 3. The approximate ratio is 1:3 (accounting for some noise) for the counters of time bins 3 and 4 in histogram 2880 indicates that the pulse in detection interval occurs at about ¾ ns in time bin 3. Accordingly, the staggering of the laser pulses by a fraction of the imaging detector resolution can be used to obtain a higher resolution of the signal. The higher resolution, in turn, could be used to better identify the range (distance) to the surface from which the laser pulse is reflected and impinges the SPAD.

In other embodiments, the number of different offsets over the different detection intervals can be 10 with the different offsets differing by a factor of 0.1 of the width of a time bin. In such an example, the laser pulses are offset by 100 ps for 1 ns time bins. The laser pulses may be several time bins wide (e.g., 5 time bins wide in FIGS. 18A and 28B), but the rising edges are staggered with respect to each other.

C. Interpolation for Staggered Pulse Trains

As discussed above, the rising edge of a pulse can be calculated differently when the pulse trains are staggered. To illustrate this, interpolation for staggering is contrasted with interpolation for not staggering when two time bins have appreciable values.

When no staggering is performed and assuming a FWHM of the detected pulse is 0.2 ns, the rising edge of the detected pulse can be determined to be at 0.9 ns into the first time bin when the two time bins have equal values. The fact that the two time bins have about equal values can be determined when an interpolation filter having two taps that have equal values is the best match (i.e., relative to other interpolation filters that have taps with unequal values). Accordingly, the interpolation can use the knowledge of the FWHM and the time bin values to determine the rising edge of the first pulse. For example, a detected pulse with 0.6 ns FWHM that is 0.7 ns into the first bin would have equal values in the first and second bin. A ratio of the time bin values does not need to be determined, as the best matching filter will automatically provide the correct time, e.g., given the knowledge of the FWHM. Each matching filter can have a predetermine time associated with it, e.g., as described below.

When staggering is performed using 10 different offsets and assuming a FWHM of the detected pulse is 0.2 ns, the rising edge of the detected pulse can be determined to be at 0.45 ns into the first time bin when the two time bins have equal values. Since there are 10 pulses and a width of 0.2 ns, a total integrated time is 2 ns. With offsets of 0.1 ns and starting at 0.45 ns, a total of 5 full pulses can be attributed to each time bin, thereby resulting in equal values for the two time bins in the histogram. The time corresponding to a particular interpolation filter can be stored in memory and retrieved when the best matching interpolation filter is identified.

As an easier example for staggering, if a pulse can be considered to be 0.1 ns in width, then a best matching interpolation filter of (8,2) would indicate that the rising edge starts at 0.2 ns in the first time bin (or at least within 100 ps of 0.2 ns). If (10, 0) was the best matching interpolation filter, then the rising edge of the first pulse occurred in the first 100 ps. If (5,5) was the best matching interpolation filter, the rising edge started at 500 ps of the first time bin. Accordingly, the precise method of interpolation can depend on the number of staggered pulse patterns (e.g., number of shots) and the increment in the staggering (dithering).

D. Method for Staggering Pulses

Figure 29:
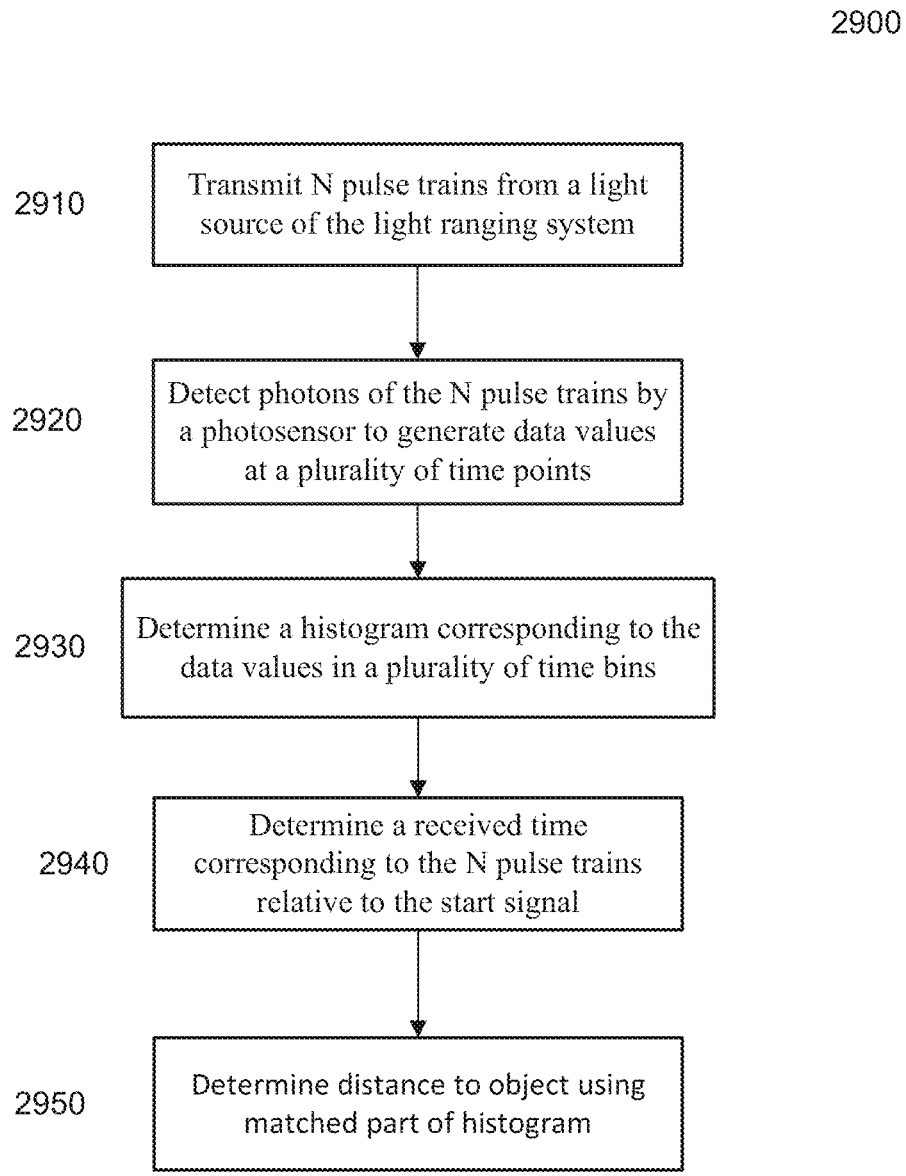
FIG. 29 is a flowchart illustrating a method of performing ranging using staggered pulses in a light ranging system according to embodiments of the present invention.

FIG. 29 is a flowchart illustrating a method 2900 of performing ranging using staggered pulses in a light ranging system according to embodiments of the present invention. Method 2900 can stagger pulses of pulse trains so as to provide a precision greater than a resolution of a timing circuitry of light sensing module, even when the received signal is so strong that a high pileup signal is generated from a photosensor.

At block 2910, N pulse trains are transmitted from a light source (e.g., a laser) as part of a ranging measurement. The pulse trains can have coded patterns as described herein. Aspects of block 2910 may be implemented in a similar manner as block 1420 of FIG. 14A and/or block 2410 of FIG. 24. The N pulse trains can reflect from an object, where detection of reflected portions can be used to determine a distance to the object.

Each of the N pulse trains can include one or more pulses from the light source, and each pulse train can correspond to a different time interval that is triggered by a start signal. For instance, a VCSEL can emit a first pulse train of two pulses, where the emission can be triggered by a start signal, e.g., start signal 1101. The first pulse train can be part of a first detection time interval, which can detect a reflected portion of the first pulse train. Then, as part of a second detection time interval (which is still part of the same measurement), the same VCSEL can emit a second pulse train, triggered by a start signal (e.g., start signal 1102). The start signal can be a periodic signal.

At block 2920, photons of the N pulse trains are detected by a photosensor of a pixel of the light ranging system, thereby generating data values at a plurality of time points. Block 2920 can be performed in a similar manner as block 2420 of FIG. 24 and/or blocks 1430 and 1440 of FIG. 14A.

At block 2930, a histogram corresponding to the data values is determined in a plurality of time bins. Aspects of block 2930 can be performed in a similar manner as block 2430 of FIG. 24 and/or block 1460 of FIG. 14A. A counter of the histogram at a particular time bin can corresponds to one or more data values at one or more time points within the particular time bin. To illustrate, the time point(s) can correspond to the three different times of the three different detected signals in column 2810 corresponding to detection intervals 2801-2803. For other methods, pulses of different pulse trains may arrive at a same time point of a time bin, or arrive at different time points due to noise. However, in some embodiments, the different time points can be a result of staggering the emitted pulse trains, e.g., as described above.

As part of providing increased precision, the N pulse trains can have varying offsets from each other. For example, the N pulse trains can be offset from the start signal of the corresponding detection time interval by different amounts. Alternatively, the clock that runs the detector histogramming can be offset from the start signal of the corresponding detection time interval by different amounts. Thus, a same effect is achieved whether the transmitter or the receiver does the time staggering, and pulse trains having such offsets can be accomplished in either manner.

At least two of the N pulse trains can be offset by less than a width of a time bin, e.g., the two pulse trains can be offset by less than 1 ns when the histogram has bins that are 1 ns wide. These two pulse trains can have a same pattern, e.g., so that the rising edges of corresponding pulses are offset by a same amount as the offset of the pulse trains. The assigned weights (e.g., for coding the pulse trains, as is described herein) can be both of the same sign (i.e., positive or negative) and in the same direction (e.g., when higher dimensional coding schemes are used for more complex quadrature.

Some of the pulse trains may not be offset from one or more other pulse trains. Thus, a measurement can include other pulses than the N pulse trains. In other implementations, the N pulse trains can be all of the pulse trains of the ranging measurement. For example, there can be 10 staggered offsets (e.g., differing by 100 ps), but there can be a total of 20 pulse trains used in the measurement, where two pulse trains are emitted at each of the offsets (e.g., same shift from the start signal).

In some embodiments, successive pulse trains of the N pulse trains can be offset by a same time offset T. For example, a first pulse train can be offset by zero relative to the start signal, a second pulse train can be offset by T relative to the start signal, and a third pulse train can be offset from the start signal by 2T, and so on, thereby having successive pulse trains offset by T. The overall span of time from a first pulse train and a last pulse train can be equal to the width of a time bin, e.g., N*T can be equal to the width. In various implementations, the time offset T is between 0.5 and 0.01 of the width of the time bin, e.g., 0.1 of the width of the time bin. Such an example is 10 offsets multiplied by 100 picoseconds to achieve a 1 ns span, thereby having two time bins with an appreciable value the histogram, except when the initial rising edge is at the very beginning of the first time bin.

At block 2940, a received time corresponding to the N pulse trains relative to the start signal is determined. The received time can be determined using matched filters, e.g., interpolation filters. Accordingly, determining the received time can include applying a matched filter to the histogram to obtain a filtered histogram and determining the received time using a maximum value of the filtered histogram and the time offset T. The correspondence between a matched filter and a particular time can be determined based on the staggered pattern in the N pulse trains. The received time can correspond to a rising edge of a pulse with a smallest shift relative to the start signal.

At block 2950, a distance to the object can be determined using the received time. As examples, block 2950 can be performed in a similar manner as block 2470 of FIG. 24 or by any technique described herein.

VII. Sensors of Different Gain

SPAD saturation and pileup/quenching can affect the performance of a LIDAR system in many ways. These include the management of the dynamic range of the SPAD, as well as SPAD power management. These issues are specifically paramount in high signal condition resulting from high levels of reflections from the laser pulse or high levels of background radiation, especially from the sun.

In embodiments that use multiple photodetectors (e.g., SPADs) grouped to behave as a single pixel, these issues might be addressed by classifying different SPADs based on their dynamic range, and thereby providing different signal levels. Thus, different SPADs can require more or less photons to be triggered (fired) and produce a positive signal for inclusion in a histogram. Once classified (e.g., by as set by circuitry), embodiments can modify an operational status of SPADs having a certain dynamic range under certain conditions. For example, a SPAD sensitivity can be reduced under high light flux. As another example, a power level of SPADs with a strong signal level can be reduced, e.g., turned off. As a further example, only signals from certain SPADs may be used in building a histogram, thus effectively turning off those SPADs. Similar operations can be performed for SPADs with a weak signal level (i.e., low sensitivity), e.g., increasing dynamic range or reducing power under low light flux.

A. Arrangements of Detectors with Varying Signal Level

Figure 30A:
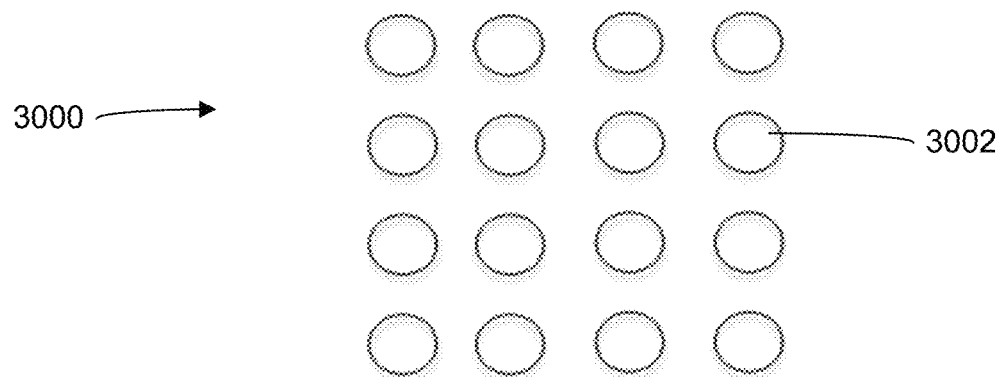
FIG. 30A shows a regular arrangement of 16 photodetectors 3002 (e.g., SPADs) forming a single pixel photosensor according to embodiments of the present invention.

FIG. 30A shows a regular arrangement 3000 of 16 photodetectors 3002 (e.g., SPADs) forming a single pixel photosensor according to embodiments of the present invention. In some situations, it may be beneficial to change the operational status of photodetectors 3002, e.g., when the light flux reaches certain levels, e.g., too low or too high. Various arrangements can be used in various environments, e.g., different attenuation levels (i.e., different dynamic ranges), different power levels (e.g., turning off), and/or different weights to detected signal (e.g., setting to zero to specify which photodetector signals are not to contribute to the histogram) are to be used. Further, different settings can be used for different subsets of photodetectors. Accordingly, a particular arrangement for the operational status of the photodetectors of a sensor could be set using the data values detected from the photodetector themselves, e.g., in one or several cycles within a very short time.

In some embodiments, to enhance the dynamic range of LIDAR system, the photodetectors of a pixel can be set to have (or identified as naturally having) different attenuations levels. A classification of a photodetector can be dynamic, e.g., when an operational status of one or more photodetector is changed by changing the attenuation level. Such a change can occur based on a detected signal of background light (e.g., due to a bright background light source, such as the sun or a street lamp) or a reflected pulse from a highly reflective object.

Figure 30B:
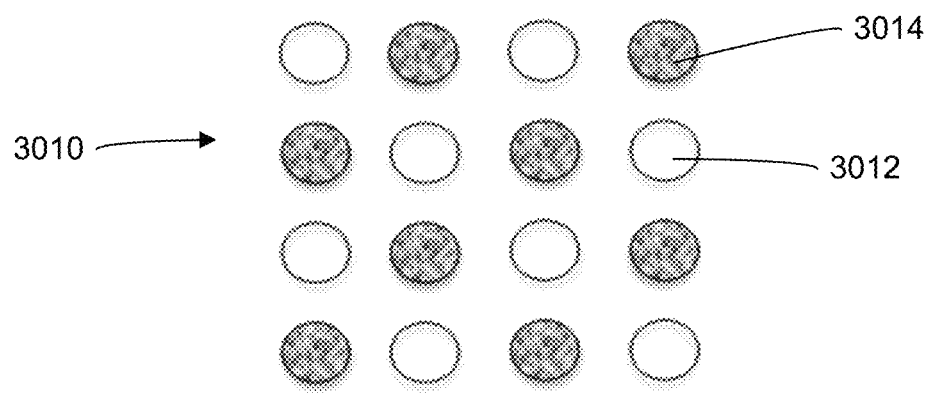
FIG. 30B shows an arrangement of 16 photodetectors having different attenuation levels according to embodiments of the present invention.

FIG. 30B shows an arrangement 3010 of 16 photodetectors having different attenuation levels according to embodiments of the present invention. Photodetectors 3012 have a high signal level in response to detecting photons. Photodetectors 3014 are attenuated, and thus provide weak signal levels in response to detecting photons. Thus, when there is a low light flux, none or few of photodetectors 3014 may trigger. The classification of high and low are relative to each other, and thus not necessarily tied to any absolute range.

In some embodiments, all 16 photodetectors can be enabled. In this manner, photodetectors 3012 can detect low levels of light pulses when the background light is not too high (e.g., below a background threshold). But, when the background light is too high or reflected pulses are too strong, photodetectors 3012 may always fire, thereby not providing use data. In such situations, their signals can be ignored (e.g., by not including their signals in a histogram). While photodetectors 3012 may not be useful in such a high flux situation, photodetectors 3014 can detect low levels of light pulses, and thus would not always fire in high background or strong reflected pulses. Accordingly, a dynamic range of the entire photosensor can effectively be larger than any one photodetectors by using photodetectors of different dynamic ranges. The dynamic change of the active operation (e.g., which signals from which photodetectors are used for the histogram) can enable a clean signal in both high and low light fluxes.

Figure 30C:
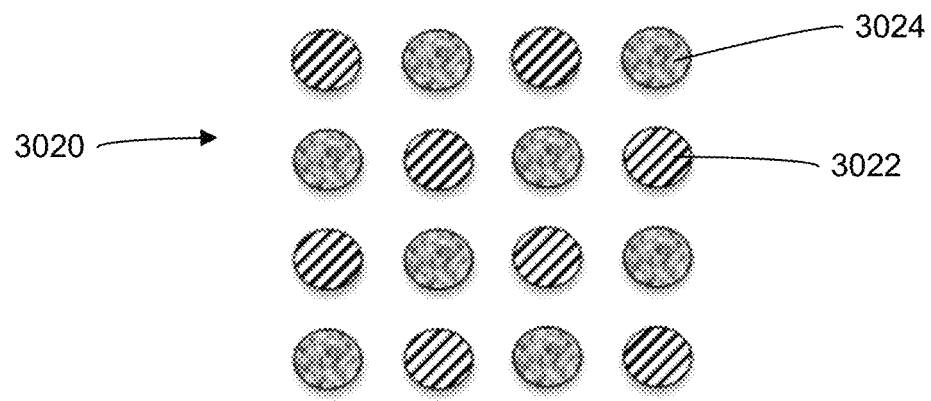
FIG. 30C shows an arrangement of 16 photodetectors having different attenuation levels and different active operation according to embodiments of the present invention.

FIG. 30C shows an arrangement 3020 of 16 photodetectors having different attenuation levels and different active operation according to embodiments of the present invention. In various embodiments, the different levels of active operation can be specified by differing power levels (e.g., on or off) or different contribution levels to a histogram (e.g., setting weights to 0 for certain photodetectors). For example, photodetectors 3022 can be disabled by power or contribution levels. This may be done when photodetectors 3022 have a high dynamic range (a high signal level in response to detecting photons) and the system expects to receive a high light flux (e.g., based on one or more previous measurements).

Photodetectors 3014 are attenuated, and thus provide weak signal levels in response to detecting photons. When there is a low light flux, none or few of photodetectors 3014 may trigger. The classification of high and low are relative to each other, and thus not necessarily tied to any absolute range.

In some embodiments, where strong signals are present, the attenuation pattern of arrangement 3020 may be adopted. This situation might occur due to very high ambient radiation or very high reflection signals. Once scenario under which this might happen is when the imager is directly looking at the sun. The signal from the photodetectors themselves could be used as an indication to set this configuration. For instance, when there is high pileup in all the photodetectors during a previous measurement, this configuration could be enabled.

Accordingly, if there are certain detectors that are 100 times less sensitive than others, the system can essentially ignore the sensitive detectors in a high light flux environment (e.g., a stop sign or a bright light source) because the ones that are sensitive (e.g., photodetectors 3022) will be saturated and piled up, where the ones (e.g., photodetectors 3024) that are not sensitive might not pile up. Such embodiments can be valuable even with the profile filters, as higher dynamic range can be achieved for estimating the signal strength more accurately.

B. Arrangements for Different Directions

In some embodiment, the LIDAR system identifies different directions and associates these different directions with specific ranges of radiation (light fluxes). Accordingly, the LIDAR system can dynamically adjust operational status of the photodetectors, where different photodetectors can have different settings for the operational status, as specified in different arrangements.

One example of application of these embodiments is when a vehicle is moving on a road during late afternoon or early evening hours when there is strong radiation from the sun in a specific direction. The LIDAR system can adjust an operational status (e.g., on/off configuration, attenuation level/gain control, or contribution level to a histogram) of each photodetector dynamically.

Figure 31:
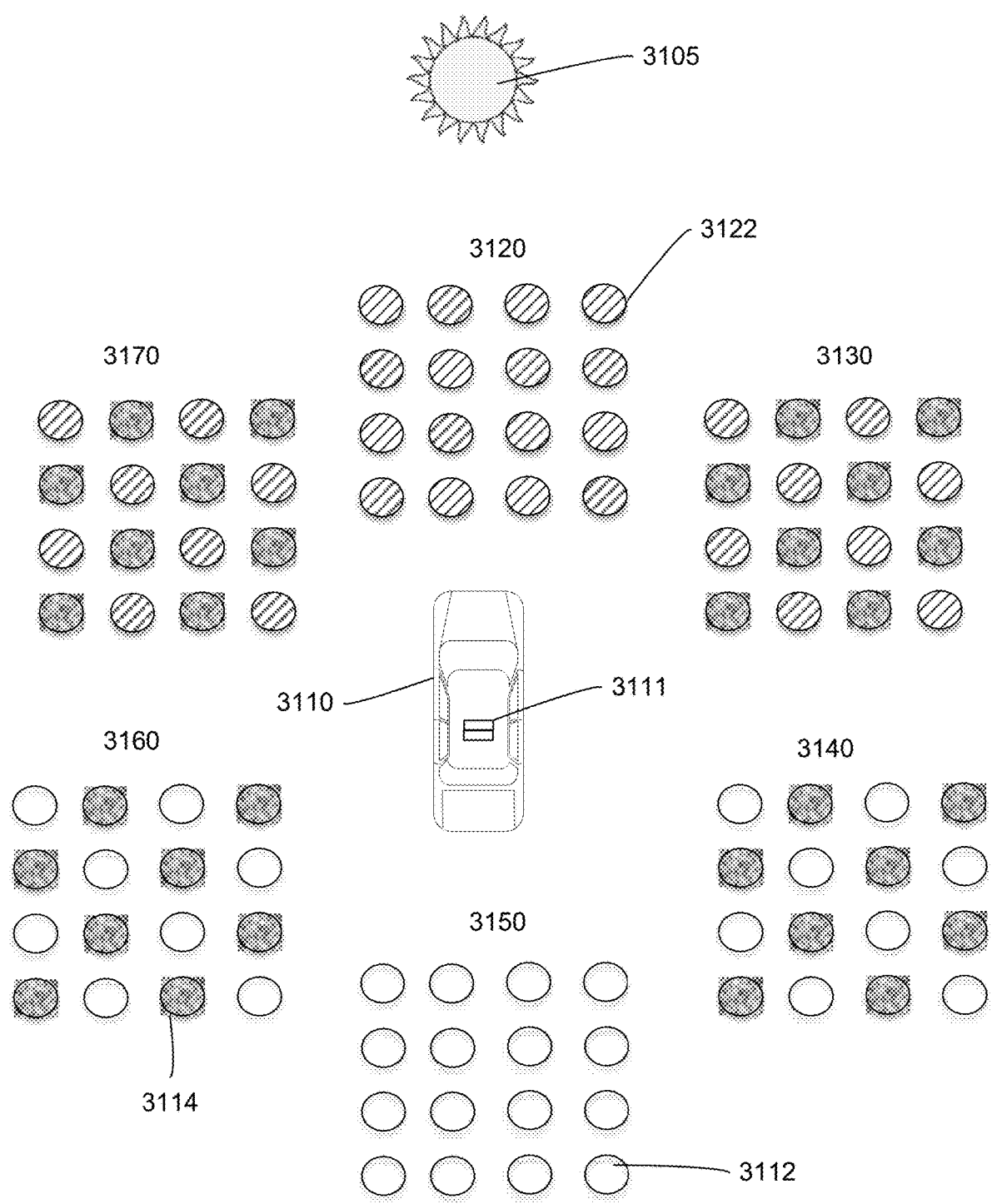
FIG. 31 shows a diagram of different detector arrangements for a pixel sensor at different lighting conditions at different angles according to embodiments of the present invention.

FIG. 31 shows a diagram of different detector arrangements for a pixel sensor at different lighting conditions at different angles according to embodiments of the present invention. FIG. 31 shows a LIDAR system 3111 on a vehicle 3110 in the center surrounded by detector arrangements 3120-3170. The different operational statuses in the arrangements are shown by different markings, as used in FIGS. 30A-30C. Detectors 3112 are enabled and at a high signal level. Detectors 3114 are enabled and at a weak signal level (i.e., low sensitivity). Detectors 3122 are disabled.

Each of the detector arrangements 3120-3170 is at a different angle relative to LIDAR system 3111. For ease of illustration, there are only six different angles shown, but there can be many more. For example, each angle correspond to a subtended 32 arc minute or about 0.5° of the total 360° horizontal (or 4π steradian solid angle). In some implementations, each angle can correspond to an amount rotation that occurs during one or a few measurement intervals. An initial measurement (e.g., during one or a few initial detection intervals of a measurement) can be performed to determine a light flux, and then settings for an operational status of each of the detectors can be specified to achieve a particular arrangement.

When looking straight at a strong light source 3105 (e.g., the sun) as in detector arrangement 3120, the LIDAR system disables all the detectors, e.g., after an initial detection interval, where many detectors were continually firing. Some detectors (e.g., certain SPADs) can use some power each time they fire, and such detectors would be constantly firing with high background light. A threshold criteria for disabling all the detectors can be specified by a threshold number/percentage (e.g., 60%, 70%, 80%, 90%, or 100%) of detectors of the pixel triggering within a same time bin. The criteria can require such mass triggerings in multiple time bins (e.g., 2, 3, 5, 10, 20, etc.) during a same detection interval. In particular when the mass triggerings are due to a strong background light source, the number of time bins with mass triggerings will be high. When due to a highly reflective object (e.g., when detected pattern matches with emitted pulse pattern), the number of time bins with a mass triggering will be lower, and thus a lower number of time bins can be required for disabling.

In other embodiments, the signal level on detectors 3122 can be changed so as to cause the background flux of light to generally fall below a threshold, such that the time bins that detect the reflected laser pulses have a discernibly higher count. In some implementations, the extent to which the dynamic range needs to be changed (e.g., bias voltage of a SPAD) while not eliminating all sensitivity can be determined over several detection intervals. For instance, the sensitivity in the signal level can be reduced incrementally (or in a binary or other search tree fashion) to identify a compromise from removing the noise and retaining signal. Such a search can implement different settings for the different SPADs of a pixel sensor (each subgroup of SPAD(s) having a different setting), thereby allowing simultaneous searches to be performed in parallel.

Detector arrangements 3170 and 3130 are off-center from the angle that is directly pointing at light source 3105. As examples, these angles can differ from that for detector arrangement 3120 by 0.1°, 0.2°, 0.3°, 0.4°, or 0.5°. As the total light flux is less, weak detectors 3114 can be enabled. In some embodiments, the settings at a particular angle can be kept for multiple rotations, and then checked again (e.g., in an initial detection interval of a later measurement). Thus, when the LIDAR system is a spinning LIDAR, once a setting at a particular angle (e.g., as determined by an encoder) is determined, the setting can be re-used when a light ranging device returns to the same angle. The encoder can identify angular positions of the light ranging system, which can be used to identify that the strength level is determined when the light ranging system is at an initial angular position that can be marked for a particular setting of the photodetectors.

Detector arrangements 3160 and 3140 are at angles significantly different from the angle that is directly pointing at light source 3105, and thus all of the detectors can be enabled, but with some still at a weak setting, e.g., to provide a larger dynamic range as the amount of background light (e.g., reflecting off of other objects) could still affect the detectors set at a strong signal level (i.e., high sensitivity). Detector arrangement 3150 can be pointed in the opposite direction from light source 3105, and thus all of the detectors can be enabled and set to have a strong signal level.

In some embodiments, when the LIDAR system detects an object coming into view when at an angle pointing at light source 3105, it can alter the pattern of SPAD gains (attenuation/signal level) to optimize for the detection of the object. For instance, when another vehicle moves in a direction to block the direct sunlight, the system can increases the gains of the SPADs along the evolving viewing angle of the object.

In some embodiments, the power saving can be augmented by adjusting the intensity of the laser sources in the LIDAR system. For instance, the system may opt not to illuminate in directions where very high ambient radiation is detected. Alternatively, the intensity of the laser sources could be lowered when there is low ambient radiation is detected. Further, in high background flux, the intensity of the laser source could be increased in combination with the lower of the attenuation level of detectors so that the reflected pulses can still be detected, while the background light does not cause an appreciable signal in an accumulated histogram.

C. Other Arrangements

Figure 32:
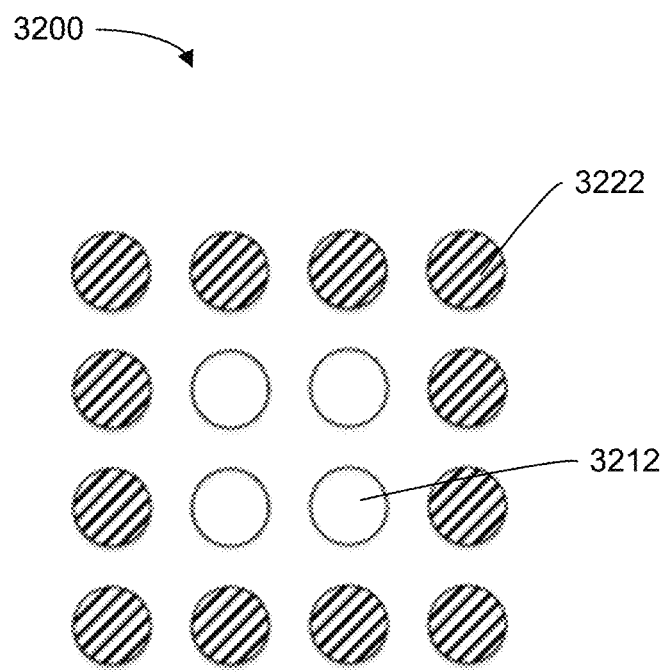
FIG. 32 shows an arrangement with photodetectors on a perimeter having a different operational status than photodetectors in a central area according to embodiments of the present invention.

FIG. 32 shows an arrangement 3200 with photodetectors 3222 on a perimeter having a different operational status than photodetectors 3212 in a central area according to embodiments of the present invention. Photodetectors 3222 can have settings that different from photodetectors 3212 in various ways. As examples, photodetectors 3222 could have a power level reduced, ignored (e.g., when accumulating the data values for a histogram), or have a weak signal level.

For a setting where photodetectors 3222 have a power level reduced, the change a power level of detectors can save power consumption. For instance, a configuration like the one shown in FIG. 32 could be used to save the power applied to the SPADs in one pixel by 75%. Such an arrangement can allow central photodetectors 3212 to continue to check whether the light flux is still too high, and then once the light flux decreases, photodetectors 3222 can be enabled. The arrangement of having such disabled photodetectors on the perimeter and enabled photodetectors in a central area is the central area will be more illuminated, and thus if the light flux is low enough in the central area, then it will be sufficiently low for the perimeter.

For a setting where photodetectors 3222 have a reduced signal level, arrangement 3200 would have some detectors with high signal level and some with low signal level, as also occurs with other arrangement described above. Such a mixed arrangement can increase a dynamic range (e.g., by an order of magnitude). When there is a high light flux, sensitive detectors will detect too much light and saturate. However, the attenuated detectors will receive enough light to create detectable signal. In such a situation, the system can ignore high-signal detectors, and only use the attenuated detectors. When the highlight flux is caused by a highly reflective objects, this can allow a detection of a rectangular pulse instead of a high pileup pulse. Alternatively, when the strong detectors are triggering in a manner consistent with a pulse pattern, but the weak ones are not, the weak detectors can be turned off or other reduced power level.

To determine what settings and arrangement to use, the data values detected during an initial detection interval can be used. This detection interval can involve an emitted laser pulse or not (e.g., just detect background). When an emitted pulse train is used, information about an object can be obtained, e.g., how reflective it is and a relative orientation of a surface. Later detection intervals can have certain detectors (e.g., those not attenuated) turned off or other reduced power level when a threshold criteria is met, as is mentioned above.

D. System Components

Figure 33:
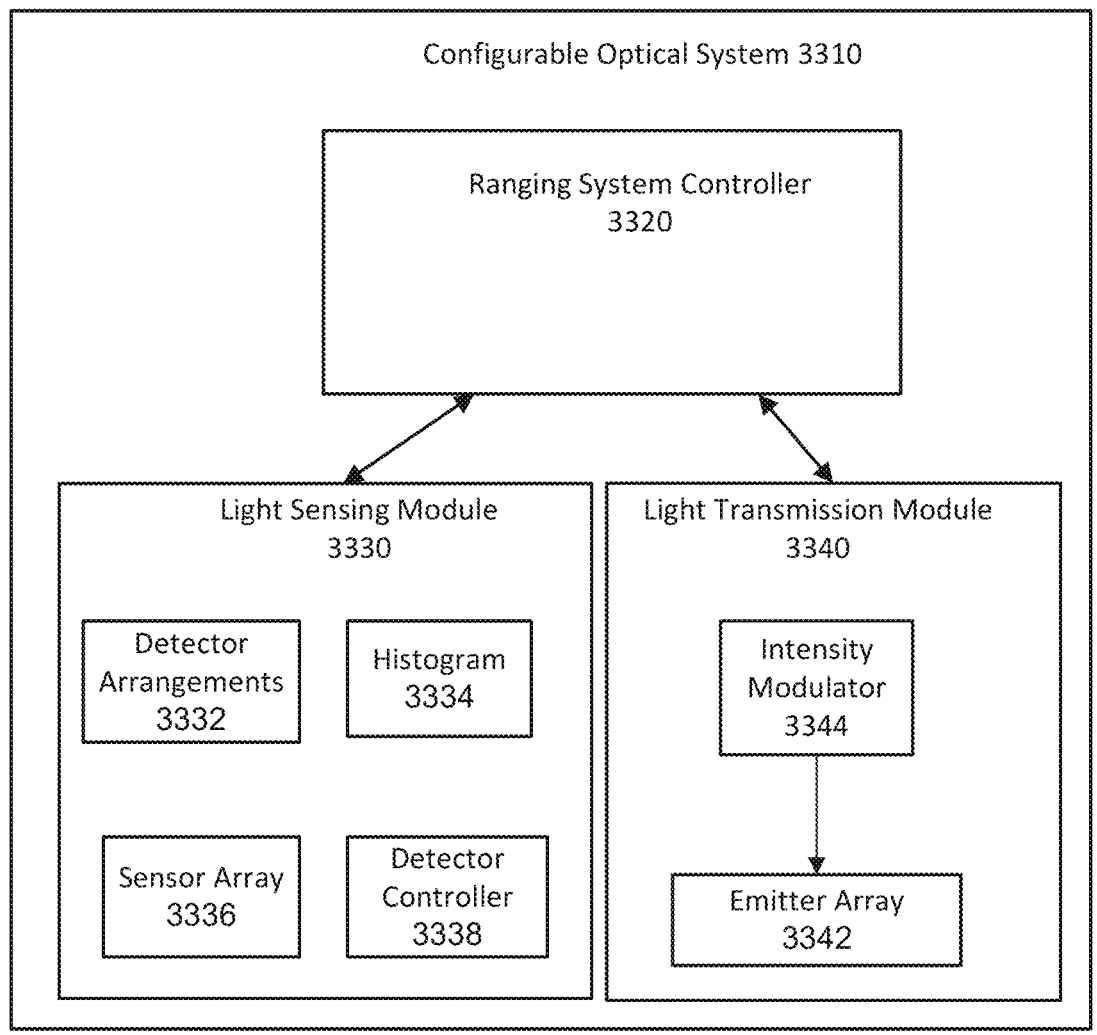
FIG. 33 shows a configurable optical system according to embodiments of the present invention.

FIG. 33 shows a configurable optical system 3310 according to embodiments of the present invention. Elements of FIG. 33 may operate in a similar manner as elements of FIGS. 13 and 23, and may include such components. System controller 3320 can perform in a similar manner as other ranging system controllers, e.g., by controlling a light sensing module 3330 and a light transmission module 3340. Light transmission module 3340 can contain intensity modulator 3344 and an emitter array 3342 (e.g., one or more laser diodes) capable of transmitting light. Intensity modulator 3344 can cause a change in a light flux of an emitted pulse, e.g., due to an amount of detected light, as described above. Intensity modulator 3344 could be in ranging system controller 3320 as well.

Light sensing module 3330 contains one or more detector arrangements 3332, an histogram 3334, a sensor array 3336, and a detector controller 3338. Detector controller 3338 can analyze the data values from a detection interval (e.g., by looking at intermediate values of histogram 3334), and determine which arrangement of settings should be used for the operational statuses of detectors of various pixels of sensor array 3336. In some implementations, detector arrangements 3332 can store certain settings that can be selected when the detected data values have certain properties (e.g., indicating high flux from background light or a reflective object). Detector arrangements 3332 can be stored for various or all angles when configurable optical system 3310 is spinning.

E. Method of Configuring Detectors

Figure 34:
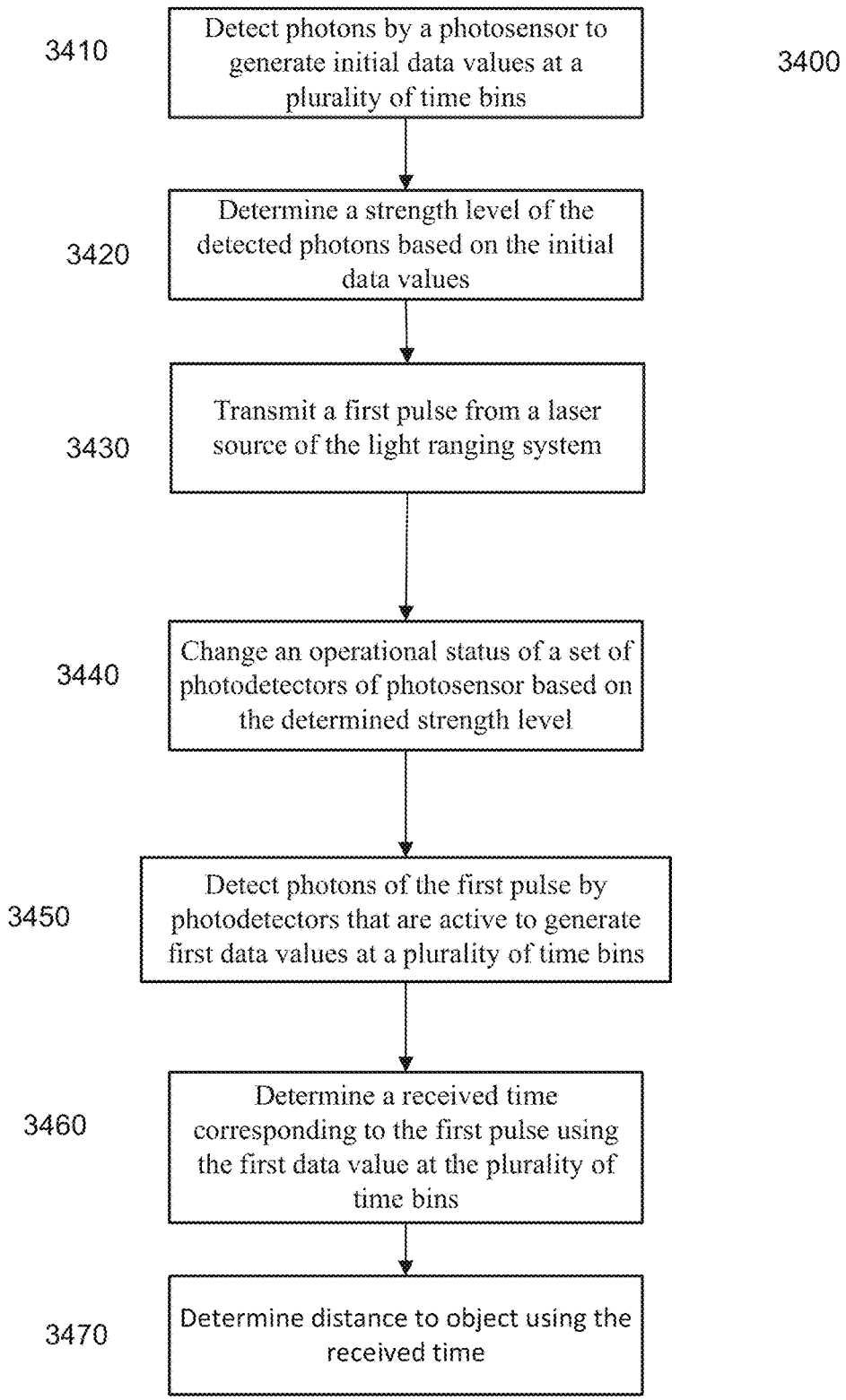
FIG. 34 is a flowchart illustrating a method of performing ranging using a configurable light ranging system according to embodiments of the present invention.

FIG. 34 is a flowchart illustrating a method 3400 of performing ranging using a configurable light ranging system according to embodiments of the present invention. Aspects of method 3400 may be implemented via techniques described for other methods described herein.

At block 3410, photons are detected by a photosensor of a pixel of the light ranging system, thereby generating initial data values at a plurality of time bins. The photosensor can comprise a plurality of photodetectors (e.g., SPADs). These initial data values can be analyzed as described above to determine an arrangement of settings for the operational statuses of the plurality of photodetectors. In some embodiments, the initial data values can be obtained by transmitting an initial pulse from a light source (e.g., a laser), where the initial data values can be used to determine a received time after reflection from an object.

At block 3420, a strength level of the detected photons is determined based on the initial data values. In various embodiments, the strength level can correspond to a number of photodetectors that fire at the same time, a sustained number that continually fire over a specified period of time, an average number that fire over a specified period of time, and the like. The strength level can be analyzed by a controller (e.g., detector controller 3338) that is on a same chip or different chip as the photodetectors. The controller can determine a new or saved arrangement of settings for the photodetectors.

At block 3430, a first pulse is transmitted from a light source of the light ranging system. The first pulse can reflect from an object so that a distance to the object can be determined.

At block 3440, before detecting photons of the first pulse, an operational status of a set of the photodetectors is changed based on the determined strength level. As described herein, according to various embodiments, the operational status can be a power level, a contribution level (e.g., whether detected signals are used in the ranging measurement), and an attenuation level. In various implementations, such changes can be due to the determined strength level being above or below a threshold. The set of photodetectors can be all or some of the plurality of photodetectors.

The changed operational status can be maintained for a specified amount of time (e.g., for a next rotation back to that same angle again when the light ranging system rotates). For instance, an encoder can specify a particular angular position, and a particular arrangements of operational settings can be specified for that angular positon. The first transmitted pulse can be sent when the system returns to that angular position. In some embodiments, the specified amount of time is defined with respect to a number of pulse trains.

At block 3450, photons of the first pulse are detected by photodetectors that are in active operation according to the changed operational status, thereby generating first data values at the plurality of time bins. Some of the changed photodetectors may not be powered and/or may not be counted, and thus not in active operation. Not counting data values from a photodetector can result from a determination of which signals of which photodetectors are used to generate the first data values at the plurality of time bins (e.g., not counting strong photodetectors when a high light flux is present, as determined by the signal level being above a threshold).

In some embodiments, when the determined strength level is above a high threshold, an attenuation level of the set of photodetectors is increased. When the determined strength level is below a low threshold, an attenuation level of the set of photodetectors can be decreased. In instances where just an attenuation level is changed, all of the photodetectors may be in active operation.

At block 3460, a received time is determined corresponding to the first pulse using the first data values at the plurality of time bins. For example, a histogram can be generated, and matched filters can be used, as is described herein.

At block 3470, a distance to the object is determined using the received time. The distance may be determined in various ways, e.g., as described herein.

In some embodiments, the photosensor can comprise a first set of photodetectors classified as having a weak signal level and a second set of photodetectors classified as having a strong signal level. Either set can be changed in various circumstances. For example, a power level of one or more of the second set of photodetectors can be reduced (e.g., turned off) when the determined strength level is above a high threshold. As another example, a power level of one or more of the first set of photodetectors can be reduced (e.g., turned off) when the determined strength level is below a low threshold. The classifications can be dynamic (e.g., as set by the system for a given detection interval) or longer lasting (e.g., set for minutes, hours, days, etc.), or even be permanent.

More than two classifications of photodetectors can be present for a pixel at a time. For example, the operational status of a third set of photodetectors can be based on the determined strength level (e.g., intermediate strength level indicating intermediate sensitivity), in addition to having changed the operational status of one of the first set of photodetectors or the second set of photodetectors.

VIII. Examples Chip Set with Sensor Chip Having SPADs

Data values of the signals detected by a sensor array can be tracked down to small time bins, e.g., every 1 ns or 500 ps. To achieve such speed, avalanche photodiodes (APDs) could be used. Since APDs are analog devices that output the intensity directly via an analog current or voltage, APDs can use a standard analog-to-digital converter (ADC) that converts the stream of analog voltages that follow the number of photons received at the APD. But, APDs cannot provide a compact design, as current technology cannot put multiple APDs can a same chip economically. In contrast, SPADs can be put on a same chip with high yield and low cost.

Embodiments overcome difficulties in using SPADs by creating a custom chip that includes timing circuitry, histogram circuitry, and other signal processing circuitry, as well as SPADs, thereby allowing fast processing of the signals produced from SPADs. The timing circuitry and histogram circuitry can enable capturing of the binary signals produced by SPADs. The timing circuitry and histogram circuitry can be considered partial circuits that are part of a larger circuit that comprises an integrated circuit, such as an application-specific integrated circuit (ASIC), a field-programmable gate array (FPGA), or a CPU. For a CPU, the integrated circuit can include memory that stores the program code. When an ASIC or FPGA are used, the timing circuitry and the histogram circuitry are dedicated circuitry during operation of the light ranging system. For an FPGA, configuration logic can program the gates such that the particular configuration has timing circuitry and histogram that are dedicated to their respective functions once the gates are configured.

Further, for a single SPAD, there is an upper limit to the measurable light flux, e.g., as governed by the dead time of the SPAD, but also a limit of timing circuitry used to capture the signals from the SPAD. This is in addition to a SPAD's inherent binary instantaneous dynamic range. Depending on the resolution of the timing circuitry (e.g., a time-to-digital converter, TDC), a SPAD can only register one photon per time bin. Thus, the dynamic range is limited by the minimum time bin and is not inherently a dead-time issue. To address this problem, embodiments can use multiple SPADS per "pixel."

Figure 35:
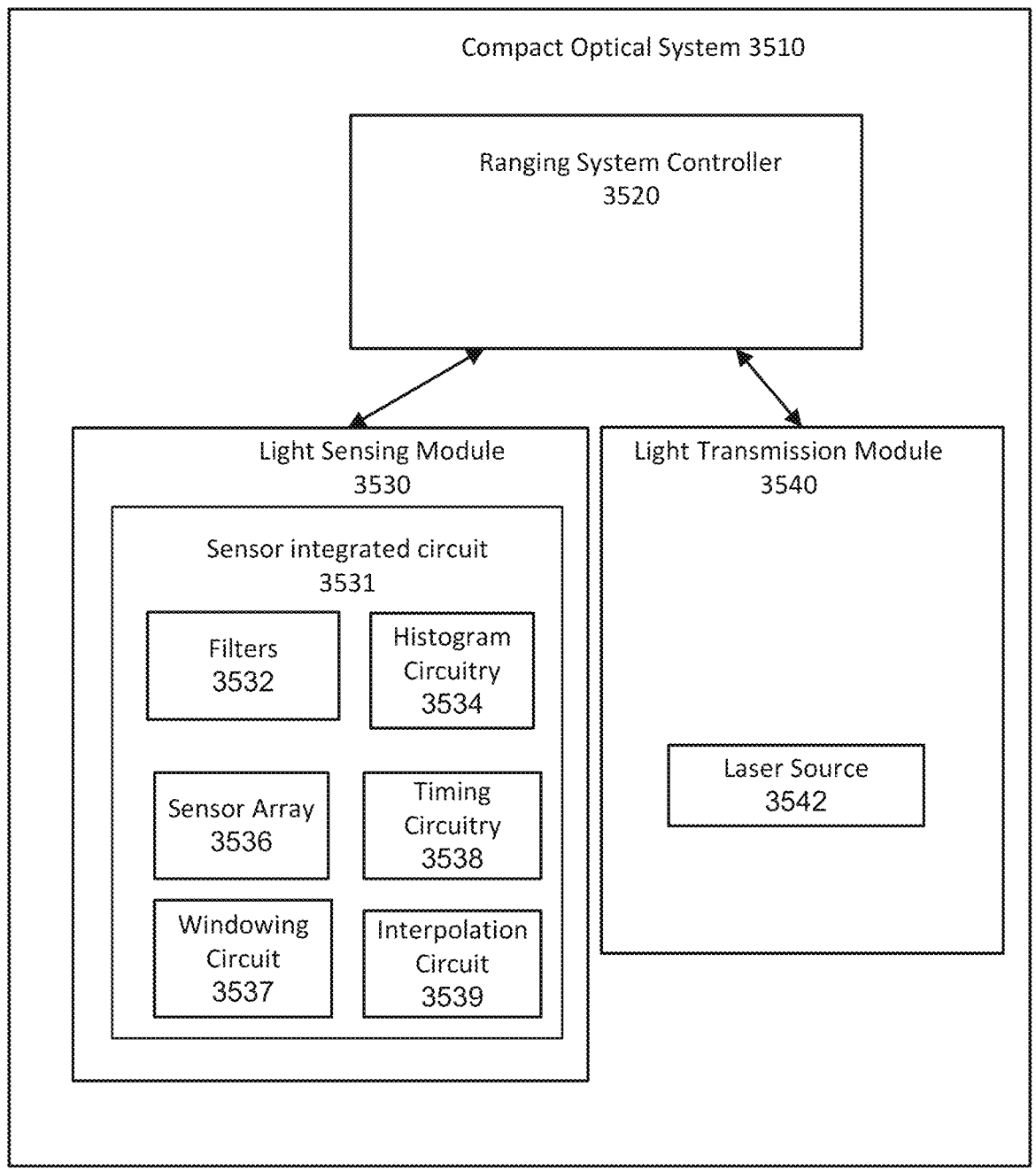
FIG. 35 shows a compact optical system of a light ranging system according to embodiments of the present invention.

FIG. 35 shows a compact optical system 3510 of a light ranging system according to embodiments of the present invention. Elements of FIG. 35 may operate in a similar manner as elements of FIGS. 13, 23, and 33, and may include such components. Ranging system controller 3520 can perform in a similar manner as other ranging system controllers, e.g., by controlling a light sensing module 3530 and a light transmission module 3540. Light transmission module 3540 can include a laser source 3542 (e.g., an emitter array of laser diodes) capable of transmitting laser pulses.

Light sensing module 3530 includes a sensor integrated circuit (e.g., an ASIC or FPGA), which comprises filters 3532, histogram circuitry 3534, a sensor array 3536, and timing circuitry 3538. Sensor array 3536 can include a plurality of photosensors, each of which include a plurality of photodetectors (e.g., SPADs). For example, such arrays in FIG. 5 can be used.

Timing circuitry 3538 can provide a signal to histogram circuitry 3534 so that histogram circuitry 3534 can determine which counter to increment in response to signals from sensor array 3536. Histogram circuitry 3534 can include a histogram for each pixel sensor of sensory array 3536. As examples, sensor array 3536 can provide a signal with an identifier of which pixel it corresponds, or such a correspondence can be hardwired.

A sensor signal can indicate by how much to increment a counter of a histogram. For example, signals from each detector (e.g., a SPAD) of a photosensor can indicate whether to increment a counter of a histogram based on that signal. Accordingly, the plurality of photodetectors of sensor array 3536 can be configured to output binary signals when triggered by photons, indicating one or more photons have been detected. Timing circuitry 3538 can be configured to determine times for when photons are detected based on the binary signals.

Histogram circuitry 3534 can be configured to determine and store counters that each correspond to a number of photosensors triggered during a time bin. Thus, a histogram can be created that is usable to determine a received time of one or more pulses from the laser source that reflected from an object.

A windowing circuit 3537 of sensing integrated circuit 3531 can configured to apply one or more matched filters 3532 to the histogram to identify a time window within which the received time resides. Sensing integrated circuit 3531 can also include an interpolation circuit 3539 configured to apply a plurality of interpolation filters to the histogram or a filtered output of a histogram within the time window. In some implementations, a best matching interpolation filter can identify the received time to with an accuracy less than a width of a time bin. In other embodiments, the interpolation circuit can be part of ranging system controller 3520, which resides on a second integrated circuit that is communicably coupled with the sensor integrated circuit.

In some embodiments, a rotation motor (e.g., motor 260 of FIG. 2) is connected to the laser source and the sensor integrated circuit for rotating the laser source and the sensor integrated circuit. Laser source 3542 can be on its own integrated circuit and can comprise a plurality of laser devices (e.g., vertical-cavity surface-emitting lasers (VCSELs)).

IX. Additional Embodiments

While some embodiments disclosed herein have focused on the application of light ranging within the context of 3D sensing for automotive use cases, systems disclosed herein can be used in any application without departing from the scope of the present disclosure. For example, systems can have a small, or even miniature, form factors that enable a number of additional use cases, e.g., for solid-state light ranging systems. For example, systems can be used in 3D cameras and/or depth sensors within devices, such as mobile phones, tablet PCs, laptops, desktop PCs, or within other peripherals and/or user-interface devices. For example, one or more embodiments could be employed within a mobile device to support facial recognition and facial tracking capabilities, eye tracking capabilities, and/or for 3D scanning of objects. Other use cases include forward-facing depth cameras for augmented and virtual reality applications in mobile devices.

Other applications include deployment of one or more systems on airborne vehicles, such as airplanes, helicopters, drones, and the like. Such examples could provide 3D sensing and depth imaging to assist with navigation (autonomous or otherwise) and/or to generate 3D maps for later analysis, e.g., to support geophysical, architectural, and/or archeological analyses.

Systems can also be mounted to stationary objects and structures, such as buildings, walls, poles, bridges, scaffolding, and the like. In such cases, the systems can be used to monitor outdoor areas, such as manufacturing facilities, assembly lines, industrial facilities, construction sites, excavation sites, roadways, railways, bridges, etc. Furthermore, systems can be mounted indoors and used to monitor movement of persons and or objects within a building, such as the movement of inventory within a warehouse or the movement of people, luggage, or goods within an office building, airport, train station, etc. As would be appreciated by one of ordinary skill in the art with the benefit of this disclosure, many different applications of light ranging systems are possible and, as such, the examples provided herein are provided for illustrative purposes only and shall not be construed to limit the uses of such systems to only the examples explicitly disclosed.

X. Computer System

Any of the computer systems or circuits mentioned herein may utilize any suitable number of subsystems. The subsystems can be connected via a system bus 75. As examples, subsystems can include input/output (I/O) devices, system memory, storage device(s), and network adapter(s) (e.g. Ethernet, Wi-Fi, etc.), which can be used to connect a computer system other devices (e.g., an engine control unit). System memory and/or storage device(s) may embody a computer readable medium.

A computer system can include a plurality of the same components or subsystems, e.g., connected together by external interface, by an internal interface, or via removable storage devices that can be connected and removed from one component to another component. In some embodiments, computer systems, subsystem, or apparatuses can communicate over a network.

Aspects of embodiments can be implemented in the form of control logic using hardware circuitry (e.g. an application specific integrated circuit or field programmable gate array) and/or using computer software with a generally programmable processor in a modular or integrated manner. As used herein, a processor can include a single-core processor, multi-core processor on a same integrated chip, or multiple processing units on a single circuit board or networked, as well as dedicated hardware. Based on the disclosure and teachings provided herein, a person of ordinary skill in the art will know and appreciate other ways and/or methods to implement embodiments of the present invention using hardware and a combination of hardware and software.

Any of the software components or functions described in this application may be implemented as software code to be executed by a processor using any suitable computer language such as, for example, Java, C, C++, C#, Objective-C, Swift, or scripting language such as Perl or Python using, for example, conventional or object-oriented techniques. The software code may be stored as a series of instructions or commands on a computer readable medium for storage and/or transmission. A suitable non-transitory computer readable medium can include random access memory (RAM), a read only memory (ROM), a magnetic medium such as a hard-drive or a floppy disk, or an optical medium such as a compact disk (CD) or DVD (digital versatile disk), flash memory, and the like. The computer readable medium may be any combination of such storage or transmission devices.

Such programs may also be encoded and transmitted using carrier signals adapted for transmission via wired, optical, and/or wireless networks conforming to a variety of protocols, including the Internet. As such, a computer readable medium may be created using a data signal encoded with such programs. Computer readable media encoded with the program code may be packaged with a compatible device or provided separately from other devices (e.g., via Internet download). Any such computer readable medium may reside on or within a single computer product (e.g. a hard drive, a CD, or an entire computer system), and may be present on or within different computer products within a system or network. A computer system may include a monitor, printer, or other suitable display for providing any of the results mentioned herein to a user.

Any of the methods described herein may be totally or partially performed with a computer system including one or more processors, which can be configured to perform the steps. Thus, embodiments can be directed to computer systems configured to perform the steps of any of the methods described herein, potentially with different components performing a respective step or a respective group of steps. Although presented as numbered steps, steps of methods herein can be performed at a same time or at different times or in a different order. Additionally, portions of these steps may be used with portions of other steps from other methods. Also, all or portions of a step may be optional. Additionally, any of the steps of any of the methods can be performed with modules, units, circuits, or other means of a system for performing these steps.

The specific details of particular embodiments may be combined in any suitable manner without departing from the spirit and scope of embodiments of the invention. However, other embodiments of the invention may be directed to specific embodiments relating to each individual aspect, or specific combinations of these individual aspects.

The above description of example embodiments of the invention has been presented for the purposes of illustration and description. It is not intended to be exhaustive or to limit the invention to the precise form described, and many modifications and variations are possible in light of the teaching above.

A recitation of "a", "an" or "the" is intended to mean "one or more" unless specifically indicated to the contrary. The use of "or" is intended to mean an "inclusive or," and not an "exclusive or" unless specifically indicated to the contrary. Reference to a "first" component does not necessarily require that a second component be provided. Moreover reference to a "first" or a "second" component does not limit the referenced component to a particular location unless expressly stated. The term "based on" is intended to mean "based at least in part on."

All patents, patent applications, publications, and descriptions mentioned herein are incorporated by reference in their entirety for all purposes. None is admitted to be prior art.

What is claimed is:
1. A method of using an optical measurement system, the method comprising:

transmitting N pulse trains from a light source as part of an optical measurement, each of the N pulse trains including one or more pulses from the light source and corresponding to a different time interval that is triggered by a start signal, and wherein N is an integer greater than one;

detecting photons of the N pulse trains by a photosensor of the optical measurement system, thereby generating data values at a plurality of time points, wherein the photosensor comprises a plurality of photodetectors;

for each of the N pulse trains, assigning a weight to the data values at time points within the time interval corresponding to the pulse train, thereby obtaining weighted values, wherein at least two of the N pulse trains are assigned different weights and have different pulse patterns;

determining a histogram corresponding to the weighted values in a plurality of time bins, wherein determining a counter of the histogram at a particular time bin includes accumulating the weighted values at time points within the particular time bin across a plurality of time intervals; and detecting a signal corresponding to the N pulse trains within the histogram.

2. The method of claim 1 further comprising determining a received time corresponding to the N pulse trains relative to the start signal.

3. The method of claim 1 wherein each photodetector in the plurality of photodetectors is a single photon avalanche diode (SPAD).

4. The method of claim 3 wherein the optical measurement system is a light ranging system, the N pulse trains reflect from an object, and the method further comprises determining a distance to the object based on times between transmission of pulses from the light source and detection of photons from the pulses by the photosensor.

5. The method of claim 4 wherein the distance corresponds to a round trip time between a received time and a start time of the start signal.

6. The method of claim 1 wherein the at least two of the N pulse trains have different pulse patterns by having pulses at different times relative to the start signal.

7. The method of claim 1 wherein histogram circuitry determines the histogram, and wherein the histogram circuitry and the photosensor are on a same integrated circuit.

8. The method of claim 1 further comprising performing the method of claim 1 for a plurality of channels of paired light sources and photosensors as part of a plurality of ranging measurements, wherein the plurality of ranging measurements overlap in time and wherein each photosensor comprises a plurality of single photon avalanche diodes (SPADs).

9. The method of claim 8 wherein pulse patterns of the N pulse trains of at least two channels of the plurality of channels of light sources are different, thereby causing different histogram patterns for different channels.

10. The method of claim 8 wherein weights assigned to the N pulse trains of at least two channels of the plurality of channels of light sources are different, thereby causing different histogram patterns for different channels.

11. A light ranging system comprising:
an illumination module comprising a light source configured to output pulses of electromagnetic radiation into a field ahead of the light ranging system;
a sensing module comprising:
a plurality of photosensors corresponding to different fields of view, each photosensor of the plurality of photosensors including a plurality of photodetectors that, when triggered by photons, are configured to output binary signals indicating the photons have been detected;
timing circuitry configured to determine times for when photons are detected based on the binary signals; and
histogram circuitry configured to determine and store counters that each correspond to a number of photodetectors of a photosensor triggered during a time bin for each photosensor of the plurality of photosensors, thereby creating a histogram that is usable to determine a received time of one or more pulses from the light source that reflected from an object to each photosensor of the plurality of photosensors.

12. The light ranging system of claim 11 wherein the plurality of photodetectors comprises single-photon avalanche diodes (SPADs).

13. The light ranging system of claim 11 wherein the timing circuitry and the histogram circuitry are dedicated circuitry during operation of the light ranging system.

14. The light ranging system of claim 11 wherein the plurality of photosensors, the timing circuitry, and the histogram circuitry are all implemented within a single application-specific integrated circuit (ASIC).

15. The light ranging system of claim 11 further comprising an electric motor operatively coupled to rotate the illumination module and the sensing module about an axis.

16. The light ranging system of claim 11 wherein the light source comprises a plurality of vertical-cavity surface-emitting lasers (VCSELs).

17. The light ranging system of claim 11 wherein the light source comprises a plurality of emitters and wherein the plurality of emitters and the plurality of photosensors are arranged to form a plurality of emitter-photosensor channel pairings in which an emitter and a photosensor in each channel pairing have a shared field of view that is non-overlapping with the shared fields of view of the other emitter-photosensor channel pairings in the plurality of emitter-photosensor channel pairings.

18. A light ranging system comprising:
a light transmitting module comprising a plurality of emitters, configured to output one or more illuminating beams of light of an operating wavelength into a field ahead of the light ranging system;
a light sensing module comprising a plurality of photosensors operable to detect photons emitted from the plurality of emitters after being reflected from surfaces within the field, each photosensor in the plurality of photosensors comprising a plurality of single photon avalanche diodes (SPADs) that, when triggered by photons, output signals indicating the photons have been detected;
timing circuitry configured to determine times for when photons are detected based on the signals output from the plurality of photosensors;
histogram circuitry configured to determine and store counters that each correspond to a number of SPADs of a photosensor triggered during a time bin for each photosensor of the plurality of photosensors, thereby creating a histogram that is usable to determine a received time of one or more pulses from the plurality of emitters that reflected from an object to each photosensor of the plurality of photosensors; and
an electric motor operatively coupled to rotate the light transmitting module and the light sensing module about an axis.

wherein the plurality of emitters and the plurality of photosensors are arranged to form a plurality of emitter channels and a plurality of photosensor channels, and wherein the light ranging system collects distance data from each channel pairing based on times between transmission of pulses from the emitter of a channel pairing and detection of photons from the pulses by the photosensor of the channel pairing.

19. The light ranging system of claim 18 wherein the plurality of photosensors, the timing circuitry, and the histogram circuitry are all implemented within a single application-specific integrated circuit (ASIC).

20. The light ranging system of claim 18 wherein the plurality of emitters comprise a plurality of vertical-cavity surface-emitting lasers (VCSELs).

21. The light ranging system of claim 18 further comprising an optical filter disposed in an optical path of each of the plurality of photosensors and configured to allow a set of wavelengths of light, including the operating wavelength of the plurality of emitters, to pass through the optical filter while blocking light outside the set of wavelengths.

22. The light ranging system of claim 18 wherein the plurality of emitters and the plurality of photosensors are arranged to form a plurality of emitter-photosensor channel pairings in which an emitter and a photosensor in each channel pairing have a shared field of view that is non-overlapping with the shared fields of view of the other emitter-photosensor channel pairings in the plurality of emitter-photosensor channel pairings.

23. A light ranging system comprising:
   a light transmission module comprising a plurality of emitters configured to output pulses of electromagnetic radiation into a field ahead external to the light ranging system;
   a light sensing module comprising a plurality of photosensors corresponding to different fields of view, wherein each photosensor in the plurality of photosensors comprises a plurality of photodetectors that, when triggered by photons, output signals indicating the photons have been detected;
   timing circuitry configured to determine times for when photons are detected based on the signals;
   histogram circuitry configured to determine and store counters that each correspond to a number of photodetectors of a photosensor triggered during a time bin for each photosensor of the plurality of photosensors, thereby creating a histogram that is usable to determine a received time of one or more pulses from the plurality of emitters that reflected from an object to each photosensor of the plurality of photosensors; and
   an electric motor operatively coupled to rotate the light transmission module and the light sensing module about an axis,
   wherein the light ranging system collects distance data based on times between transmission of the pulses of electromagnetic radiation from the plurality of emitters and detection of the photons from the pulses of electromagnetic radiation by the plurality of photosensors.

24. The light ranging system of claim 23 wherein the plurality of photodetectors comprises single-photon avalanche diodes (SPADs).

25. The light ranging system of claim 24 wherein the plurality of emitters comprise a plurality of vertical-cavity surface-emitting lasers (VCSELs).

26. The light ranging system of claim 24 wherein:
   each emitter in the plurality of emitters is offset from its neighbor and configured to output pulses of electromagnetic radiation into a different field of view from its neighboring emitters, thereby illuminating a respective field of view in a field external to the light ranging system associated only with that emitter; and
   each photosensor in the plurality of photosensors is offset from its neighbor and configured to detect electromagnetic radiation within a different field of view from its neighboring photosensors that substantially coincides with a field of view of a respective emitter in the plurality of emitters.

27. The light ranging system of claim 23 wherein the light sensing module further comprises an optical filter disposed in an optical path of the plurality of photosensors and configured to allow a set of wavelengths of electromagnetic radiation, including an operating wavelength of the plurality of emitters, to pass through the optical filter while blocking electromagnetic radiation outside the set of wavelengths.

28. The light ranging system of claim 23 wherein the plurality of photosensors, the timing circuitry, and the histogram circuitry are all implemented within a single application-specific integrated circuit (ASIC).

29. The light ranging system of claim 23 wherein the plurality of emitters comprise a plurality of vertical-cavity surface-emitting lasers (VCSELs).

30. The light ranging system of claim 23 wherein the plurality of emitters and the plurality of photosensors are arranged to form a plurality of emitter-photosensor channel pairings in which an emitter and a photosensor in each channel pairing have a shared field of view that is non-overlapping with the shared fields of view of the other emitter-photosensor channel pairings in the plurality of emitter-photosensor channel pairings.

\* \* \* \* \*